US008088537B2

(12) United States Patent
Hatakeyama et al.

(10) Patent No.: US 8,088,537 B2
(45) Date of Patent: Jan. 3, 2012

(54) RESIST TOP COAT COMPOSITION AND PATTERNING PROCESS

(75) Inventors: Jun Hatakeyama, Niigata (JP); Yuji Harada, Niigata (JP)

(73) Assignee: Shin-Etsu Chemical Co., Ltd., Tokyo (JP)

(*) Notice: Subject to any disclaimer, the term of this patent is extended or adjusted under 35 U.S.C. 154(b) by 556 days.

(21) Appl. No.: 12/320,183

(22) Filed: Jan. 21, 2009

(65) Prior Publication Data

US 2009/0197200 A1 Aug. 6, 2009

(30) Foreign Application Priority Data

Jan. 31, 2008 (JP) ................................ 2008-021021

(51) Int. Cl.
*G03F 7/26* (2006.01)
*G03F 7/11* (2006.01)
*C08L 33/02* (2006.01)

(52) U.S. Cl. ...... 430/4; 430/270.1; 430/273.1; 430/326; 525/199; 525/217; 525/218

(58) Field of Classification Search ........... 430/4, 270.1, 430/273.1, 326; 525/199, 217, 218
See application file for complete search history.

(56) References Cited

U.S. PATENT DOCUMENTS

| 7,514,204 B2 * | 4/2009 | Hatakeyama et al. ..... 430/270.1 |
| 7,855,045 B2 * | 12/2010 | Allen et al. ................. 430/273.1 |
| 2007/0087285 A1 * | 4/2007 | Huang et al. ................ 430/270.1 |
| 2008/0096131 A1 * | 4/2008 | Hatakeyama et al. ..... 430/281.1 |

FOREIGN PATENT DOCUMENTS

| JP | A-60-38821 | 2/1985 |
| JP | A-62-62520 | 3/1987 |
| JP | A-62-62521 | 3/1987 |
| JP | A-5-74700 | 3/1993 |
| JP | A-6-273926 | 9/1994 |
| JP | A-9-246173 | 9/1997 |
| JP | B2-2803549 | 9/1998 |
| JP | A-2001-166476 | 6/2001 |
| JP | A-2002-99090 | 4/2002 |
| JP | A-2006-91798 | 4/2006 |

OTHER PUBLICATIONS

Fedynyshyn, Theodore H.; "Advances in Resist Technology and Processing XIX;" *Proceedings of SPIE*; Mar. 4-6, 2002; vol. 4690; Santa Clara, USA.
Owa et al.; "Immersion lithography; its potential performance and issues;" Optical Microlithography XVI; *Proceedings of SPIE*; 2003; vol. 5040; pp. 724-733.
Hirayama, Taku; "Resist and Cover Material Investigation for Immersion Lithography;" $2^{nd}$ *Immersion Workshop*; Jul. 11, 2003; Tokyo Ohka Kogyo Co., Ltd.
Allen et al.; "Design of Protective Topcoats for Immersion Lithography;" *Journal of Photopolymer Science and Technology*; 2005; pp. 615-619; vol. 18—No. 5.
Murase et al; "Neuer Begriff und ein Nano-Hybrid System für Hydrophobie;" *XXIV FATIPEC Congress Book*; pp. B15-B38; vol. 1B.
Sanders et al.; "New materials for surface energy control of 193 nm photoresists;" $4^{th}$ *International Symposium on Immersion Lithography*; 2006; San Jose, California.

* cited by examiner

*Primary Examiner* — John Chu
(74) *Attorney, Agent, or Firm* — Oliff & Berridge, PLC

(57) ABSTRACT

The present invention relates to a resist top coat composition and a patterning process adopting such a material, which resist top coat composition is provided for forming a top coat on a photoresist film so as to protect the photoresist film, in liquid immersion photolithography. The present invention provides a resist top coat composition for forming a top coat on a photoresist film, wherein the resist top coat composition comprises, at least: a polymer I including a repeating unit a represented by the following general formula (1); and a polymer II including repeating unit having a sulfonic acid or an amine salt of a sulfonic acid:

(1)

$$\begin{array}{c} R^1 \\ | \\ \cdots(CH_2-C)_a\cdots \\ | \\ C(=O)-O-C(CF_3)_2 \\ | \\ R^2-C-CF_3 \\ | \\ R^3 \quad OH \end{array}$$

24 Claims, No Drawings

RESIST TOP COAT COMPOSITION AND PATTERNING PROCESS

BACKGROUND OF THE INVENTION

1. Field of the Invention

The present invention relates to a resist top coat composition and a patterning process adopting such a material, which resist top coat composition is provided for forming a top coat on a photoresist film so as to protect the photoresist film, in the field of photolithography for micro-fabrication in a manufacturing process of semiconductor device, such as liguid immersion photolithography to be achieved by adopting ArF excimer laser of 193 nm wavelength as a light source and by interposing water between a projection lens and a substrate.

2. Description of the Related Art

Recently, while finer pattern rules are demanded with highly integrated LSI's providing highly increased speeds, the light exposure technique currently used as a general one is gradually forced to encounter an inevitable limit of resolution due to wavelengths of light sources.

This fact is based on shortened wavelengths of light sources for exposure, such that wavelength shortened from i-line (365 nm) of mercury lamp down to KrF excimer laser (248 nm) has enabled mass-production of DRAM (dynamic random access memory) of 64M-bit (processing dimension of 0.25 µm or less). Further, there has been earnestly considered lithography adopting ArF excimer laser (193 nm) so as to realize production of DRAM's having integration degrees of 256M, 1G, and higher, in a manner to realize a 65 nm node device by combining the laser with a lens having a higher NA (NA≧0.9). Although utilization of $F_2$ laser having a wavelength of 157 nm has been selected as a candidate for fabrication of 45 nm node device, its adoption has been postponed due to numerous problems such as represented by insufficient capabilities of resists in addition to demerit of cost. As such, ArF liguid immersion lithography has been proposed as an alternative of $F_2$ lithography, and development thereof is currently being promoted toward early adoption of the former (Proc. SPIE Vol. 4690 xxix (2002)).

In the ArF liguid immersion lithography, water is impregnatedly interposed between a projection lens and a wafer, and ArF excimer laser is irradiated via water. Since water has a refractive index of 1.44 at 193 nm, patterning is enabled with a lens having an NA of 1.0 or larger, and it is theoretically possible to increase an NA to 1.44. Resolution is improved by an increased amount of NA, to suggest a possibility of 45 nm node by a combination of a lens having an NA of 1.2 or more with ultra-high resolution technique (Proc. SPIE Vol. 5040, p 724 (2003)).

However, achievement of exposure in the presence of water on a resist film results in that acids generated within the resist film and basic compounds included in the resist material are partially caused to leach into the water layer, thereby resultingly and possibly causing pattern profile change, pattern collapse, and the like. There is also pointed out a possibility that a small amount of water droplet left on the resist film permeates into the resist film to cause defects. To overcome these drawbacks, it has been proposed in the ArF liguid immersion lithography to provide a top coat between a resist film and water (2nd Liguid immersion Work Shop: Resist and Cover Material Investigation for Liguid immersion Lithography (2003)).

It is known that top coats on photoresist films have been investigated as anti-reflection films, as represented by an ARCOR (antireflective coating on resist) method (see patent-related JP62-62520A, JP62-62521A and JP60-38821A for example). The ARCOR method is configured to form a transparent anti-reflection film on a photoresist film, and the anti-reflection film is stripped off after exposure. At that time, used as a resist top coat composition is one having a lower refractive index such as perfluoroalkyl polyethers, or perfluoroalkyl amines, in a manner to enable drastically decreased reflection light at an interface between the photoresist film and resist top coat, thereby resultingly improving dimensional accuracy. Thus, there have been proposed amorphous polymers such as perfluoro(2,2-dimethyl-1,3-dioxol)-tetrafluoroethylene copolymers as resist top coat compositions (see JP5-74700A, for example). However, these fluorine-containing compounds are low in compatibility with organic substances and require usage of flon-based solvents for coating and stripping of resist top coats, thereby leading to serious demerits from standpoints of environment and cost.

As resist top coat compositions other than the above, application of water-soluble or alkali-soluble materials have been investigated (see JP6-273926A and JP2803549, and J. Photopolymer Sci. and Technol. Vol. 18 No. 5 p. 615 (2005), for example).

SUMMARY OF THE INVENTION

The present invention has been carried out in view of the above problems, and it is therefore an object of the present invention to provide a resist top coat composition, a polymer effective as a base polymer thereof, and a patterning process adopting such a material, which resist top coat composition is allowed to be removed by an alkaline developer with less development defects and is excellent in resist pattern profile after development.

To solve the above problems, the present invention provides a resist top coat composition for forming a top coat on a photoresist film, comprising, at least: a polymer I including a repeating unit a represented by the following general formula (1); and a polymer II including a repeating unit having a sulfonic acid or an amine salt of a sulfonic acid:

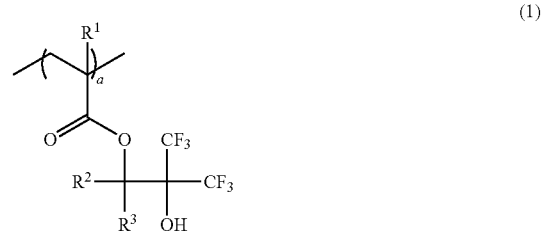

(1)

(in the formula, $R^1$ represents any one of a hydrogen atom, a fluorine atom, a methyl group, and a trifluoromethyl group; and $R^2$ and $R^3$ independently represent a hydrogen atom, or a linear, branched, or cyclic alkyl group having 1 to 20 carbon atoms;

wherein $R^2$ and $R^3$ may be linked to form a ring, and then $R^2$ and $R^3$ independently represent a linear, branched, or cyclic alkylene group having 2 to 20 carbon atoms, and $0 < a \leq 1.0$).

Such a resist top coat composition comprising, at least: a polymer I including a repeating unit a represented by the general formula (1); and a polymer II including a repeating unit having a sulfonic acid or an amine salt of a sulfonic acid, is removable by an alkaline developer, less in development defects, and effective as a resist top coat composition exhibiting an excellent resist pattern profile after development.

Further, the polymer I desirably includes a repeating unit a and a repeating unit b each represented by the following general formula (2):

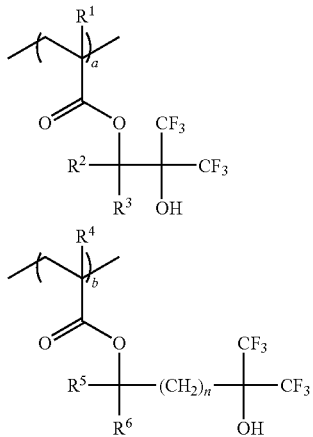

(2)

(in the formula, $R^1$, $R^2$, and $R^3$ are the same as the above;

$R^4$ represents a hydrogen atom or a methyl group;

$R^5$ and $R^6$ independently represent a hydrogen atom, or a linear, branched, or cyclic alkyl group having 1 to 20 carbon atoms;

wherein $R^5$ and $R^6$ may be linked to form a ring, and then $R^5$ and $R^6$ independently represent a linear, branched, or cyclic alkylene group having 2 to 20 carbon atoms; $0<a\leq1$, $0\leq b<1$, $0<a+b\leq1$; and n is an integer of 1 to 4).

In this way, when the polymer I includes a repeating unit a and a repeating unit b each represented by the general formula (2) in the resist top coat composition of the present invention, the polymer I simultaneously possesses an excellent water sliding ability and an excellent alkali solubility, while desirably enhancing an obverse surface orientation ability of the polymer I.

Furthermore, the repeating unit having a sulfonic acid or an amine salt of a sulfonic acid included in the polymer II are preferably represented by one or more repeating units selected from repeating units c-1, c-2, d-1, and d-2 in the following general formula (3):

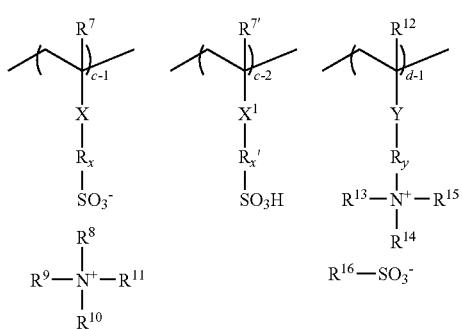

(3)

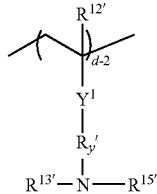

(in the formula, $R^7$, $R^{12}$, $R^{7'}$, and $R^{12'}$ independently represent a hydrogen atom or a methyl group;

$R^8$, $R^9$, $R^{10}$, $R^{11}$, $R^{13}$, $R^{14}$, $R^{15}$, $R^{13'}$, and $R^{15'}$ independently represent a hydrogen atom, a linear, branched, or cyclic alkyl group, an alkenyl group, an oxoalkyl group, or an oxoalkenyl group having 1 to 12 carbon atoms, an aryl group having 6 to 20 carbon atoms, or an aralkyl group or an aryl oxoalkyl group having 7 to 12 carbon atoms;

wherein hydrogen atoms of these groups may be partially or totally substituted with an alkoxy group;

wherein a nitrogen atom, an ether group, an ester group, a hydroxy group, or a carboxyl group may be included in $R^8$, $R^9$, $R^{10}$, $R^{11}$, $R^{13}R^{14}$, $R^{15}$, $R^{13'}$ and $R^{15'}$; and wherein $R^8$ and $R^9$, $R^8$ and $R^9$ and $R^{10}$, and $R^{13}$ and $R^{14}$ may be linked to form a ring, and when a ring is formed, $R^8$ and $R^9$, $R^8$ and $R^9$ and $R^{10}$, and $R^{13}$ and $R^{14}$ independently represent an alkylene group having 3 to 10 carbon atoms, or represent an aromatic heterocycle having the nitrogen atom in the formula in its ring;

X and $X^1$ are each any one of a single bond, an alkylene group having 1 to 4 carbon atoms, —C(=O)—O—, and —C(=O)—NH—;

Y and $Y^1$ each represent —C(=O)—O—;

$R_x$ and $R_x'$ are each any one of a single bond, a linear, branched, or cyclic alkylene group having 1 to 8 carbon atoms;

$R_y$ and $R_y'$ each represent a linear, branched, or cyclic alkylene group having 1 to 8 carbon atoms; and $R^{16}$ represents: a linear, branched, or cyclic alkyl group having 1 to 20 carbon atoms, which group may have a carbonyl group, an ester group, an ether group, or a halogen atom; or an aryl group having 6 to 10 carbon atoms, which group may have a carbonyl group, an ester group, an ether group, a halogen atom, an alkyl group having 1 to 10 carbon atoms, or a fluorinated alkyl group;

wherein $0\leq(c-1)<1$, $0\leq(c-2)<1$, $0\leq(d-1)<1$, $0\leq(d-2)<1$, and $0<(c-1)+(c-2)+(d-1)+(d-2)<1$, and when $0<(d-2)$, $0<(c-2)$).

In this way, when the repeating unit having a sulfonic acid or an amine salt of a sulfonic acid included in the polymer II are represented by one or more repeating units selected from repeating units c-1, c-2, d-1, and d-2 in the general formula (3) in the resist top coat composition of the present invention, the repeating unit have higher hydrophilicity, so that the polymer II is oriented at a resist-facing side after spin coating to thereby alter the resist surface into hydrophilic after development, thereby preferably exhibiting improved functions to exemplarily achieve rectangular resist pattern profiles and enlarged bridge margins.

Moreover, the polymer II is preferably (A) a copolymer including the repeating unit a and one or more repeating units selected from repeating units c-1, c-2, and d-1, or (B) a copolymer including the repeating unit a and the repeating unit c-2 and d-2, in the following general formula (4):

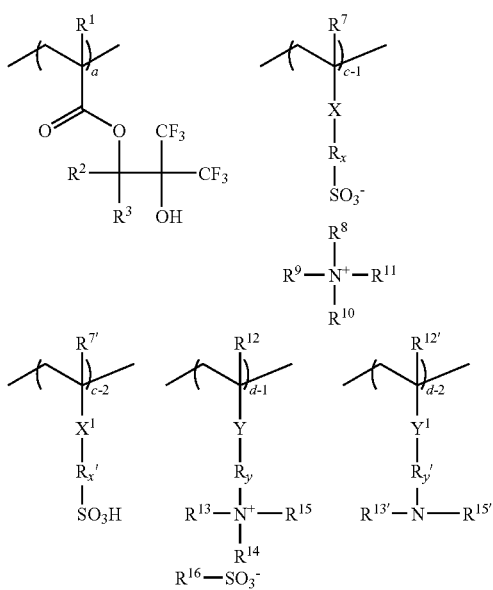

(4)

(in the formula,
$R^1$ to $R^{16}$, $R^{7'}$, $R^{12'}$, $R^{13'}$, $R^{15'}$, X, Y, $X^1$, $Y^1$, $R_x$, $R_y$, $R_x'$, and $R_y'$ are the same as the above;
wherein $0<a<1$, $0\leq(c\text{-}1)<1$, $0\leq(c\text{-}2)<1$, $0\leq(d\text{-}1)<1$, $0\leq(d\text{-}2)<1$, $0<(c\text{-}1)+(c\text{-}2)+(d\text{-}1)+(d\text{-}2)<1$, and
when $0<(d\text{-}2)$, $0<(c\text{-}2)$).

In this way, when the polymer II is (A) a copolymer including the repeating unit a and one or more repeating unit selected from repeating units c-1, c-2, and d-1, or (B) a copolymer including the repeating unit a and the repeating unit c-2 and d-2, in the general formula (4), i.e., when the polymer II is a polymer including a repeating unit a, the polymer II is excellent in solubility in an organic solvent so that the polymer II is sufficiently mixed with the polymer I upon blending, thereby preferably promoting mixture with the polymer I.

Further, it is preferable that the resist top coat composition further comprises a solvent.

As mentioned above, when the resist top coat composition further comprises a solvent, has an even better property of forming the top coat.

The solvent is preferably one or more ether-based solvents selected from di-n-butyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether.

Furthermore, the solvent is preferably a mixture of the ether-based solvent with one or more alcohol-based solvents selected from 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

In this way, adopting an ether-based solvent causes the polymer I to be more soluble in a solvent, and the polymer II acting as a hydrophilic polymer is readily soluble in an alcohol-based solvent. Thus, combining the ether-based solvent with the alcohol-based solvent ensures solubilities of both the polymers I and II.

Moreover, the present invention provides a patterning process comprising, at least, the steps of:
forming a photoresist film on a substrate;
forming, on the photoresist film, a resist top coat by using the resist top coat composition of the present invention;
exposing the substrate; and
developing the substrate with a developer.

In this way, the patterning process comprising, at least, the steps of:
forming a photoresist film on a substrate;
forming, on the photoresist film, a resist top coat by using the above-described resist top coat composition of the present invention;
exposing the substrate; and
developing the substrate with a developer;
makes it possible to reduce development defects and to attain excellent resist pattern profiles after development.

In the patterning process of the present invention, it is preferable that the exposing step is conducted by liquid immersion lithography in which a gap between a projection lens and the substrate is filled with a liquid.

In this way, the exposing step is conducted by liquid immersion lithography, so that the resist top coat composition of the present invention effectively functions, to make it possible to form a finer resist patterns on photoresist films.

Further, in the patterning process of the present invention, the exposing step can be conducted by using a light source having an exposing wavelength in the range of 180 to 250 nm, and by using water as the liquid to be interposed between the projection lens and the substrate.

In this way, an example of liquid to be used in liquid immersion lithography is exemplarily water. Further, exposure is conducted by using a light source having an exposing wavelength in the range of 180 to 250 nm while interposing water between the projection lens and the substrate, thereby a still finer resist pattern can be formed.

Furthermore, it is preferable in the patterning process of the present invention that the developing step comprises the step of:
developing the substrate with an alkaline developer, to form a resist pattern on the photoresist film, and simultaneously therewith, to strip off the resist top coat on the photoresist film.

In this way, the developing step comprises the step of: developing the substrate with an alkaline developer, to form a resist pattern on the photoresist film, and simultaneously therewith, to strip off the resist top coat on the photoresist film, so that the resist top coat can be more readily stripped off without additional installation of systems for stripping the resist top coat to conventional equipment.

Moreover, in a patterning process by lithography, comprising the steps of:
forming a top coat made of an upperlying resist film composition on a photoresist layer formed on a mask blanks;
exposing the mask blanks in vacuum, with electron beam; and
subsequently developing the mask blanks;
the resist top coat composition of the present invention can be preferably used as the upperlying resist film composition.

In this way, in the patterning process by lithography, comprising the steps of:
forming a top coat made of an upperlying resist film composition on a photoresist layer formed on a mask blanks;

exposing the mask blanks in vacuum, with electron beam; and subsequently developing the mask blanks;

the resist top coat composition of the present invention is used as the upperlying resist film composition, so that the present invention is useful by virtue of the improved stability of resist during standing in vacuum after exposure.

The resist top coat composition of the present invention exhibits a larger contact angle with water, thereby enabling restriction of permeation of water thereinto upon liguid immersion exposure, and realization of excellent liguid immersion lithography with reducing development defects.

DETAILED DESCRIPTION OF THE PREFERRED EMBODIMENTS

The ArF liguid immersion lithography adopts a liquid such as water as a layer on a resist top coat, thereby failing to use a water-soluble top coat. Contrary, alkali-soluble resist top coat compositions can be stripped off with an alkaline developer, thereby eliminating necessity of additional installation of a stripping unit, with a higher merit of cost. From such a standpoint, earnest development of water-insoluble and alkali-soluble resist top coat compositions has been vigorously promoted, and there has been exemplarily proposed a resist top coat composition adopting a methacrylate resin having fluorine-containing alcohols as side-chains.

Examples of capabilities required for resist top coat compositions include not only capabilities to prevent acids generated in a photoresist film and basic compounds therein from leaching into water, but also capabilities such as water repellency and water sliding property. Among them, it has been reported to be effective to introduce fluorine into a resin so as to improve water repellency, and to form a microdomain structure based on a combination of different kinds of water repellent groups so as to improve water sliding property (see XXIV FATIPEC Congress Book, Vol. B, p 15 (1997), Progress in Organic Coatings, 31, p. 97 (1997), for example).

However, it has been gradually proven that introduction of fluorine into a resin so as to improve a sliding angle, receding contact angle, and the like, leads to an increased contact angle with an alkaline developer, thereby resultingly increasing development defects.

Further, there has been recently caused a problem of defects called blobs to be formed at a resist film surface after development. It is known that blobs tend to be numerously formed at unexposed portions of a resist film, and more numerously formed in resist films having higher water repellency. Generally, resist films having higher water repellency exhibits larger contact angles with water, and water left on a resist surface is brought into a state having a higher internal energy upon spindrying after development. Further, the internal energy becomes maximum just prior to drying, in a manner to damage a resist film surface upon evaporation of water, thereby resultingly cause blob defects. Considering such a mechanism, it is required to decrease a contact angle of a resist surface after development so as to prevent occurrence of blobs on the resist film. In this respect, when a resist top coat having higher water repellency is applied to a resist film so as to improve sliding angle, receding contact angle, and the like, the contact angle of the resist surface is increased due to intermixing between the resist film and the top coat, thereby tending to cause blob defects. Although blob defects can be reduced by adopting resist top coats having hydrophilicity, receding contact angles are rather decreased, such that high-speed scanning is disabled, and watermark defects are caused due to water droplets left after scanning. There has been thus demanded a resist top coat having a larger receding contact angle, and leading to a resist surface having a smaller contact angle after development.

To decrease blobs, it is effective to utilize a top coat having a carboxyl group, sulfo group, and the like. Proposed in JP2006-91798A is an liguid immersion-oriented top coat having a carboxyl group, sulfo group, or the like. However, the carboxyl group, sulfo group, or the like is high in hydrophilicity, thereby leading to decreased water repellency, water sliding property, and the like. Thus, there has been proposed such a top coat obtained by blending a specific methacrylate copolymer having sulfo groups or an acrylamide copolymer having sulfo groups with a polymer having hexafluoroalcohol groups high in water repellency, in a manner to locate the polymer having hexafluoroalcohol groups at an obverse surface of the top coat and the methacrylate copolymer having sulfo groups or an acrylamide copolymer having sulfo groups at a resist-side surface of the top coat $4^{th}$ International Symposium on Immersion Lithography RE-04 New Materials for surface energy control of 193 nm photoresists, Dan Sander et. al.).

Although blob defects can be reduced in case of utilization of the top coat having sulfo group-containing repeating unit, there is caused film loss of a resist pattern after development. The reason thereof is considered to be a fact that sulfo groups bond to amine components in the resist such that amine components of the resist become lacking near the resist surface. It is thus desired to develop a top coat, which prevent film loss so as to obtain rectangular pattern profiles, and which additionally improve hydrophilicity of a resist surface after development so as to prevent blob defects.

Further, without limited to ArF liguid immersion lithography, resist top coat compositions are also required in electron beam lithography. Namely, it is a problem that, in case of electron beam exposure for mask writing or the like, acids generated during writing, vinyl ether formed due to deprotection of acetal protective group, and the like are caused to evaporate, thereby fluctuating a sensitivity of a resist (see JP2002-99090A, for example). As such, it has been expectedly desired to restrict sensitivity fluctuation, by virtue of application of a top coat onto a resist.

As a result of earnest conduction of investigation so as to achieve the above object, the present inventors have found out that a blend of a polymer having specific fluoroalcohols and a polymer having sulfonic acids or amine salts of sulfonic acids as the repeating unit is promising as a photoresist top coat composition for liguid immersion lithography, and narrowly carried out the present invention.

The resist top coat composition of the present invention is characterized in that it includes, at least, a polymer I including a repeating unit a represented by the following general formula (1), and a polymer II including a repeating unit having sulfonic acid or an amine salt of a sulfonic acid. Namely, the resist top coat composition is based on a resin obtained by blending the polymer I represented by the following general formula (1), with the polymer II including the repeating unit having a sulfonic acid or an amine salt of a sulfonic acid.

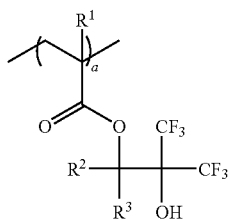
(1)

(in the formula,

R¹ represents any one of a hydrogen atom, a fluorine atom, a methyl group, and a trifluoromethyl group; and R² and R³ independently represent a hydrogen atom, or a linear, branched, or cyclic alkyl group having 1 to 20 carbon atoms;

wherein R² and R³ may be linked to form a ring, and then R² and R³ independently represent a linear, branched, or cyclic alkylene group having 2 to 20 carbon atoms, and $0<a\leq1.0$).

The polymer I including a repeating unit a represented by the general formula (1) preferably includes a repeating unit b each represented by the following general formula (2) in addition to the repeating unit a. Namely, the resist top coat composition in the present invention is preferably based on a resin obtained by blending a polymer I including the repeating unit a and b each represented by the following general formula (2), with the polymer II including a repeating unit having a sulfonic acid or an amine salt of a sulfonic acid.

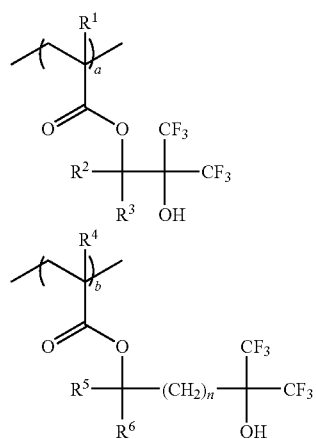
(2)

(in the formula,

R¹, R², and R³ are the same as the above;

R⁴ represents a hydrogen atom or a methyl group;

R⁵ and R⁶ independently represent a hydrogen atom, or a linear, branched, or cyclic alkyl group having 1 to 20 carbon atoms;

wherein R⁵ and R⁶ may be linked to form a ring, and then R⁵ and R⁶ independently represent a linear, branched, or cyclic alkylene group having 2 to 20 carbon atoms; $0<a\leq1$, $0\leq b<1$, $0<a+b\leq1$; and n is an integer of 1 to 4).

Concrete examples of a linear, branched, or cyclic alkyl group having 1 to 20 carbon atoms for R², R³, R⁵, and R⁶ in the repeating unit a and b, include groups of methyl, ethyl, n-propyl, isopropyl, n-butyl, sec-butyl, tert-butyl, tert-amyl, n-pentyl, n-hexyl, n-heptyl, n-octyl, n-nonyl, n-decyl, cyclopentyl, cyclohexyl, cyclopentylmethyl, cyclopentylethyl, cyclopentylbutyl, cyclohexylmethyl, cyclohexylethyl, cyclohexylbutyl, adamantyl, and the like. When R² and R³, and R⁵ and R⁶ form rings, respectively, R², R³, R⁵, and R⁶ are each an alkylene group, in a manner to desirably use a group in a form that one hydrogen atom is removed from the applicable one of the above exemplified alkyl groups.

Here, concrete examples of the repeating unit a exemplarily include the following, without limited thereto:

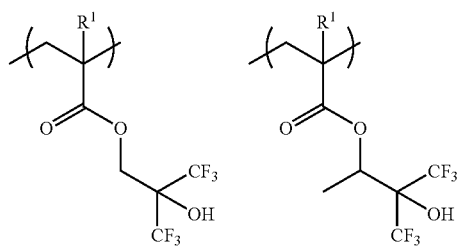

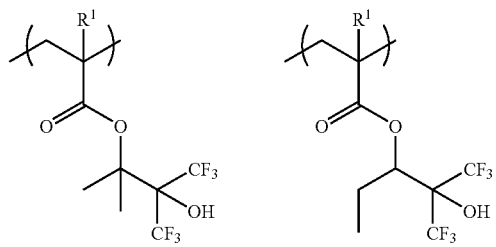

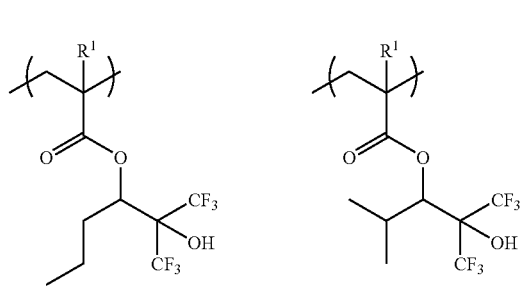

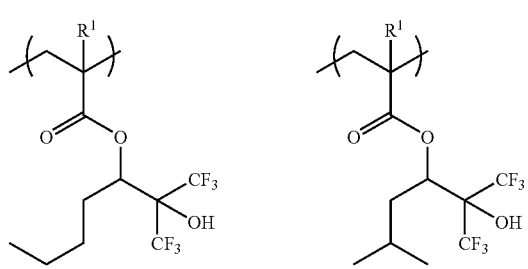

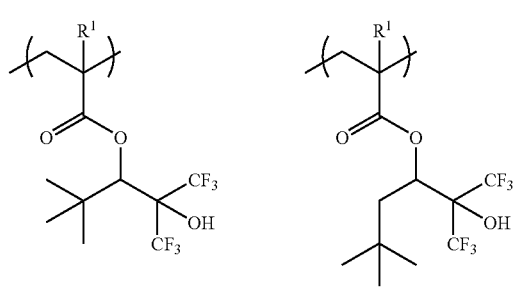

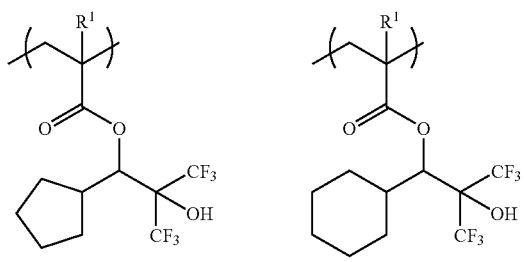
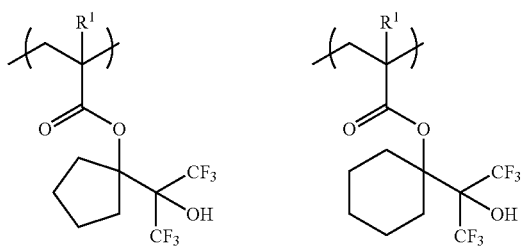
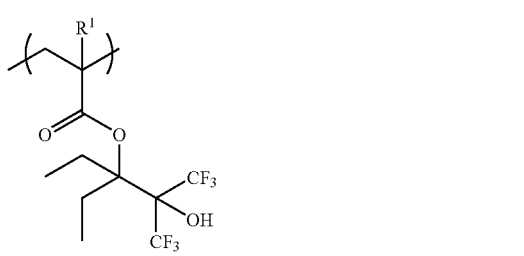
(in the formula, $R^1$ represents any one of a hydrogen atom, a fluorine atom, a methyl group, and a trifluoromethyl group).
Meanwhile, examples of the repeating unit b include the following, without limited thereto:
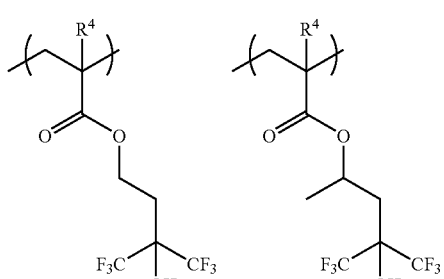
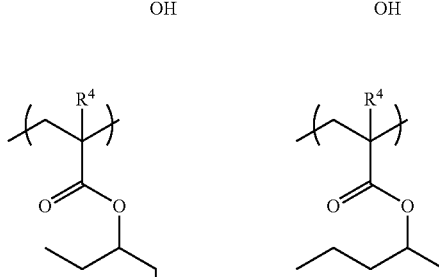
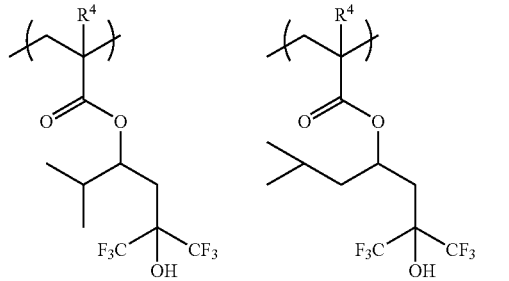
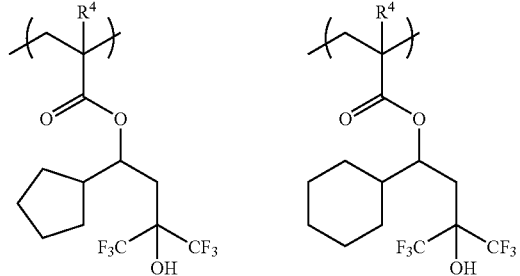
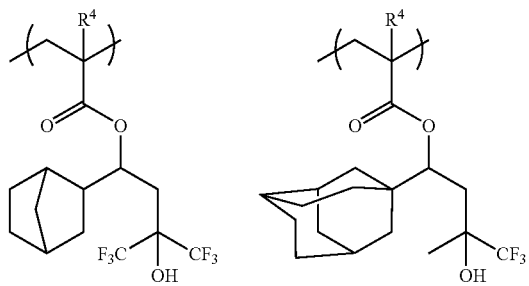
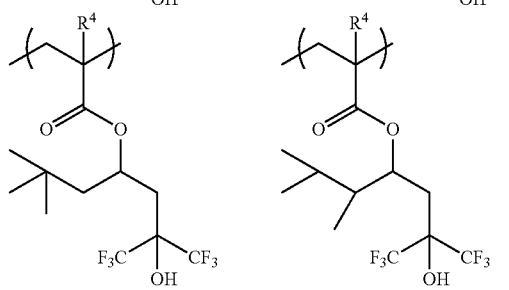
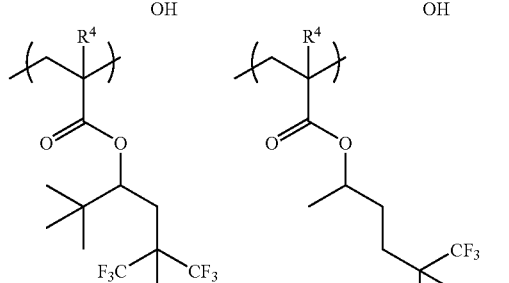
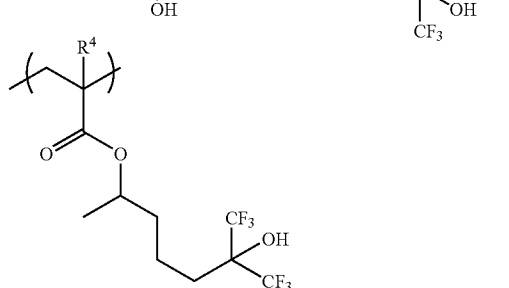
(in the formula, $R^4$ represents a hydrogen atom or a methyl group).

Further, in the present invention, the repeating unit having a sulfonic acid or an amine salt of a sulfonic acid included in the polymer II, are preferably represented by one or more repeating units selected from repeating units c-1, c-2, d-1, and d-2 in the following general formula (3):

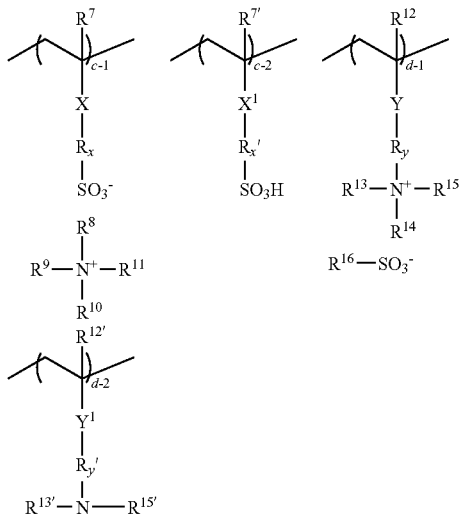

(in the formula,
$R^7$, $R^{12}$, $R^{7'}$, and $R^{12'}$ independently represent a hydrogen atom or a methyl group;
$R^8$, $R^9$, $R^{10}$, $R^{11}$, $R^{13}$, $R^{14}$, $R^{15}$, $R^{13'}$, and $R^{15'}$ independently represent a hydrogen atom, a linear, branched, or cyclic alkyl group, an alkenyl group, an oxoalkyl group, or an oxoalkenyl group having 1 to 12 carbon atoms, an aryl group having 6 to 20 carbon atoms, or an aralkyl group or an aryl oxoalkyl group having 7 to 12 carbon atoms;
wherein hydrogen atoms of these groups may be partially or totally substituted with an alkoxy group;
wherein a nitrogen atom, an ether group, an ester group, a hydroxy group, or a carboxyl group may be included in $R^8$, $R^9$, $R^{10}$, $R^{11}$, $R^{13}$, $R^{14}$, $R^{15}$, $R^{13'}$, and $R^{15'}$; and
wherein $R^8$ and $R^9$, $R^8$ and $R^9$ and $R^{10}$, and $R^{13}$ and $R^{14}$ may be linked to form a ring, and when a ring is formed, $R^8$ and $R^9$, $R^8$ and $R^9$ and $R^{10}$, and $R^{13}$ and $R^{14}$ independently represent an alkylene group having 3 to 10 carbon atoms, or represent an aromatic heterocycle having the nitrogen atom in the formula in its ring;
X and $X^1$ are each any one of a single bond, an alkylene group having 1 to 4 carbon atoms, —C(=O)—O—, and —C(=O)—NH—;
Y and $Y^1$ each represent —C(=O)—O—;
$R_x$, and $R_x'$ are each any one of a single bond, a linear, branched, or cyclic alkylene group having 1 to 8 carbon atoms;
$R_y$ and $R_y'$ each represent a linear, branched, or cyclic alkylene group having 1 to 8 carbon atoms; and
$R^{16}$ represents: a linear, branched, or cyclic alkyl group having 1 to 20 carbon atoms, which group may have a carbonyl group, an ester group, an ether group, or a halogen atom; or an aryl group having 6 to 10 carbon atoms, which group may have a carbonyl group, an ester group, an ether group, a halogen atom, an alkyl group having 1 to 10 carbon atoms, or a fluorinated alkyl group;
wherein $0 \leq (c-1) < 1$, $0 \leq (c-2) < 1$, $0 \leq (d-1) < 1$, $0 \leq (d-2) < 1$, and $0 < (c-1)+(c-2)+(d-1)+(d-2) < 1$, and
when $0 < (d-2)$, $0 < (c-2)$).

Here, examples of the repeating unit c-1 include the following:

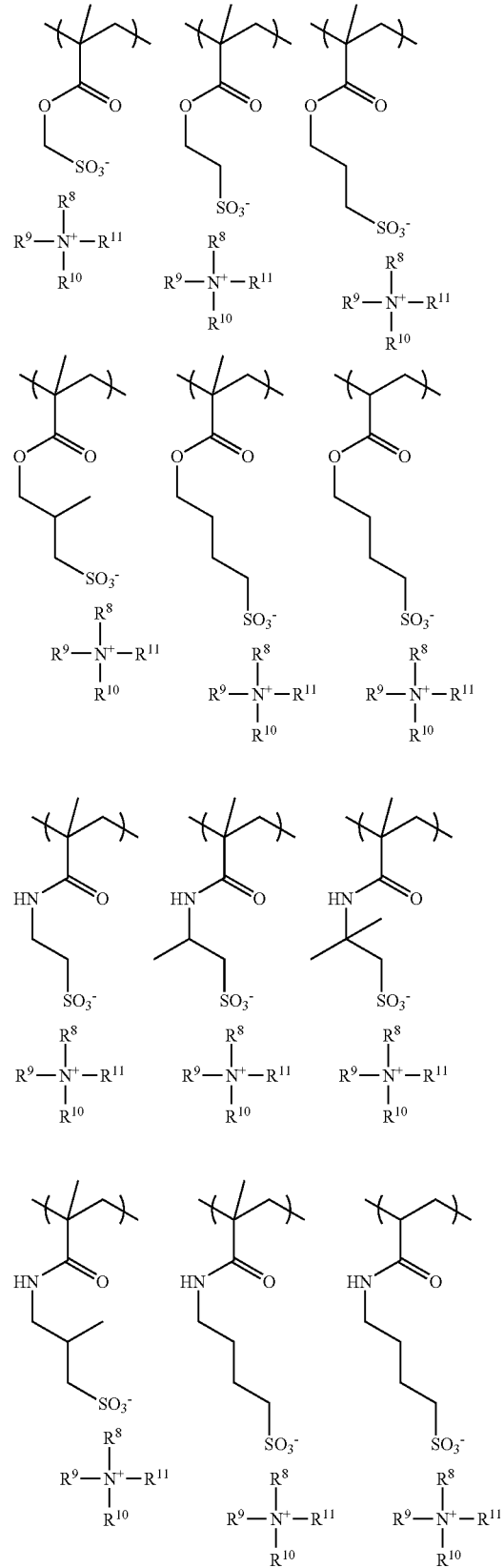

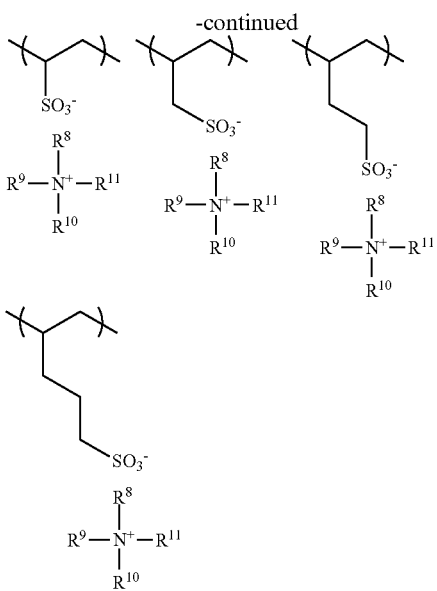

$R^8$, $R^9$, $R^{10}$, and $R^{11}$ are described above. Further, the ammonium salts each comprising $R^8$, $R^9$, $R^{10}$, and $R^{11}$, and a nitrogen atom can be obtained by a neutralization reaction with an amine compound represented by the following general formula (5):

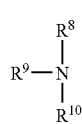 (5)

Examples of amine compound include primary, secondary, and tertiary aliphatic amines, mixed amines, aromatic amines, heterocyclic amines, nitrogen-containing compounds having carboxyl group, nitrogen-containing compounds having sulfonyl group, nitrogen-containing compounds having hydroxyl group, nitrogen-containing compounds having hydroxyphenyl group, alcoholic nitrogen-containing compounds, amides, imides, carbamates, and the like.

Concretely, examples of primary aliphatic amines include ammonia, methylamine, ethylamine, n-propylamine, isopropylamine, n-butylamine, isobutylamine, sec-butylamine, tert-butylamine, pentylamine, tert-amylamine, cyclopentylamine, hexylamine, cyclohexylamine, heptylamine, octylamine, nonylamine, decylamine, dodecylamine, cetylamine, methylenediamine, ethylenediamine, tetraethylenepentamine, and the like; examples of secondary aliphatic amines include dimethylamine, diethylamine, di-n-propylamine, diisopropylamine, di-n-butylamine, diisobutylamine, di-sec-butylamine, dipentylamine, dicyclopentylamine, dihexylamine, dicyclohexylamine, diheptylamine, dioctylamine, dinonylamine, didecylamine, didodecylamine, dicetylamine, N,N-dimethyl methylenediamine, N,N-dimethyl ethylenediamine, N,N-dimethyl tetraethylenepentamine, and the like; and examples of tertiary aliphatic amines include trimethylamine, triethylamine, tri-n-propylamine, triisopropylamine, tri-n-butylamine, triisobutylamine, tri-sec-butylamine, tripentylamine, tricyclopentylamine, trihexylamine, tricyclohexylamine, triheptylamine, trioctylamine, trinonylamine, tridecylamine, tridodecylamine, tricetylamine, N,N,N',N'-tetramethyl methylenediamine, N,N,N',N'-tetramethyl ethylenediamine, N,N,N',N'-tetramethyl tetraethylenepentamine, and the like.

Examples of mixed amines include dimethylethylamine, methylethylpropylamine, benzylamine, phenethylamine, benzyldimethylamine, and the like. Examples of aromatic amines and heterocyclic amines include aniline derivatives (e.g., aniline, N-methylaniline, N-ethylaniline, N-propylaniline, N,N-dimethylaniline, 2-methylaniline, 3-methylaniline, 4-methylaniline, ethylaniline, propylaniline, trimethylaniline, 2-nitroaniline, 3-nitroaniline, 4-nitroaniline, 2,4-dinitroaniline, 2,6-dinitroaniline, 3,5-dinitroaniline, N,N-dimethyltoluidine, and the like), diphenyl(p-tolyl)amine, methyldiphenylamine, triphenylamine, phenylenediamine, naphthylamine, diaminonaphthalene, pyrrole derivatives (e.g., pyrrole, 2H-pyrrole, 1-methylpyrrole, 2,4-dimethylpyrrole, 2,5-dimethylpyrrole, N-methylpyrrole, and the like), oxazole derivatives (e.g., oxazole, isooxazole, and the like), thiazole derivatives (e.g., thiazole and isothiazole), imidazole derivatives (e.g., imidazole, 4-methylimidazole, 4-methyl-2-phenylimidazole, and the like), pyrazole derivatives, furazan derivatives, pyrroline derivatives (e.g., pyrroline, 2-methyl-1-pyrroline, and the like), pyrrolidine derivatives (e.g., pyrrolidine, N-methylpyrrolidine, pyrrolidinone, N-methylpyrrolidone, and the like), imidazoline derivatives, imidazolidine derivatives, pyridine derivatives (e.g., pyridine, methylpyridine, ethylpyridine, propylpyridine, butylpyridine, 4-(1-butylpentyl)pyridine, dimethylpyridine, trimethylpyridine, triethylpyridine, phenylpyridine, 3-methyl-2-phenylpyridine, 4-tert-butylpyridine, diphenylpyridine, benzylpyridine, methoxypyridine, butoxypyridine, dimethoxypyridine, 4-pyrrolidinopyridine, 2-(1-ethylpropyl)pyridine, aminopyridine, dimethylaminopyridine, and the like), pyridazine derivatives, pyrimidine derivatives, pyrazine derivatives, pyrazoline derivatives, pyrazolidine derivatives, piperidine derivatives, piperazine derivatives, morpholine derivatives, indole derivatives, isoindole derivatives, 1H-indazole derivatives, indoline derivatives, quinoline derivatives (e.g., quinoline, 3-quinolinecarbonitrile, and the like), isoquinoline derivatives, cinnoline derivatives, quinazoline derivatives, quinoxaline derivatives, phthalazine derivatives, purine derivatives, pteridine derivatives, carbazole derivatives, phenanthridine derivatives, acridine derivatives, phenazine derivatives, 1,10-phenanthroline derivatives, adenine derivatives, adenosine derivatives, guanine derivatives, guanosine derivatives, uracil derivatives, uridine derivatives, and the like.

Examples of nitrogen-containing compounds having carboxyl group include aminobenzoic acid, indolecarboxylic acid, amino acid derivatives (e.g., nicotinic acid, alanine, alginine, aspartic acid, asparagine, glutamic acid, glutamine, glycine, histidine, isoleucine, glycylleucine, leucine, methionine, phenylalanine, threonine, lysine, 3-aminopyrazine-2-carboxylic acid, methoxyalanine, sacrosine, serine, phenylalanine, threonine, lysine, proline, tryptophane, 5-hydroxylysine, cysteine, tyrosine, N,N-dimethylalanine, N,N-dimethylarginine, N,N-dimethylaspartic acid, N,N-dimethylasparagine, N,N-dimethylglutamic acid, N,N-dimethylglutamine, N,N-dimethylglycine, N,N-dimethylhistidine, N,N-dimethylisoleucine, N,N-dimethyglycylleucine, N,N-dimethylieucine, N,N-dimethylmethionine, N,N-dimethylphenylalanine, N,N-dimethylthreonine, N,N-dimethyliysine, N,N-dimethylsacrosine, N,N-dimethylserine, N,N-dimethylphenylalanine, N,N-dimethylthreonine, N,N-dimethyliysine, N,N-dimethyl-5-hydroxylysine, N,N-dimethylarginine, N,N-dimethylcysteine, and N,N- dimethyltyrosine), and the like; examples of nitrogen-containing compounds having sulfonyl group include 3-pyridinesulfonic acid and pyridinium p-toluenesulfonate; examples of nitrogen-containing compounds having hydroxyl group, nitrogen-containing compounds having hydroxyphenyl group, and alcoholic nitrogen-containing compounds include 2-hydroxypyridine, aminocresol, 2,4-quinolinediol, 3-indolemethanol hydrate, monoethanolamine, diethanolamine, triethanolamine, N-ethyldiethanolamine, N,N-diethylethanolamine, triisopropanolamine, 2,2'-iminodiethanol, 2-aminoethanol, 3-amino-1-propanol, 4-amino-1-butanol, 4-(2-hydroxyethyl)morpholine, 2-(2-hydroxyethyl)pyridine, 1-(2-hydroxyethyl)piperazine, 1-[2-(2-hydroxyethoxy)ethyl]piperazine, piperidine ethanol, 1-(2-hydroxyethyl)pyrrolidine, 1-(2-hydroxyethyl)-2-pyrrolidinone, 3-piperidino-1,2-propanediol, 3-pyrrolidino-1,2-propanediol, 8-hydroxyjulolidine, 3-quinuclidinol, 3-tropanol, 1-methyl-2-pyrrolidine ethanol, 1-aziridine ethanol, N-(2-hydroxyethyl)phthalimide, N-(2-hydroxyethyl) isonicotinamide, tromethamine, and the like. Examples of amides include formamide, N-methylformamide, N,N-dimethylformamide, acetamide, N-methylacetamide, N,N-dimethylacetamide, propionamide, benzamide, 1-cyclohexylpyrrolidone, and the like. Examples of imides include phthalimide, succinimide, maleimide, and the like. Examples of carbamates include N-t-butoxycarbonyl-N,N-dicyclohexylamine, N-t-butoxycarbonylbenzimidazole, oxazolidinone, and the like.

It is also possible to add one or more selected from basic compounds represented by the following general formula (B)-1.

$$N(X')_n(Y')_{3-n} \quad (B)-1$$

In the general formula (B)-1, n=1, 2, or 3. Then, the side-chains X' may be the same or different, and can be represented by the following general formulae (X)-1 to (X)-3. The side-chain(s) Y' represents a hydrogen atom, or the same or different linear, branched, or cyclic alkyl groups having 1 to 20 carbon atoms, and may include an ether group or a hydroxyl group. Further, the side-chains X's may be linked to form a ring.

  (X)-1

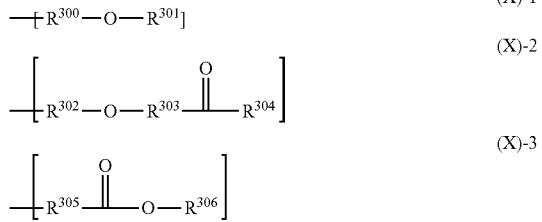

Here, $R^{300}$, $R^{302}$, and $R^{305}$ are independently either of a linear or branched alkylene group having 1 to 4 carbon atoms, wherein $R^{305}$ may additionally be a single bond; and $R^{301}$ and $R^{304}$ are independently any one of a hydrogen atom, and a linear, branched, or cyclic alkyl group having 1 to 20 carbon atoms, and may include one or more hydroxyl group, ether group, ester group, and lactone ring. $R^{303}$ is any one of a single bond, and a linear or branched alkylene group having 1 to 4 carbon atoms; and $R^{306}$ is any one of a linear, branched, or cyclic alkyl group having 1 to 20 carbon atoms, and may include one or more hydroxyl group, ether group, ester group, and lactone ring.

Concrete examples of the compound represented by the general formula (B)-1 include the following:

Namely, the examples include, without limited thereto, tris(2-methoxymethoxyethyl)amine, tris{2-(2-methoxyethoxy)ethyl}amine, tris{2-(2-methoxyethoxymethoxy)ethyl}amine, tris{2-(1-methoxyethoxy)ethyl}amine, tris{2-(1-ethoxyethoxy)ethyl}amine, tris{2-(1-ethoxypropoxy)ethyl}amine, tris[2-{2-(2-hydroxyethoxy)ethoxy}ethyl]amine, 4,7,13,16,21,24-hexaoxa-1,10-diazabicyclo[8.8.8]hexacosane, 4,7,13,18-tetraoxa-1,10-diazabicyclo[8.5.5]eicosane, 1,4,10,13-tetraoxa-7,16-diazabicyclooctadecane, 1-aza-12-crown-4,1-aza-15-crown-5,1-aza-18-crown-6, tris(2-formyloxyethyl)amine, tris(2-formyloxyethyl)amine, tris(2-acetoxyethyl)amine, tris(2-propionyloxyethyl)amine, tris(2-butyryloxyethyl)amine, tris(2-isobutyryloxyethyl)amine, tris(2-valeryloxyethyl)amine, tris(2-pivaloyloxyethyl)amine, N,N-bis(2-acetoxyethyl)-2-(acetoxyacetoxy)ethylamine, tris(2-methoxycarbonyloxyethyl)amine, tris(2-tert-butoxycarbonyloxyethyl)amine, tris[2-(2-oxopropoxy)ethyl]amine, tris[2-(methoxycarbonylmethyl)oxyethyl]amine, tris[2-(tert-butoxycarbonylmethyloxy)ethyl]amine, tris[2-(cyclohexyloxycarbonylmethyloxy)ethyl]amine, tris(2-methoxycarbonylethyl)amine, tris(2-ethoxycarbonylethyl)amine, N,N-bis(2-hydroxyethyl)-2-(methoxycarbonyl)ethylamine, N,N-bis(2-acetoxyethyl)-2-(methoxycarbonyl)ethylamine, N,N-bis(2-hydroxyethyl)-2-(ethoxycarbonyl)ethylamine, N,N-bis(2-acetoxyethyl)-2-(ethoxycarbonyl)ethylamine, N,N-bis(2-hydroxyethyl)-2-(2-methoxyethoxycarbonyl)ethylamine, N,N-bis(2-acetoxyethyl)-2-(2-methoxyethoxycarbonyl)ethylamine, N,N-bis(2-hydroxyethyl)-2-(2-hydroxyethoxycarbonyl)ethylamine, N,N-bis(2-acetoxyethyl)-2-(2-acetoxyethoxycarbonyl)ethylamine, N,N-bis(2-hydroxyethyl)-2-[(methoxycarbonyl)methoxycarbonyl]-ethylamine, N,N-bis(2-acetoxyethyl)-2-[(methoxycarbonyl)methoxycarbonyl]-ethylamine, N,N-bis(2-hydroxyethyl)-2-(2-oxopropoxycarbonyl)ethylamine, N,N-bis(2-acetoxyethyl)-N(2-(2-oxopropoxycarbonyl)ethylamine, N,N-bis(2-hydroxyethyl)-2-(tetrahydrofurfuryloxycarbonyl)-ethylamine, N,N-bis(2-acetoxyethyl)-2-(tetrahydrofurfuryloxycarbonyl)-ethylamine, N,N-bis(2-hydroxyethyl)-2-[(2-oxotetrahydrofuran-3-yl)oxy-carbonyl]ethylamine, N,N-bis(2-acetoxyethyl)-2-[(2-oxotetrahydrofuran-3-yl)oxy-carbonyl]ethylamine, N,N-bis(2-hydroxyethyl)-2-(4-hydroxybutoxycarbonyl)ethylamine, N,N-bis(2-formyloxyethyl)-2-(4-formyloxybutoxycarbonyl)-ethylamine, N,N-bis(2-formyloxyethyl)-2-(2-formyloxyethoxycarbonyl)-ethylamine, N,N-bis(2-methoxyethyl)-2-(methoxycarbonyl)ethylamine, N-(2-hydroxyethyl)-bis[2-(methoxycarbonyl)ethyl]amine, N-(2-acetoxyethyl)-bis[2-(methoxycarbonyl)ethyl]amine, N-(2-hydroxyethyl)-bis[2-(ethoxycarbonyl)ethyl]amine, N-(2-acetoxyethyl)-bis[2-(ethoxycarbonyl)ethyl]amine, N-(3-hydroxy-1-propyl)-bis[2-(methoxycarbonyl)ethyl]amine, N-(3-acetoxy-1-propyl)-bis[2-(methoxycarbonyl)ethyl]amine, N-(2-methoxyethyl)-bis[2-(methoxycarbonyl)ethyl]amine, N-butyl-bis[2-(methoxycarbonyl)ethyl]amine, N-butyl-bis[2-(2-methoxyethoxycarbonyl)ethyl]amine, N-methyl-bis(2-acetoxyethyl)amine, N-ethyl-bis(2-acetoxyethyl)amine, N-methyl-bis(2-pivaloyloxyethyl)amine, N-ethyl-bis[2-(methoxycarbonyloxy)ethyl]amine, N-ethyl-bis[2-(tert-butoxycarbonyloxy)ethyl]amine, tris(methoxycarbonylmethyl)amine, tris(ethoxycarbonylmethyl)amine, N-butyl-bis(methoxycarbonylmethyl)amine, N-hexyl-bis(methoxycarbonylmethyl)amine, β-(diethylamino)-δ-valerolactone, glycine methyl ester, glycine ethyl ester, glycine propyl ester, N,N-dimethylglycine methyl ester, N,N-dimethylglycine ethyl ester, N,N-dimethylglycine propyl ester, alanine methyl ester, alanine ethyl ester, alanine propyl ester, N,N-dimethylalanine methyl ester, N,N-dimethylalanine ethyl ester, N,N-dimethylalanine propyl ester, valine methyl ester, valine ethyl ester, valine propyl ester, N,N-dimethylvaline methyl ester, N,N-dimethylvaline ethyl ester, N,N-dimethylvaline propyl ester, leucine methyl ester, leucine ethyl ester, leucine propyl ester, N,N-dimethylleucine methyl ester, N,N-dimethylleucine ethyl ester, N,N-dimethylleucine propyl ester, isoleucine methyl ester, isoleucine ethyl ester, isoleucine propyl ester, N,N-dimethylisoleucine methyl ester, N,N-dimethylisoleucine ethyl ester, N,N-dimethylisoleucine propyl ester, aspartic acid dimethyl ester, glutamic acid dimethyl ester, and the like.

When $R^{305}$ is a single bond, the basic compounds are carbamate amines, as which the compounds concretely mentioned in JP2001-166476A are usable.

It is further possible to add one or more basic compounds having a ring structure represented by the following general formula (B)-2.

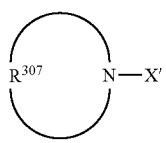

(B)-2

(in the formula, X' is described above; and $R^{307}$ is a linear or branched alkylene group having 2 to 20 carbon atoms, and may include one or more carbonyl group, ether group, ester group, and sulfide).

Concrete examples of basic compounds having a ring structure represented by the general formula (B)-2 include 1-[2-(methoxymethoxy)ethyl]pyrrolidine, 1-[2-(methoxymethoxy)ethyl]piperidine, 4-[2-(methoxymethoxy)ethyl]morpholine, 1-[2-[(2-methoxyethoxy)methoxy]ethyl] pyrrolidine, 1-[2-[(2-methoxyethoxy)methoxy]ethyl]piperidine, 4-[2-[(2-methoxyethoxy)methoxy]ethyl] morpholine, 2-(1-pyrrolidinyl)ethyl acetate, 2-piperidinoethyl acetate, 2-morpholinoethyl acetate, 2-(1-pyrrolidinyl)ethyl formate, 2-piperidinoethyl propionate, 2-morpholinoethyl acetoxyacetate, 2-(1-pyrrolidinyl)ethyl methoxyacetate, 4-[2-(methoxycarbonyloxy)ethyl]morpholine, 1-[2-(t-butoxycarbonyloxy)ethyl]piperidine, 4-[2-(2-methoxyethoxycarbonyloxy)ethyl]morpholine, methyl 3-(1-pyrrolidinyl)propionate, methyl 3-piperidinopropionate, methyl 3-morpholinopropionate, methyl 3-(thiomorpholino)propionate, methyl 2-methyl-3-(1-pyrrolidinyl)propionate, ethyl 3-morpholinopropionate, methoxycarbonylmethyl 3-piperidinopropionate, 2-hydroxyethyl 3-(1-pyrrolidinyl) propionate, 2-acetoxyethyl 3-morpholinopropionate, 2-oxotetrahydrofuran-3-yl 3-(1-pyrrolidinyl)propionate, tetrahydrofurfuryl 3-morpholinopropionate, glycidyl 3-piperidinopropionate, 2-methoxyethyl 3-morpholinopropionate, 2-(2-methoxyethoxy)ethyl 3-(1-pyrrolidinyl)propionate, butyl 3-morpholinopropionate, cyclohexyl 3-piperidinopropionate, α-(1-pyrrolidinyl)methyl-γ-butyrolactone, β-piperidino-γ-butyrolactone, β-morpholino-δ-valerolactone, methyl 1-pyrrolidinylacetate, methyl piperidinoacetate, methyl morpholinoacetate, methyl thiomorpholinoacetate, ethyl 1-pyrrolidinylacetate, and 2-methoxyethyl morpholinoacetate.

Moreover, it is possible to add a basic compound(s) including a cyano group represented by the general formulae (B)-3 to (B)-6.

(in the formula, X', $R^{307}$, and n are described above; and $R^{308}$ and $R^{309}$ are the same or different linear or branched alkylene groups having 1 to 4 carbon atoms).

Concrete examples of the basic compounds each including a cyano group include 3-(diethylamino)propiononitrile, N,N-bis(2-hydroxyethyl)-3-aminopropiononitrile, N,N-bis(2-acetoxyethyl)-3-aminopropiononitrile, N,N-bis(2-formyloxyethyl)-3-aminopropiononitrile, N,N-bis(2-methoxyethyl)-3-aminopropiononitrile, N,N-bis[2-(methoxymethoxy)ethyl]-3-aminopropiononitrile, methyl N-(2-cyanoethyl)-N-(2-methoxyethyl)-3-aminopropionate, methyl N-(2-cyanoethyl)-N-(2-hydroxyethyl)-3-aminopropionate, methyl N-(2-acetoxyethyl)-N-(2-cyanoethyl)-3-aminopropionate, N-(2-cyanoethyl)-N-ethyl-3-aminopropiononitrile, N-(2-cyanoethyl)-N-(2-hydroxyethyl)-3-aminopropiononitrile, N-(2-acetoxyethyl)-N-(2-cyanoethyl)-3-aminopropiononitrile, N-(2-cyanoethyl)-N-(2-formyloxyethyl)-3-aminopropiononitrile, N-(2-cyanoethyl)-N-(2-methoxyethyl)-3-aminopropiononitrile, N-(2-cyanoethyl)-N-[2-(methoxymethoxy)ethyl]-3-aminopropiononitrile, N-(2-cyanoethyl)-N-(3-hydroxy-1-propyl)-3-aminopropiononitrile, N-(3-acetoxy-1-propyl)-N-(2-cyanoethyl)-3-aminopropiononitrile, N-(2-cyanoethyl)-N-(3-formyloxy-1-propyl)-3-aminopropiononitrile, N-(2-cyanoethyl)-N-tetrahydrofurfuryl-3-aminopropiononitrile, N,N-bis(2-cyanoethyl)-3-aminopropiononitrile, diethylaminoacetonitrile, N,N-bis(2-hydroxyethyl)aminoacetonitrile, N,N-bis(2-acetoxyethyl)aminoacetonitrile, N,N-bis(2-formyloxyethyl)aminoacetonitrile, N,N-bis(2-methoxyethyl)aminoacetonitrile, N,N-bis[2-(methoxymethoxy)ethyl]aminoacetonitrile, methyl N-cyanomethyl-N-(2-methoxyethyl)-3-aminopropionate, methyl N-cyanomethyl-N-(2-hydroxyethyl)-3-aminopropionate, methyl N-(2-acetoxyethyl)-N-cyanomethyl-3-aminopropionate, N-cyanomethyl-N-(2-hydroxyethyl)aminoacetonitrile, N-(2-acetoxyethyl)-N-(cyanomethyl)aminoacetonitrile, N-cyanomethyl-N-(2-formyloxyethyl)aminoacetonitrile, N-cyanomethyl-N-(2-methoxyethyl)aminoacetonitrile, N-cyanomethyl-N-[2-(methoxymethoxy)ethyl]aminoacetonitrile, N-(cyanomethyl)-N-(3-hydroxy-1-propyl)aminoacetonitrile, N-(3-acetoxy-1-propyl)-N-(cyanomethyl)aminoacetonitrile, N-cyanomethyl-N-(3-formyloxy-1-propyl) aminoacetonitrile, N,N-bis(cyanomethyl)aminoacetonitrile, 1-pyrrolidine propiononitrile, 1-piperidine propiononitrile, 4-morpholine propiononitrile, 1-pyrrolidine acetonitrile, 1-piperidine acetonitrile, 4-morpholine acetonitrile, cyanomethyl 3-diethylaminopropionate, cyanomethyl N,N-bis(2-hydroxyethyl)-3-aminopropionate, cyanomethyl N,N-bis(2-acetoxyethyl)-3-aminopropionate, cyanomethyl N,N-bis(2-formyloxyethyl)-3-aminopropionate, cyanomethyl N,N-bis(2-methoxyethyl)-3-aminopropionate, cyanomethyl N,N-bis[2-(methoxymethoxy)ethyl]-3-aminopropionate, 2-cyanoethyl 3-diethylaminopropionate, 2-cyanoethyl N,N-bis(2-hydroxyethyl)-3-aminopropionate, 2-cyanoethyl N,N-bis(2-acetoxyethyl)-3-aminopropionate, 2-cyanoethyl N,N-bis(2-formyloxyethyl)-3-aminopropionate, 2-cyanoethyl N,N-bis(2-methoxyethyl)-3-aminopropionate, 2-cyanoethyl N,N-bis[2-(methoxymethoxy)ethyl]-3-aminopropionate, cyanomethyl 1-pyrrolidine propionate, cyanomethyl 1-piperidine propionate, cyanomethyl 4-morpholine propionate, 2-cyanoethyl 1-pyrrolidine propionate, 2-cyanoethyl 1-piperidine propionate, 2-cyanoethyl 4-morpholine propionate, and the like.

Furthermore, the ammonium salts each comprising $R^8$, $R^9$, $R^{10}$, and $R^{11}$, and a nitrogen atom can be obtained by an ion-exchange reaction with an ammonium salt represented by the following general formula (6):

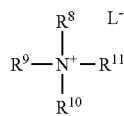

(6)

Here, $R^8$, $R^9$, $R^{10}$, and $R^{11}$ are described above, and examples of L include hydroxide, chlorine atom, bromine atom, iodine atom, organic carboxylic acid, and nitric acid. Concrete examples of the compound represented by the general formula (6) include tetramethylammonium hydroxide, tetraethylammonium hydroxide, tetrapropylammonium hydroxide, tetrabutylammonium hydroxide, methyltriphenylammonium hydroxide, choline hydroxide, tetramethylammonium chloride, tetramethylammonium bromide, tetramethylammonium iodide, tetramethylammonium acetate, tetramethylammonium nitrate, and the like.

Concrete examples of the repeating unit c-2 include the following:

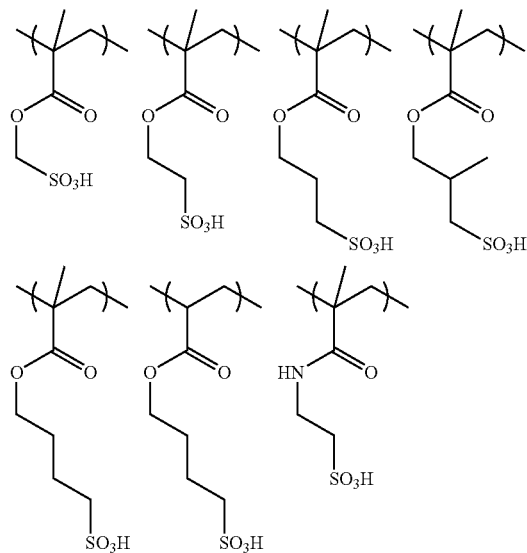

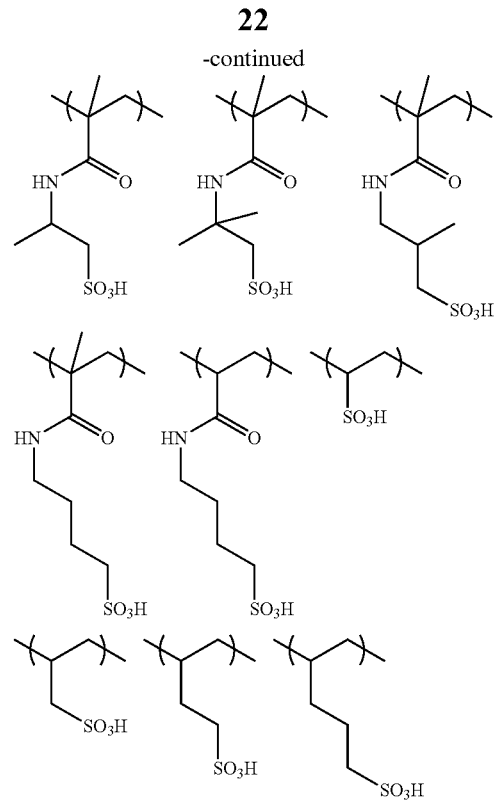

Meanwhile, concrete examples of the repeating unit d-1 include the following. In case of tertiary or lower ammonium salts, they can be each obtained by a neutralization reaction of (meth)acrylate having an amino group with a sulfonic acid, and in case of a quaternary ammonium salt, it can be obtained by an ion-exchange reaction of a hydroxide, a chlorine atom, a bromine atom, an iodine atom, an organic carboxylic acid, or a nitric acid of the quaternary ammonium, with a sulfonic acid. Here, $R^{12}$ and $R^{16}$ are described above; and concrete examples of sulfonic acids include fluoroalkylsulfonates such as triflate, 1,1,1-trifluoromethanesulfonate, nonafluorobutanesulfonate; arylsulfonates such as tosylate, benzenesulfonate, 4-fluorobenzenesulfonate, 1,2,3,4,5-pentafluorobenzenesulfonate, xylenesulfonicacid, mesitylenesulfonicacid, p-t-butylbenzenesulfonicacid, naphthalenesulfonicacid, anthracenesulfonicacid, and pyrenesulfonicacid; and alkylsulfonates such as mesylate, butanesulfonate, octanesulfonicacid, camphorsulfonicacid, adamantanesulfonicacid, norbornenesulfonicacid, cyclohexylsulfonicacid, cyclopentanesulfonicacid, cyclobutanesulfonicacid, cyclopropanesulfonicacid, and dodecylbenzenesulfonicacid.

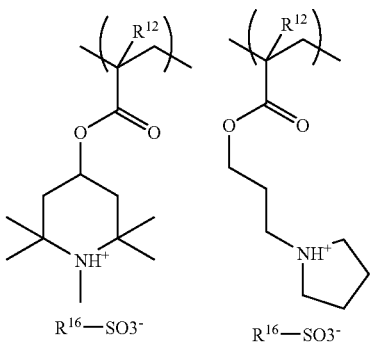

23
-continued
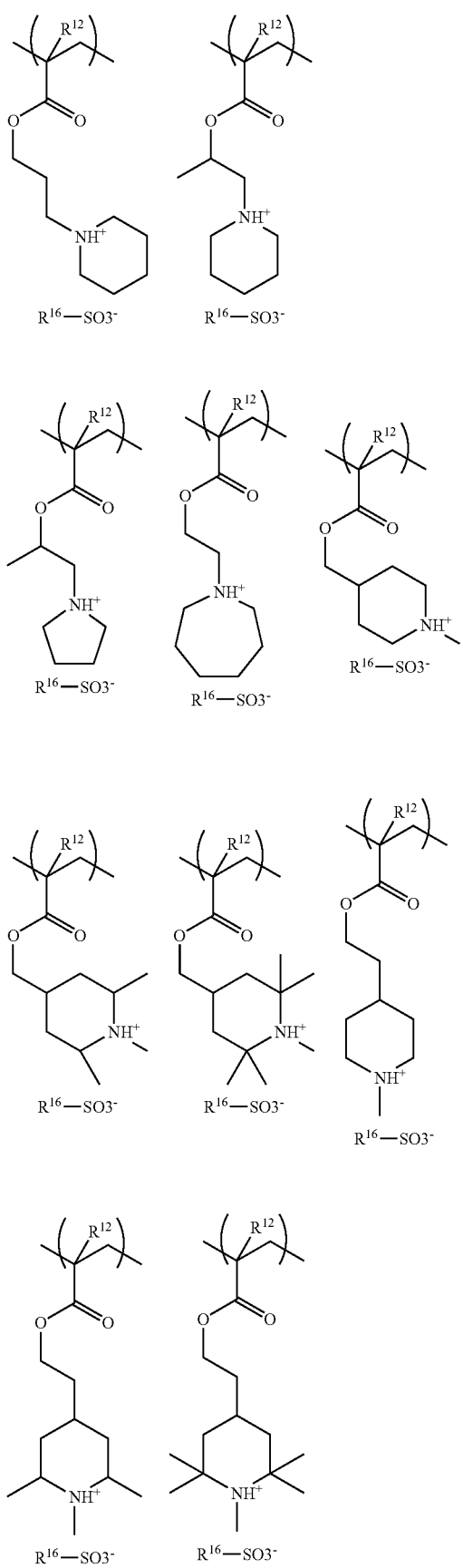
24
-continued
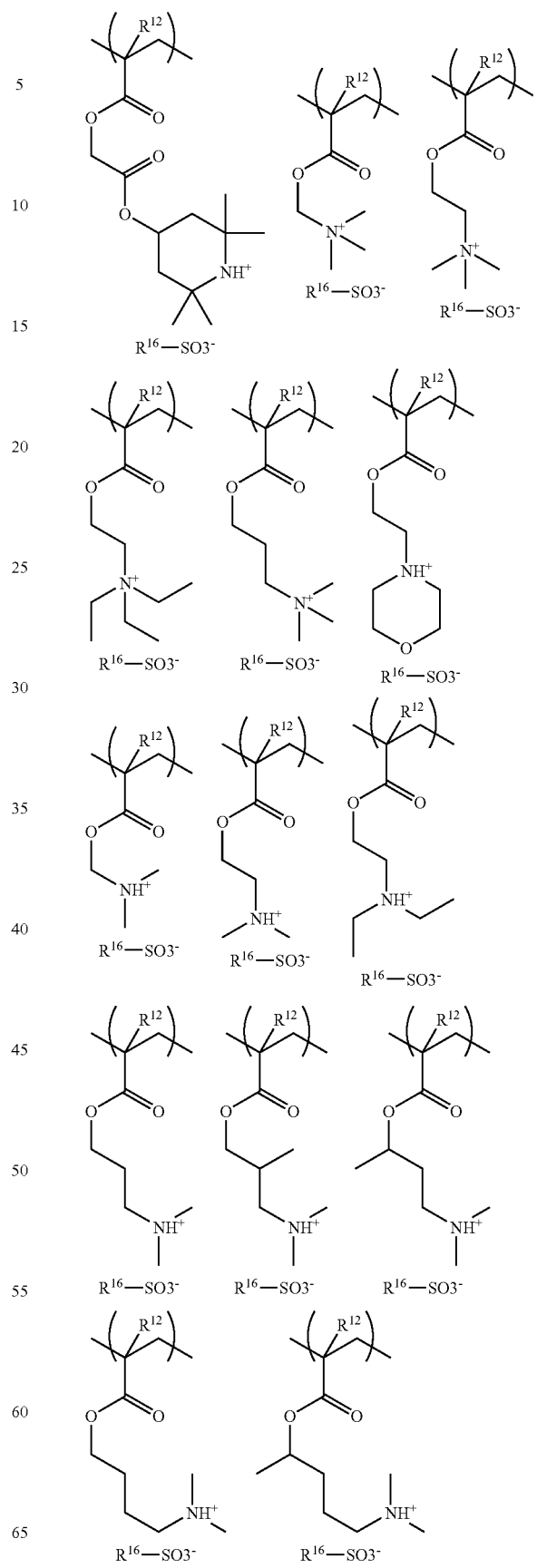

-continued
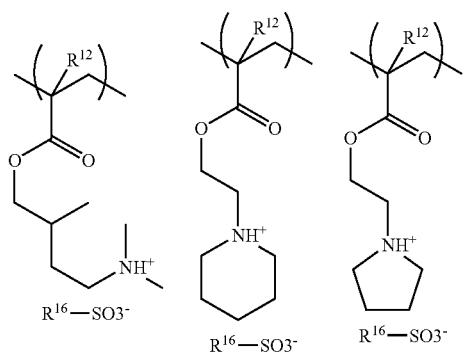
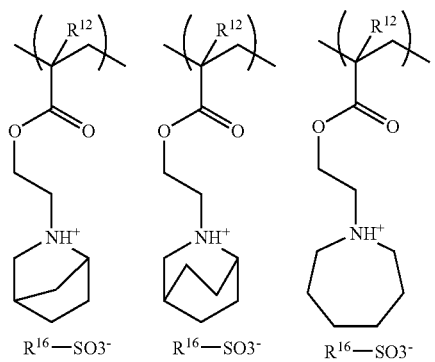
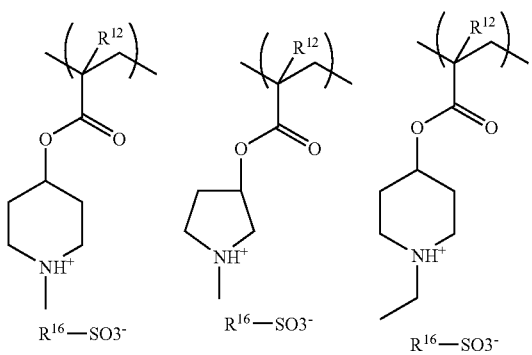
-continued
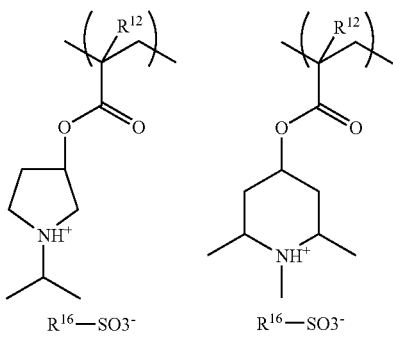
Examples of the repeating unit d-2 include the following:
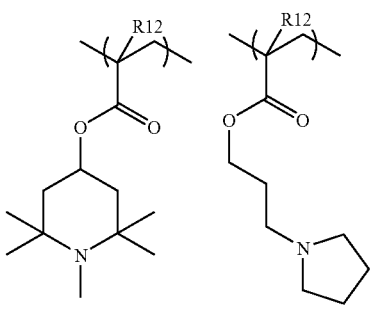
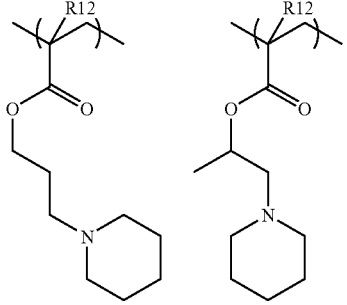
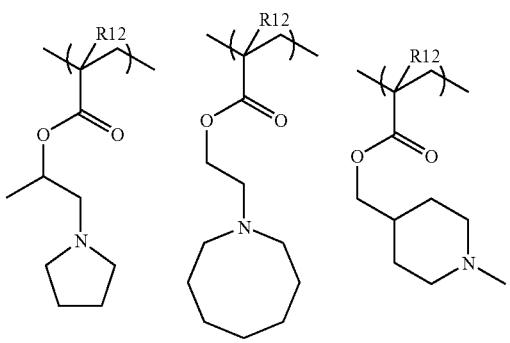

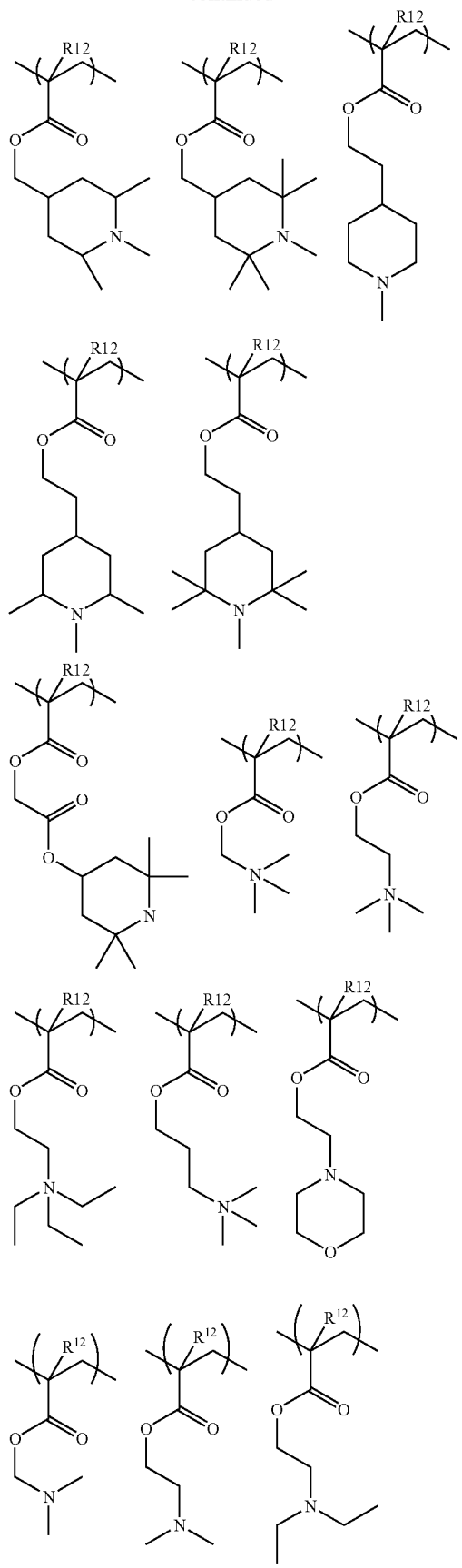
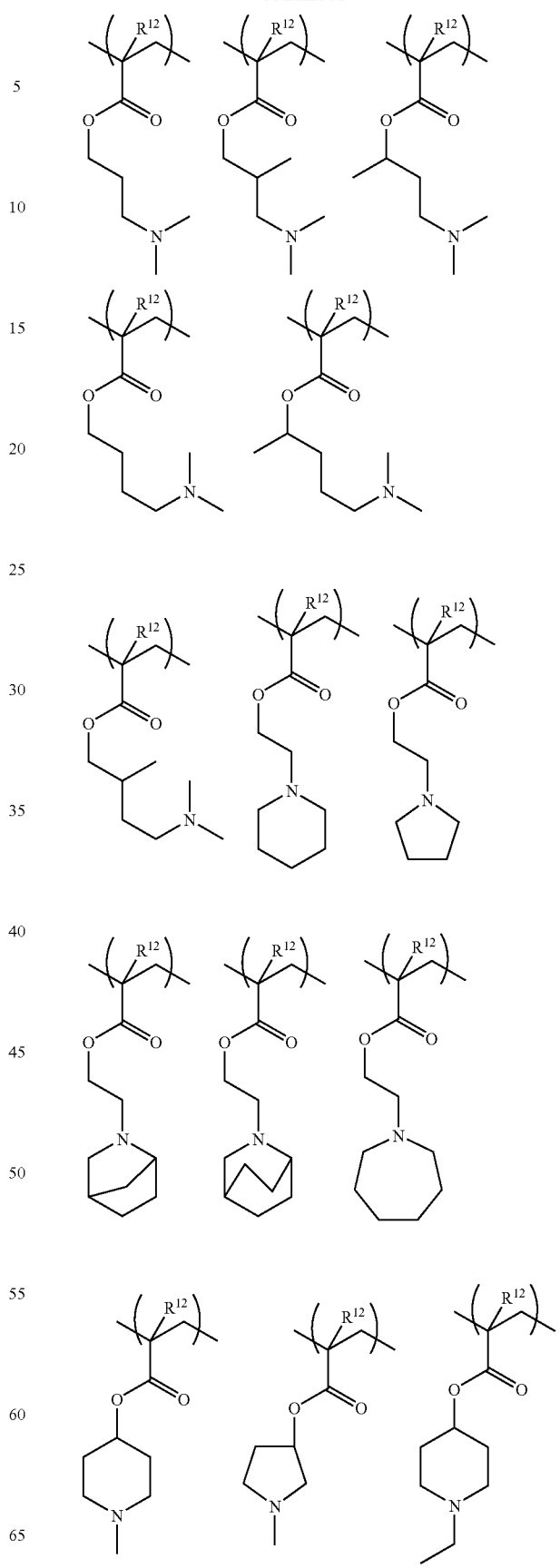

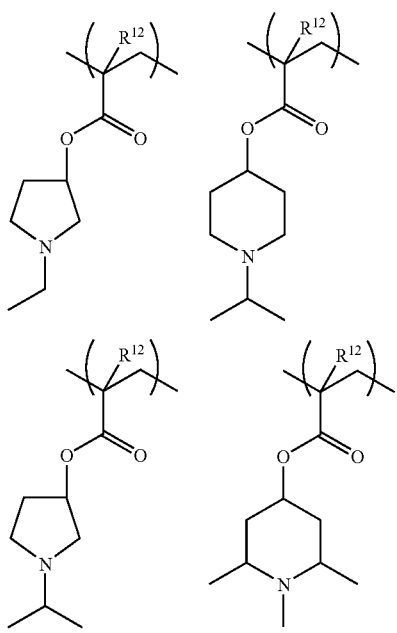

When the repeating unit c-2 and d-2 are coexistent, they form an amine salt of a sulfonic acid in an inter-molecular or intramolecular manner, as follows:

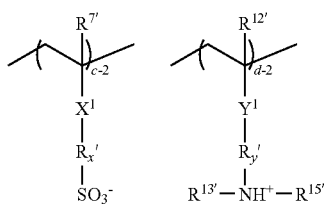

(in the formula, $R^{7'}$, $R^{12'}$, $X^1$, $Y^1$, $R_x{}'$, $R_y{}'$, $R^{13'}$, and $R^{15'}$ are described above).

As synthesizing methods of amine salts of sulfonic acids, there are produced primary, secondary, and tertiary ammonium salts by neutralization reactions based on mixing of a sulfonic acid with applicable primary, secondary, and secondary amine compounds, respectively. Examples of synthesizing methods for quaternary ammonium salts include a neutralization reaction of a tetraalkylammonium hydroxide with a sulfonic acid, an alkylation of a sulfonic acid in a trialkyl amine with an alkyl ester, and an ion-exchange reaction of a tetraalkylammonium halide with a sulfonic acid. The amine salts of sulfonic acids may be synthesized at the stage of monomers before polymerization, or by reactions after polymerization.

As a reaction after polymerization in case of a repeating unit c-1, the repeating unit having a sulfo group are polymerized, followed by mixing with an amine compound. The amine compound may be mixed, after preparing sulfo groups by ion-exchange after polymerization of monomers of an alkali metal salt such as a sodium sulfonate. Meanwhile, in case of a repeating unit d-1, the repeating unit having an amino group may be polymerized, followed by mixing with a sulfonic acid.

Concerning a neutralization degree between sulfo groups and the amine compound in case of the repeating unit c-1, sulfo group residues is allowed to be present by a smaller chemical equivalent of amine, or amines are alternatively allowed to be excessive. This is also applicable to the amounts of sulfo groups and amine compound in case of the repeating unit d-1, and to the ratio of amino groups and sulfo groups in copolymers by the combination of the repeating unit c-2 and d-2. Presence of sulfonic acid residues exhibits an effect to prevent bridging between resist patterns after development in case of combination of the resist top coat with a photoresist to thereby prevent blob defects, while excess of amines exhibits an effect to improve rectangularity of resist pattern profiles; so that it is possible to appropriately adjust amounts of sulfonic acids and amines, while observing resist patterns after development. As a desirable ratio between amine compound and sulfo group, the molar ratio of amine compound/sulfo group is between 0 inclusive and 5.0 inclusive, and more desirably between 0 inclusive and 3.0 inclusive.

Meanwhile, supposing that a+b=1 when a total amount of the repeating unit a and b is 100 mol % relative to a total amount of all the repeating units in the polymer I including the repeating units a and b, the present amount of the repeating unit a is between 0.3 and 0.9, and preferably between 0.4 and 0.85. Further, supposing that a+b<1 when a total amount of the repeating units a and b is less than 100 mol % relative to a total amount of all the repeating units in a case that other repeating unit are included, a+b is 0.5 or more, and desirably 0.7 or more. Note that examples of other units include repeating unit having a fluoroalkyl group shown below.

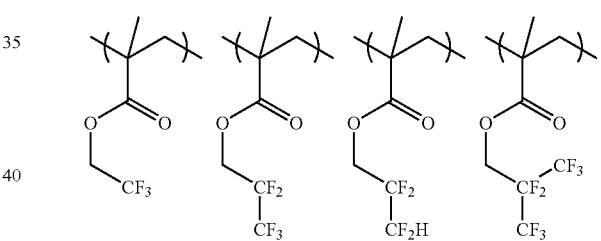

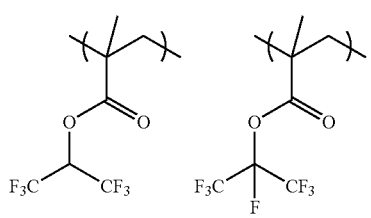

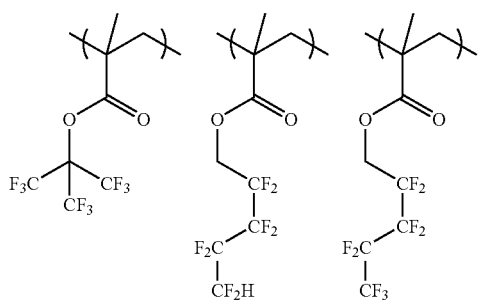

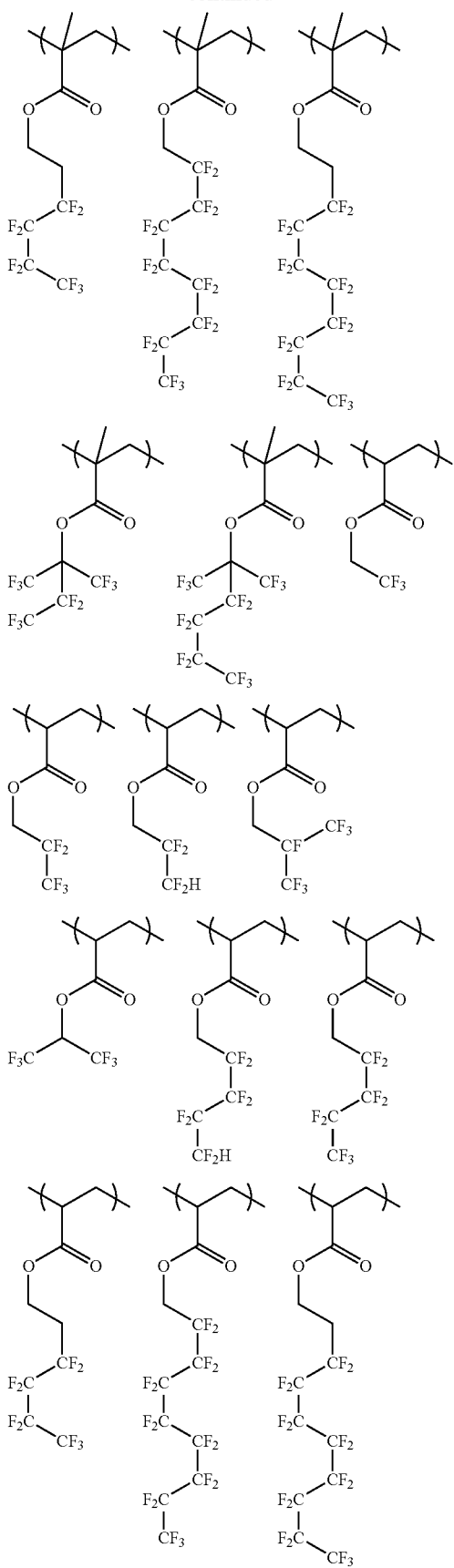
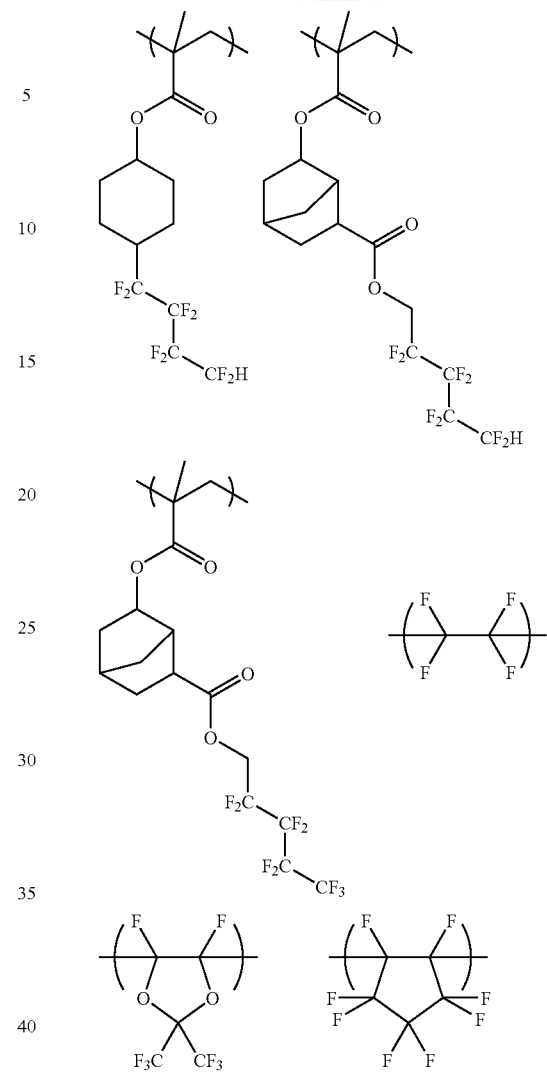
It is also possible to copolymerize a repeating unit having an alkyl group shown below.
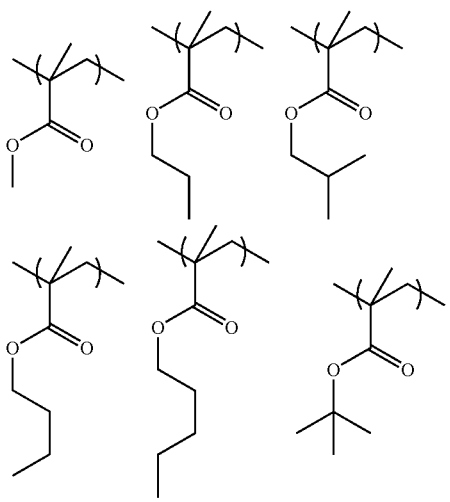

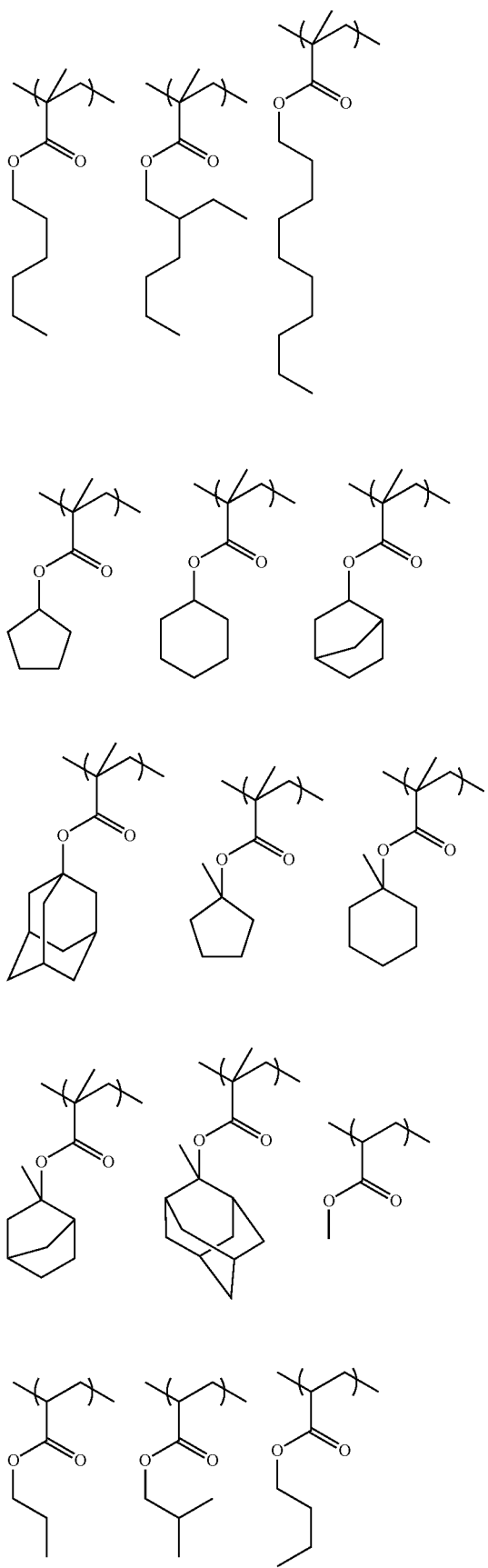
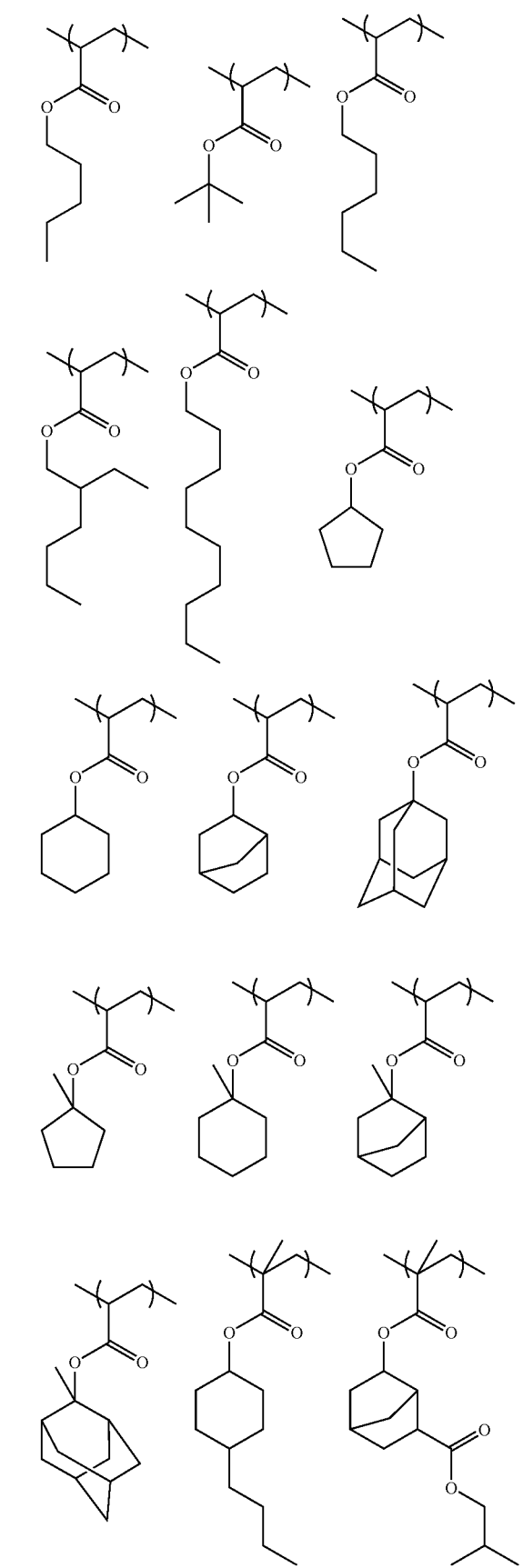

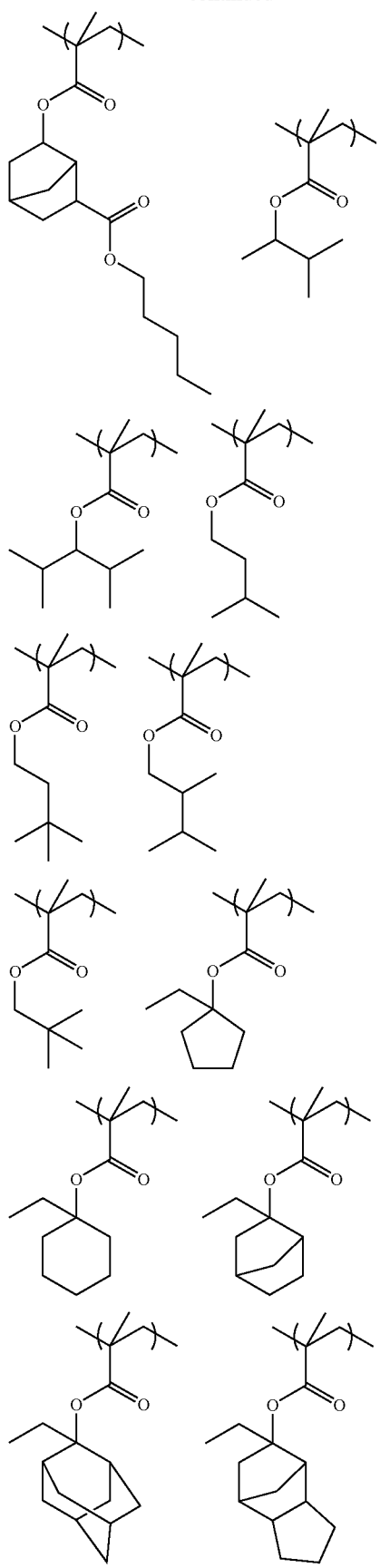
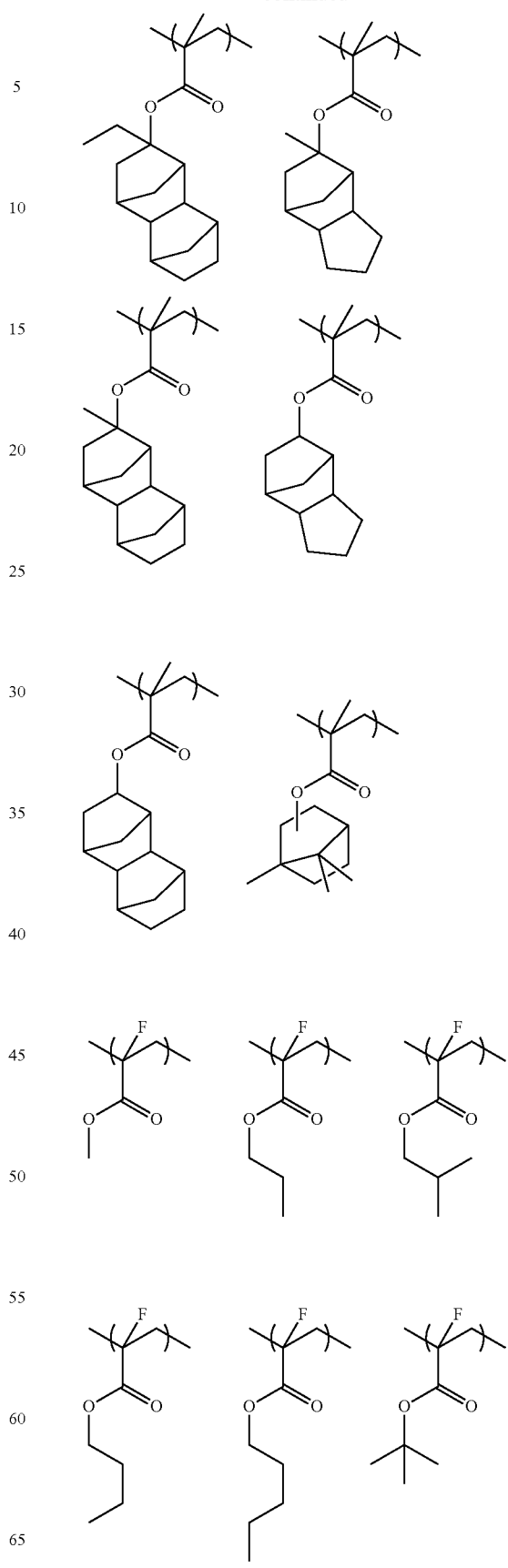

37
-continued
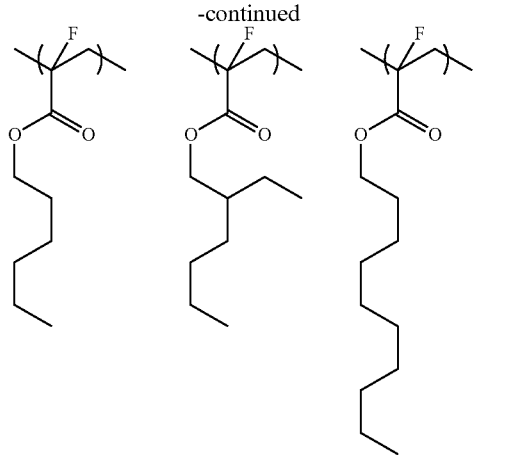
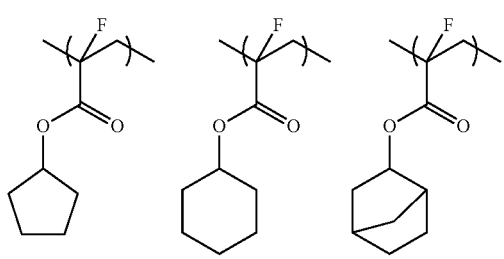
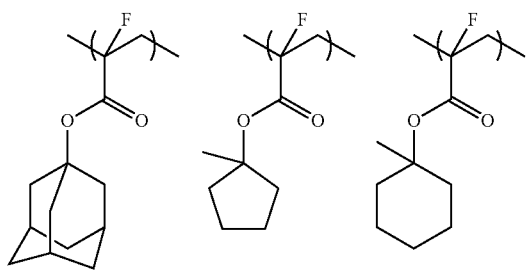
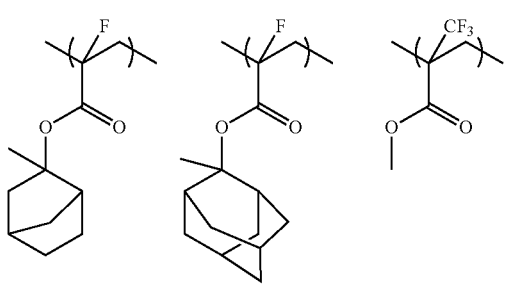
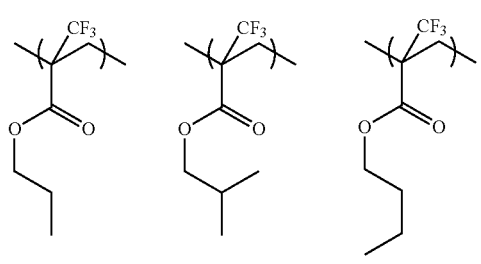
38
-continued
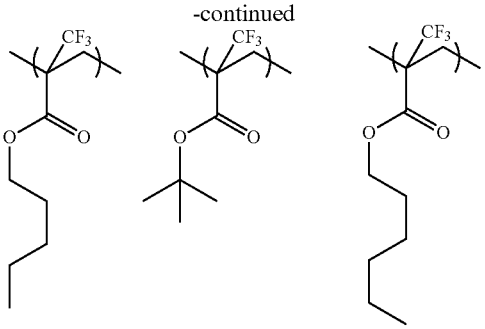
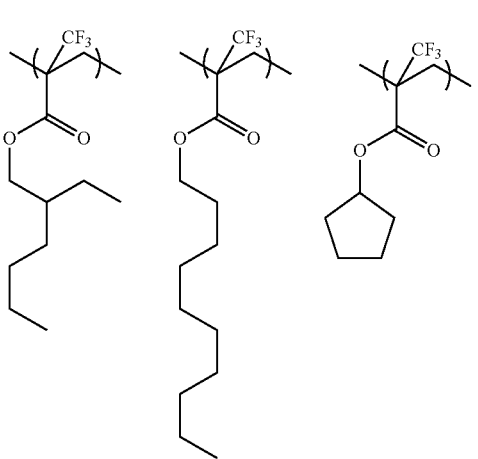
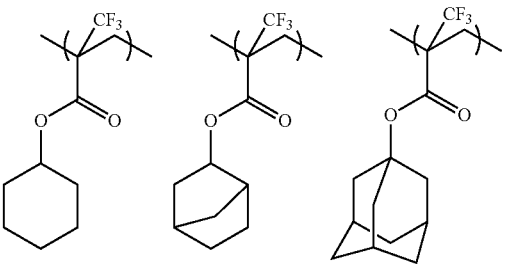
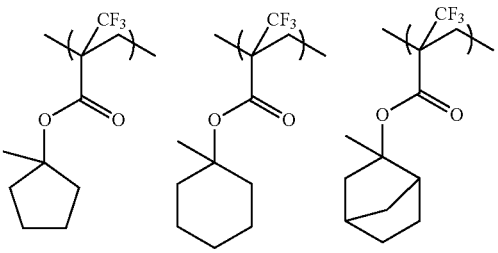
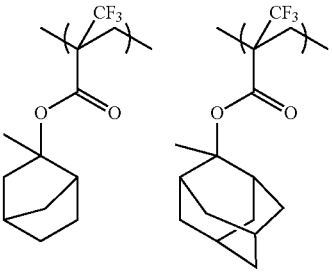

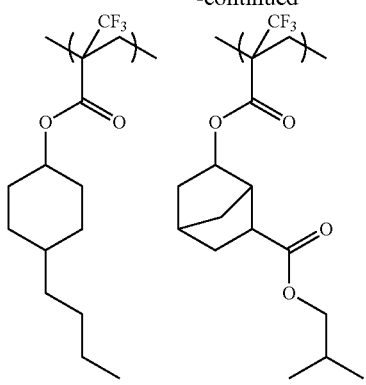
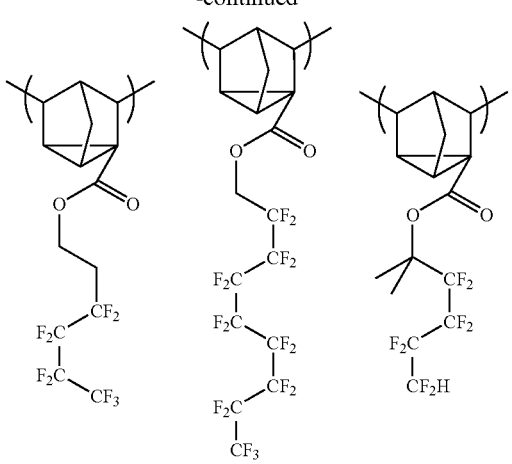
It is further possible to copolymerize nortricyclenes shown below, obtained by polymerizing norbornadienes.
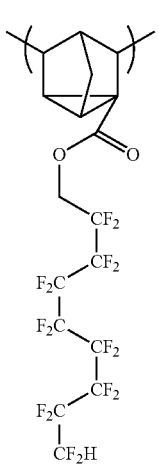
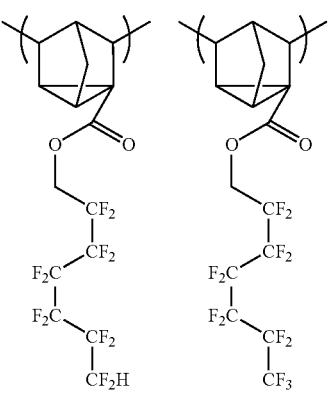
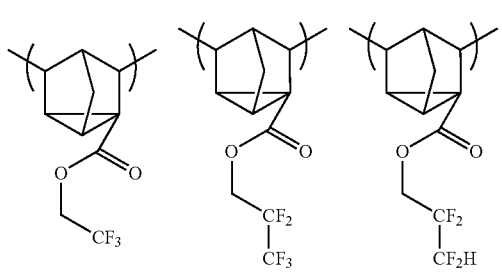
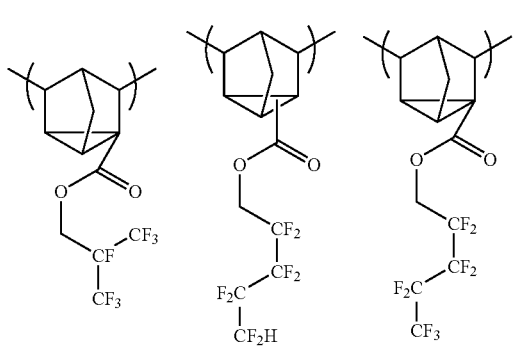
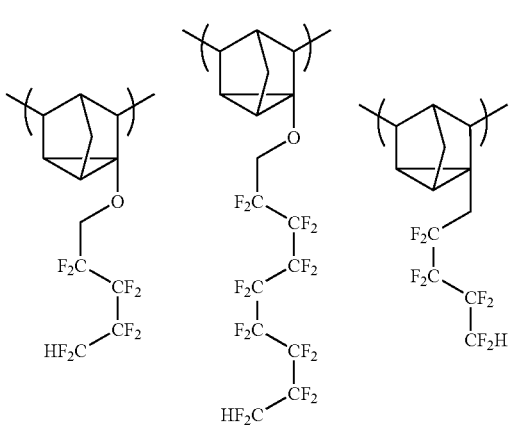

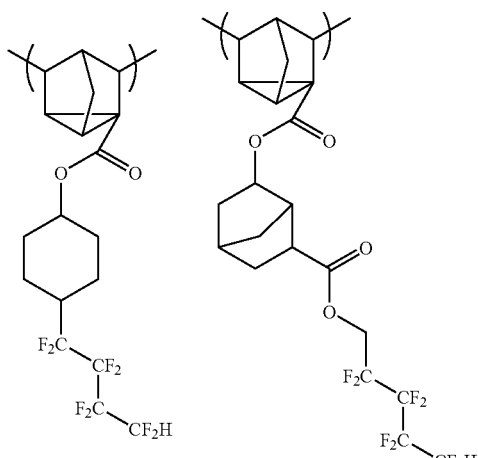
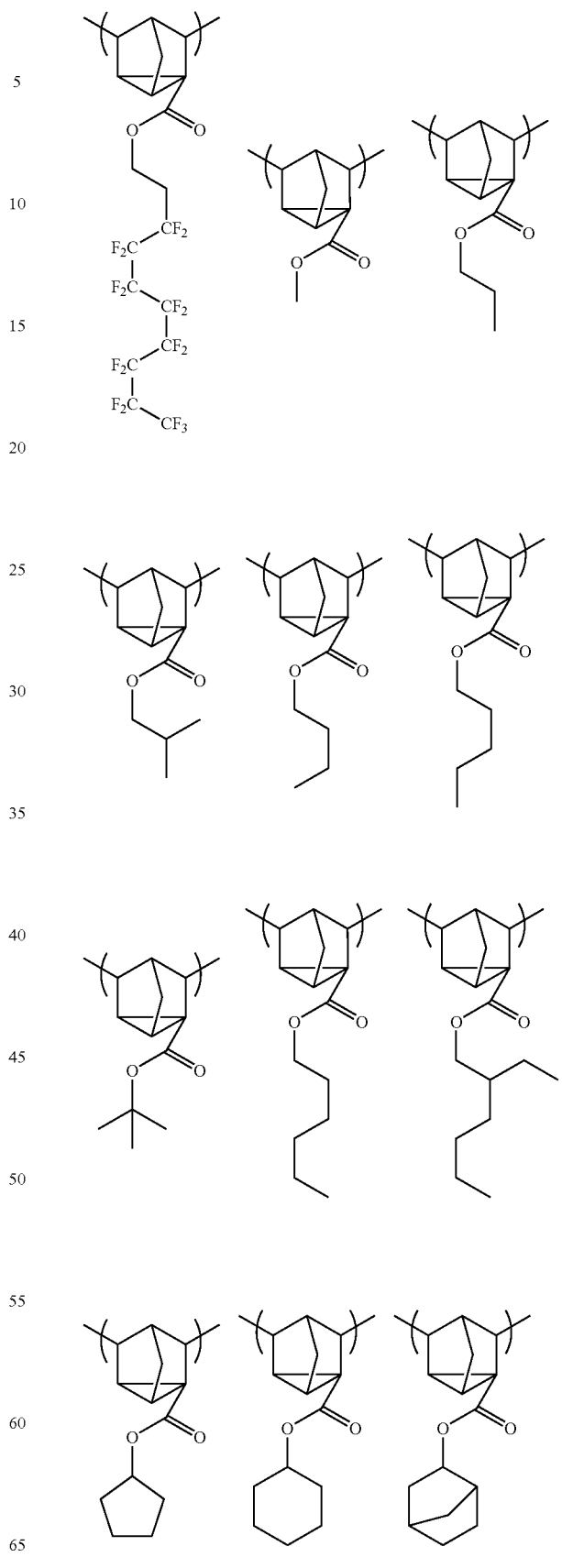

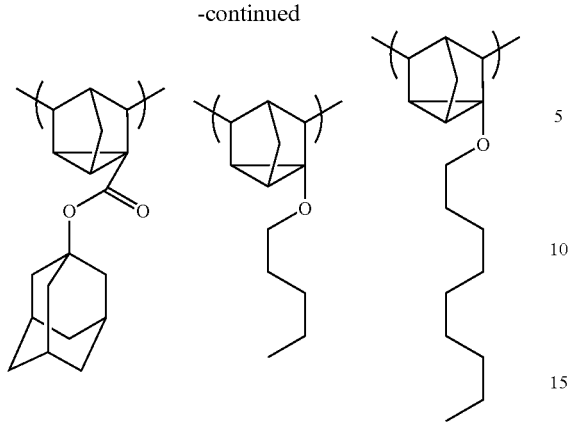
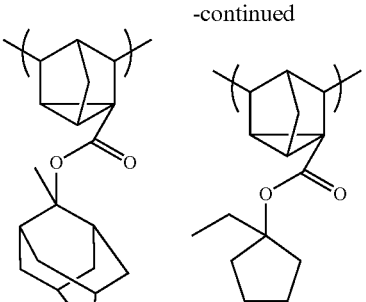

Furthermore, it is possible to copolymerize norbornenes shown below.
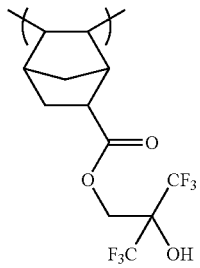 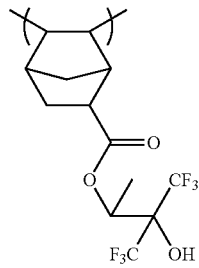 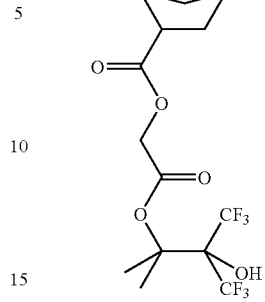 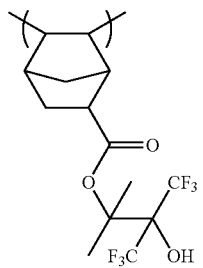
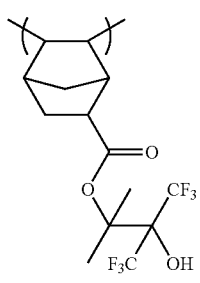 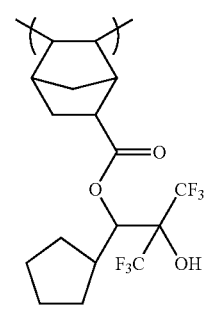 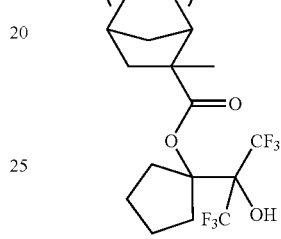 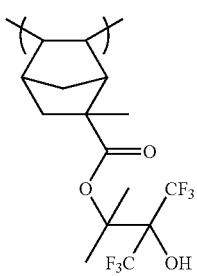
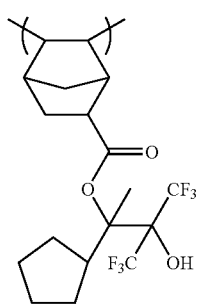 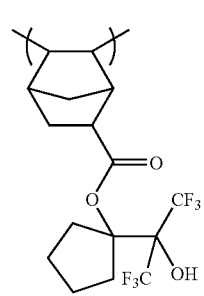 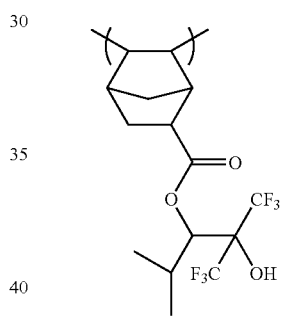 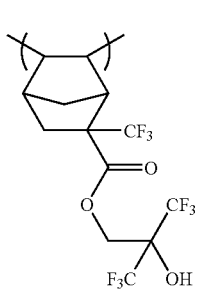
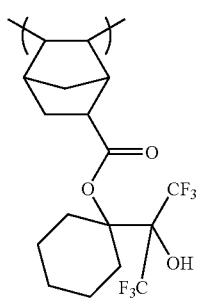 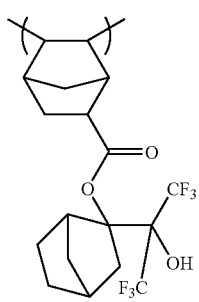 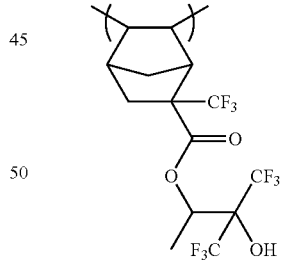 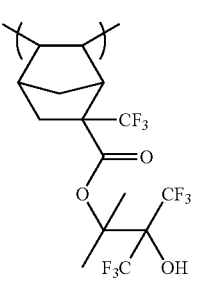
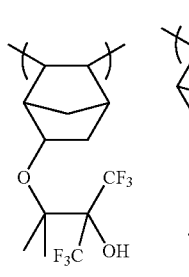 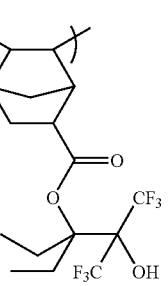 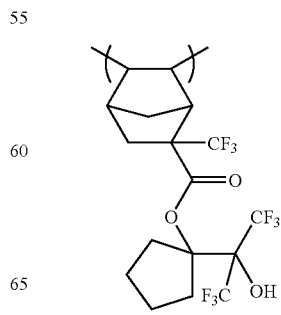 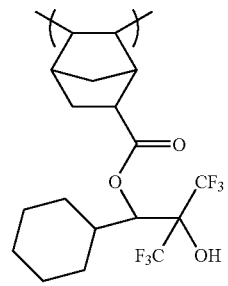

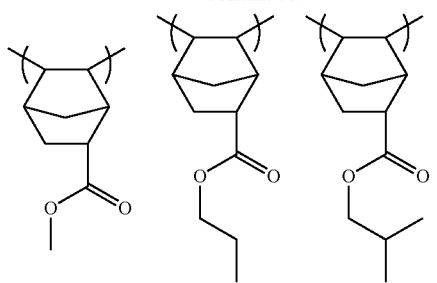
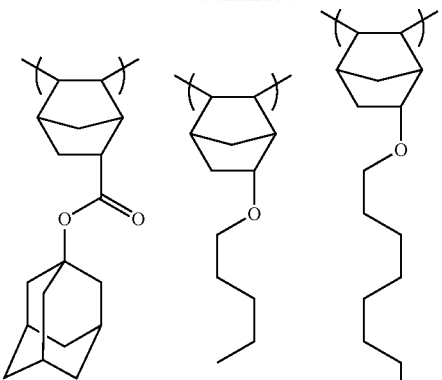
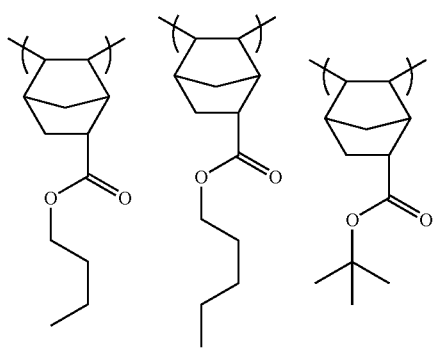
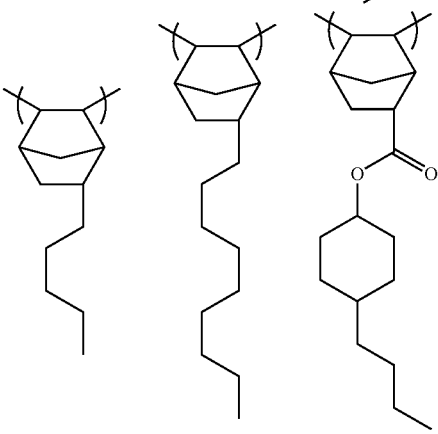
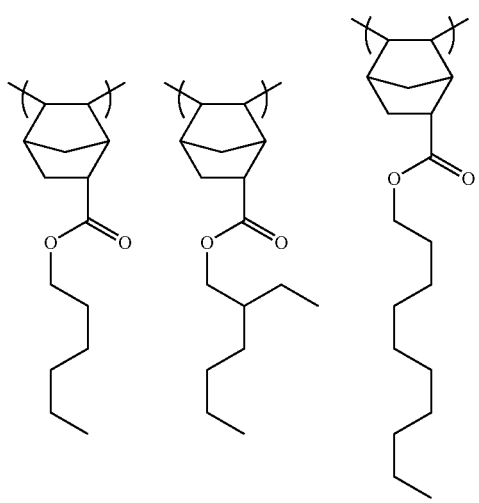
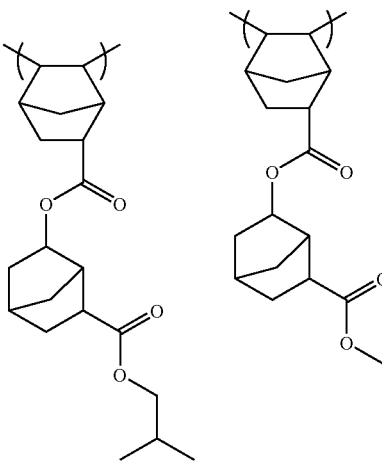
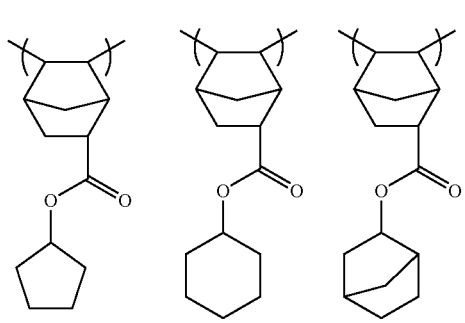
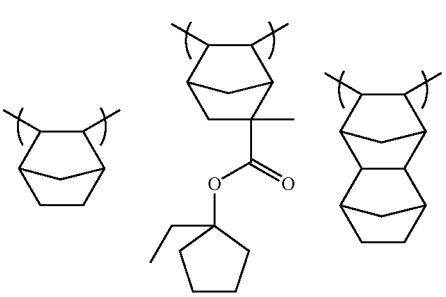

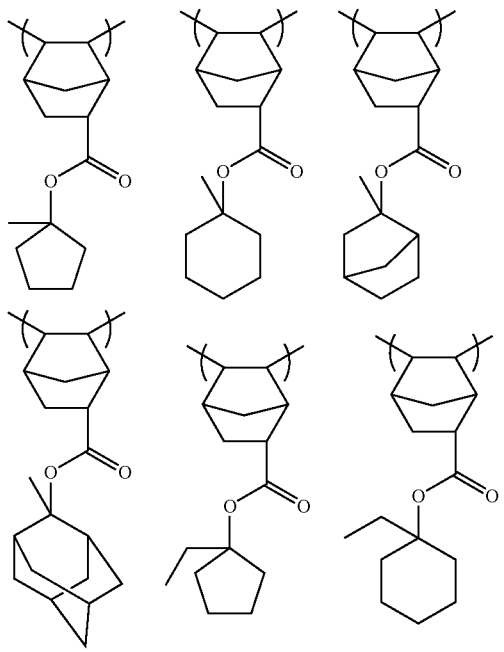
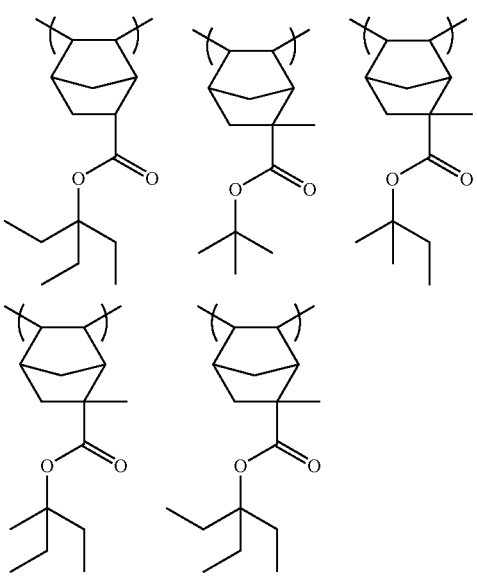
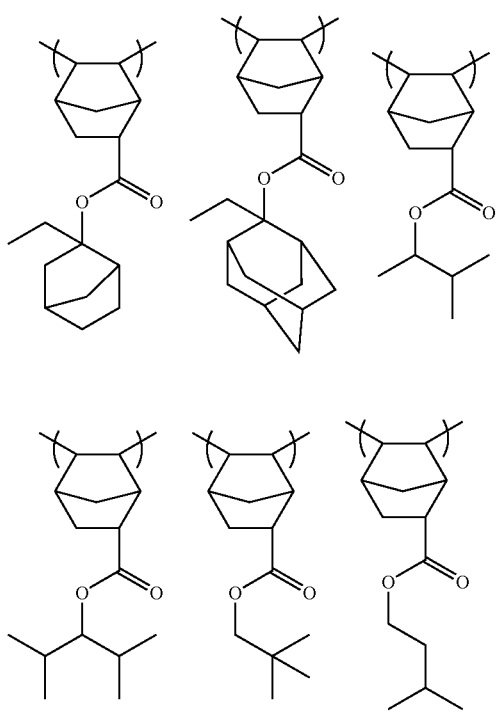
Moreover, it is possible to copolymerize a repeating unit having a carboxyl group, so as to increase a dissolving verocity in alkali. Examples of the repeating unit having a carboxyl group include the following.
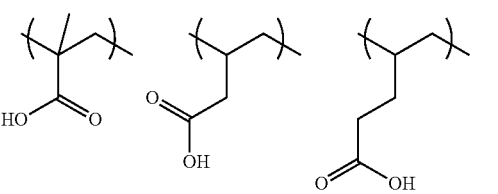
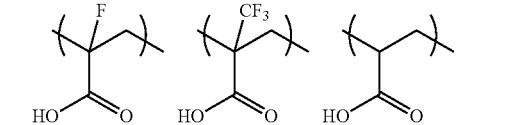
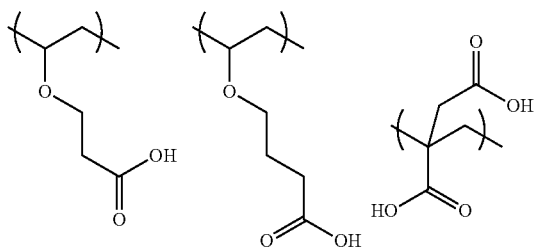
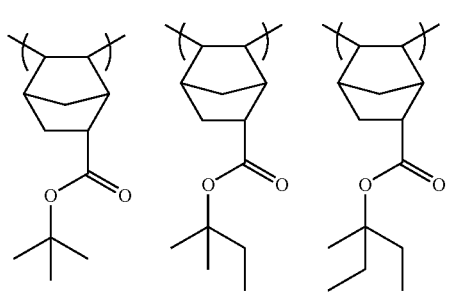
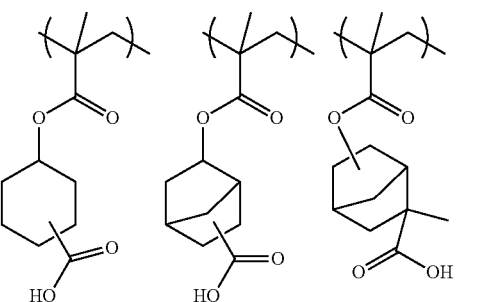

-continued

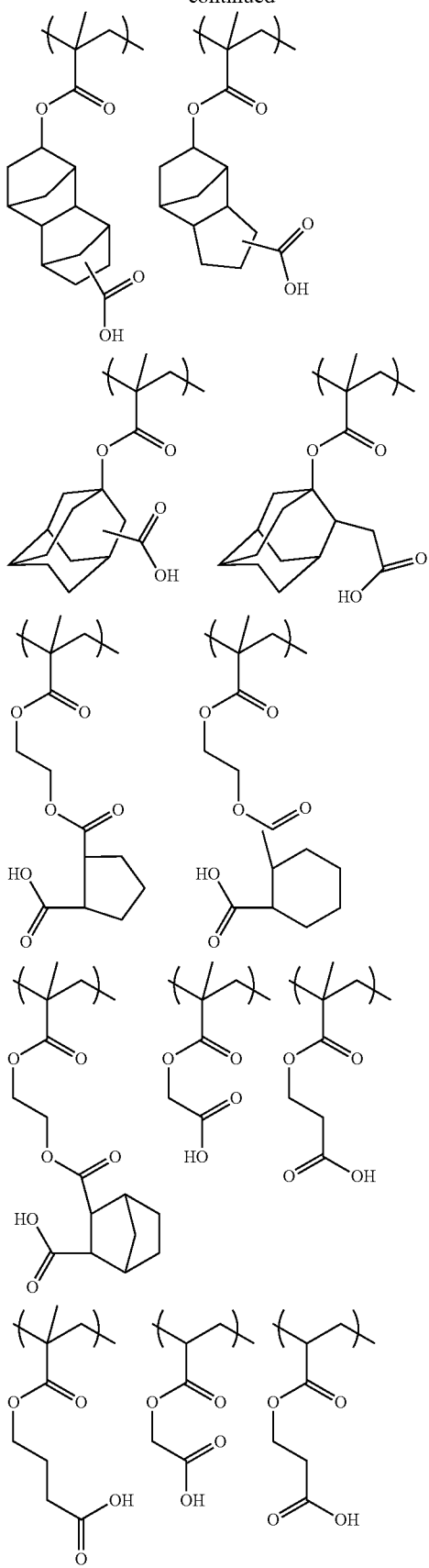

In the present invention, it is preferable to include the same repeating unit a in the polymer II as those in the polymer I. Namely, (A) a copolymer including the repeating unit a and one or more repeating unit selected from repeating units c-1, c-2, and d-1, or (B) a copolymer including the repeating unit a and repeating unit c-2 and d-2, in the following general formula (4): is preferable in that the applicable copolymer includes the repeating unit a common to those in the polymer I, so that the copolymer exhibits an improved solubility in an organic solvent and does not cause micro-phase separation when blended into the polymer I. In the liquid immersion oriented top coat of the present invention, the polymers I and II are required to be separated from each other in upper and lower directions of the coating, without causing micro-phase separation in a sea-island structure. To realize such a layered separation, it is preferable that the polymer I and polymer II are configured to have the same repeating unit, and the polymer I additionally has repeating unit high in hydrophobicity and the polymer II additionally has repeating unit high in hydrophilicity, as other copolymerization components. It is thus preferable to use the components a as the repeating unit common to the polymers I and II so as to avoid occurrence of micro-phase separation. Although the repeating unit a exhibit an intermediate property between hydrophobic and hydrophilic, the repeating unit b are higher in hydrophobicity than the repeating unit a. Further, repeating unit c-1, c-2, d-1, and d-2 are hydrophilic ones. In this way, the polymer II, which is (A) the copolymer including the repeating unit a and one or more repeating unit selected from repeating units c-1, c-2, and d-1, or (B) the copolymer including the repeating unit a and repeating unit c-2 and d-2, is preferably promoted in mixing with the polymer I and can be dissolved in the same solvent therefor. This enables achievement of two-layered separation such that the polymer I migrates into an upper layer in the top coat and the polymer II migrates into a lower layer in the top coat, after spin coating.

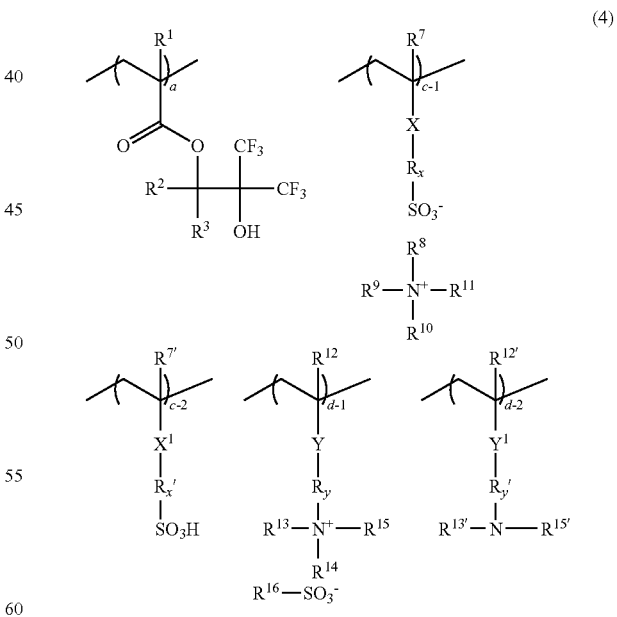

(4)

(in the formula,
$R^1$ to $R^{16}$, $R^{7'}$, $R^{12'}$, $R^{13'}$, $R^{15'}$, X, Y, $X^1$, $Y^1$, $R_x$, $R_y$, $R_x'$, and $R_y'$ are the same as the above;
wherein $0<a<1$, $0 \leq (c-1)<1$, $0 \leq (c-2)<1$, $0 \leq (d-1)<1$, $0 \leq (d-2)<1$, $0<(c-1)+(c-2)+(d-1)+(d-2)<1$, and when $0<(d-2)$, $0<(c-2)$).

Further, the polymer I to be used in the resist top coat composition of the present invention is preferably high in water repellency. The polymer II has sulfonic acid or an amine salt of a sulfonic acid, and thus higher in hydrophilicity than the polymer I. When the polymers I and II are blended into a solution and spin coated, the polymer having a higher water repellency is oriented at an obverse surface side. To cause the polymer I to have a higher obverse surface orientation ability, it is preferable to enhance hydrophobicity of the polymer I, which also leads to an improved water sliding property.

The repeating unit a in the present invention are excellent in solubility in alkali, and exhibit water repellency. In turn, although the repeating unit b, and those repeating units having a fluoroalkyl group, an alkyl group, a norbornene, and a norbornadiene, are lacking or low in solubility in alkali, they are excellent in water repellency and water sliding property. Although alkali solubility is typically lowered by increased water repellency, water sliding property, and the like, the copolymerization of the former and latter repeating unit enables simultaneous establishment of improved water sliding property and alkali solubility.

Meanwhile, the polymer II including a repeating unit having a sulfonic acid or an amine salt of a sulfonic acid is high in hydrophilicity, and thus has such a function to be oriented at a resist-facing side of the resist top coat after spin coating to thereby change a resist surface into hydrophilic after development, in a manner to exemplarily bring about a rectangular resist pattern profile and increase a bridge margin. The polymer II is required to have a higher hydrophilicity so as to be oriented at the resist-facing side, and therefore, the polymer II preferably has, as many as possible, amine salts of sulfonic acids such as the repeating unit c-1 or d-1, and sulfonic acids of the repeating unit c-2, as well as amine salts of sulfonic acids of coexisting repeating unit c-2 and d-2. Only, excessive repeating unit of amine salts of sulfonic acids may exemplarily lead to: a lowered solubility in solvent; occurrence of "T-top" profile of resist pattern after development, in case of increased basicity of amines; and unfeasibility of mixing with the polymer I. Thus, in case of adopting the polymer II based on copolymerization of the above-mentioned repeating unit a with repeating unit c-1 or d-1, it is required to appropriately optimize a copolymerization ratio among repeating unit having a sulfo group represented by c-2 and those having a carboxyl group, in addition to the repeating unit a and repeating unit c-1 or d-1.

When the polymer II including the repeating unit having a sulfonic acid or an amine salt of a sulfonic acid is a copolymer including the repeating unit a and c-2 in the general formula (4), the polymer II has a higher acidity to progress deprotection of acid labile groups near a surface of a resist during PEB, in a manner to cause film loss at the resist film surface to thereby increase hydrophilicity of the surface and to mitigate bridge defects and blob defects. However, this may rather cause a problem that a required etching resistance cannot be ensured due to the film loss at the top of line patterns. In this situation, there is conducted adjustment for decreasing the amount of repeating unit c-2.

When the polymer II including the repeating unit having a sulfonic acid or an amine salt of a sulfonic acid is a copolymer including the repeating unit c-1 or d-1 having an amine salt of sulfonic acid in the general formula (4), this polymer II exhibits an effect to prevent film loss of a resist top. Further, amine salts of sulfonic acids bring about higher hydrophilicity than sulfonic acids, so that the polymer II is more strongly oriented at a resist-facing side of the resist top coat when the polymer II is blended with the water repellent polymer I and dissolved in a solvent and then spin coated. At this time, the highly water repellent polymer I is more strongly oriented at an obverse surface side of the resist top coat, thereby further emphasizing a layered separation in the depth-wise direction of the coating. This allows for an enhanced water repellency at the obverse surface of the top coat, while enhancing hydrophilicity of the resist-side surface of the top coat.

As an amine for forming an amine salt, it is situationally possible to add a small amount of tertiary alkylamine as strong amine having a higher amine strength, or to add an amine derived from amino acid as weak base having a lower amine strength. Although addition of strong amine having a higher basicity is effective for improving rectangularity of resist pattern profiles, this is accompanied by a risk of occurrence of bridge defects, blob defects, and the like. In turn, although addition of amine as weak base has a lower effect for improving resist patterns, this is less in risk of causing bridge defects, blob defects, and the like. It is thus required to add a decreased amount of strong amine and an increased amount of weak base, to thereby achieve rectangular resist profiles after development.

In this way, it becomes possible to constitute a resist top coat for liquid immersion exposure, which achieves resist pattern profiles having higher rectangularity without occurrence of bridge defects and blob defects, by virtue of adjustment of basicity strength and addition amount of amine to be added.

In case of synthesizing the polymers of the present invention, it is possible to adopt typical polymerization methods such as radical copolymerization using an initiator such as 2,2'-azobisisobutyronitrile (hereinafter abbreviated to "AIBN"), and ionic polymerization (anionic polymerization) using alkyllithium or the like, and these polymerization methods can be performed according to usual manners therefor. In case of the polymers of the present invention, production thereof is preferably conducted by radical polymerization, and polymerization conditions are governed by kinds of initiators, temperatures, pressures, concentrations, solvents, additives, and the like.

Examples of radical polymerization initiators include, without particularly limited thereto: azo-based compounds such as AIBN, 2,2'-azobis(4-methoxy-2,4-dimethyl valeronitrile), 2,2'-azobis(2,4-dimethyl valeronitrile), 2,2'-azobis(2,4,4-trimethylpentane), dimethyl-2,2'-azobis(isobutyrate); peroxide-based compounds such as tert-butyl peroxipivalate, lauroyl peroxide, benzoyl peroxide, tert-butyl peroxy laurate; water-soluble polymerization initiators such as potassium persulfate; and redox-type initiators such as based on a combination of peroxide like potassium persulfate or hydrogen peroxide with a reducing agent like sodium sulfite. Although usage amounts of polymerization initiators may be appropriately changed depending on kinds thereof, polymerization conditions, and the like, it is typical to use an amount of 0.001 to 10 mol %, particularly 0.01 to 5 mol % relative to a total amount of monomers to be polymerized.

Further, in case of synthesizing the polymers of the present invention, it is possible to combiningly use known chain transfer agents such as dodecyl mercaptan, 2-mercapto ethanol, or the like for adjusting molecular weights. In that case, addition amounts of these chain transfer agents are each preferably 0.01 to 10 mol % relative to the total number of moles of monomers to be polymerized.

In case of synthesizing the polymers of the present invention, it is possible to use a solvent as required. Solvents for polymerization are preferably those which do not obstruct polymerization reactions, and representative and usable examples thereof include: esters such as ethyl acetate, n-butyl acetate, and γ-butyrolactone; ketones such as acetone, methyl ethyl ketone, and methyl isobutyl ketone; aliphatic or aromatic hydrocarbons such as toluene, xylene, and cyclohexane; alcohols such as isopropyl alcohol, and ethylene glycol monomethyl ether; and ether type solvents such as diethyl ether, dioxane, and tetrahydrofuran. These solvents may be used solely in one kind, or mixedly in two or more kinds. Usage amounts of solvents for polymerization can be appropriately changed commensurately with polymerization conditions such as targeted degree of polymerization (molecular weights), addition amounts of initiators, and polymerization temperatures, and solvents are typically added in a manner that concentrations of monomers to be polymerized are each made to be 0.1 to 95 mass %, particularly 5 to 90 mass %.

Reaction temperatures of polymerization reactions are appropriately changed correspondingly to kinds of polymerization initiators or boiling points of solvents, and are typically and preferably 20 to 200° C., and particularly preferably 40 to 140° C. Reaction vessels to be used for such polymerization reactions are not particularly limited.

Any known methods can be used to remove an organic solvent or water as a medium from a solution or dispersion of the thus obtained polymers, and examples thereof include reprecipitation filtration, or heated distillation under reduced pressure.

In case of the polymers of the present invention, mass-average molecular weights (Mw) of 1,000 or more are preferable, because mixing with a resist material and dissolution in water are rarely caused then. Further, mass-average molecular weights of 500,000 or less are preferable, because problems of coating-forming ability after spin coating and possibilities of deteriorated solubility in alkali are rarely caused then. From these standpoints, mass-average molecular weights are preferably 1,000 to 500,000, and particularly preferably 2,000 to 30,000, as determined relative to polystyrene standards by gel permeation chromatography (GPC).

Supposing that the total number of moles of monomers is U1 in the polymer I of the present invention, it is desirable that $0<a/U1\leq1.0$, $0\leq b/U1<1.0$, and $0.3\leq(a+b)/U1\leq1.0$; preferably, $0.1<a/U1\leq1.0$, $0<b/U1\leq0.9$, and $0.4\leq(a+b)/U1\leq1.0$; and more preferably $0.2\leq a/U1\leq1.0$, $0\leq b/U1\leq0.8$, and $0.5\leq(a+b)/U1\leq1.0$.

Further, supposing that the total number of moles of monomers is U2 in the polymer II of the present invention, it is desirable that $0<a/U2<1.0$, $0\leq(c-1)/U2<1.0$, $0\leq(c-2)/U2<1.0$, $0\leq(d-1)/U2<1.0$, $0\leq(d-2)/U2<1.0$, and $0.01\leq((c-1)+(c-2)+(d-1)+(d-2))/U2\leq0.9$; preferably, $0.1\leq a/U2\leq0.99$, $0\leq(c-1)/U2\leq0.9$, $0\leq(c-2)/U2\leq0.9$, $0\leq(d-1)/U2\leq0.9$, $0\leq(d-2)/U2\leq0.9$, and $0.02\leq((c-1)+(c-2)+(d-1)+(d-2))/U2\leq0.9$; and more preferably, $0.2\leq a/U2\leq0.95$, $0\leq(c-1)/U2\leq0.8$, $0\leq(c-2)/U2\leq0.8$, $0\leq(d-1)/U2\leq0.8$, $0\leq(d-2)/U2\leq0.8$, and $0.02\leq((c-1)+(c-2)+(d-1)+(d-2))/U2\leq0.8$.

In the present invention, the blending ratio between the polymer I and polymer II is preferably $0<II/I<1.0$, more preferably $0.05\leq II/I\leq0.6$, and particularly preferably $0.10\leq II/I\leq0.5$, in weight ratio.

In this way, the present invention aims at blending a polymer I having hexafluoroalcohol groups higher in water repellency with a polymer II having sulfonic acids or amine salts of sulfonic acids higher in hydrophilicity, to form a resist top coat configured to locate the highly water repellent polymer I at an obverse surface of the resist top coat and the highly hydrophilic polymer II having sulfonic acids or amine salts of sulfonic acids at a resist-side surface of the resist top coat, after formation of the coating by spin coating. The highly water repellent polymer is oriented at the obverse surface to achieve an improved water sliding property and a waterproof property for preventing permeation of water, while the resist-side surface is improved in hydrophilicity to enable avoidance of blob defects after development.

In case of adoption of a polymer having sulfo groups as the highly hydrophilic polymer, there is caused migration of a basic quencher from a resist layer into the top coat layer in a manner that the quencher concentration at the outermost obverse surface of the resist becomes insufficient in quencher concentration such that deprotection reaction during bake at the outermost obverse layer of resist progresses to cause film loss of resist patterns after development. Film loss of resist patterns leads to deteriorated etching resistance, and is thus undesirable. However, when amine salts of sulfonic acids are adopted as the hydrophilic polymer II, amine compounds are already present in the top coat layer, so that migration of amine quenchers from a resist layer into the top coat layer is rarely caused. This enables obtainment of rectangular resist pattern profiles.

While the polymers of the present invention can be preferably used as a base polymer of a top coat composition for liquid immersion lithography, it is also possible to mix therewith other polymers for the purpose of altering the top coat in mechanical property, thermal property, solubility in alkali, water repellency, water sliding property, and other physical properties. At that time, although ranges of polymers to be mixed are not particularly limited, the polymer can be mixed with known polymers or the like intended for resist or top coat in arbitrary ranges.

The resist top coat composition of the present invention is preferably used in a manner to dissolve the polymers in a solvent. In this case, it is preferable to use the solvent so that the concentration of the polymers becomes 0.1 to 20 mass %, particularly 0.5 to 10 mass %, from a standpoint of coating-forming ability by spin coating.

Although solvents to be used are not particularly limited, it is preferable to use one, which does not dissolve the resist layer. Examples of solvents, which do not dissolve the resist layer include nonpolar solvents such as higher alcohols having 4 or more carbon atoms, toluene, xylene, anisole, hexane, cyclohexane, decane, and ether compounds. Particularly, higher alcohols having 4 or more carbon atoms, ether compounds having 8 to 12 carbon atoms are preferably used, and concrete examples thereof include, without limited thereto, 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, cyclohexanol, diisopropyl ether, di-n-butyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, di-n-hexyl ether, and the like; and these can be used solely in one kind, or mixedly in two or more kinds.

The water repellent polymer I is apt to dissolve in ether-based solvents. Contrary, although the hydrophilic polymer II certainly dissolves in ether-based solvents, it is rather apt to dissolve in alcohol-based solvents. It is thus desirable to combine an ether-based solvent with an alcohol-based solvent, to ensure solubilities of both polymers.

Meanwhile, fluorinated solvents can also be used, because they do not dissolve resist layers. Examples of such fluorinated solvents include, without limited thereto, 2-fluoroanisole, 3-fluoroanisole, 4-fluoroanisole, 2,3-difluoroanisole, 2,4-difluoroanisole, 2,5-difluoroanisole, 5,8-difluoro-1,4-benzodioxane, 2,3-difluorobenzyl alcohol, 1,3-difluoro-2-propanol, 2',4'-difluoropropiophenone, 2,4-difluorotoluene, trifluoroacetaldehyde ethyl hemiacetal, trifluoroacetamide, trifluoroethanol, 2,2,2-trifluoroethyl butyrate, ethyl heptafluorobutyrate, ethyl heptafluorobutylacetate, ethyl hexafluoroglutarylmethyl, ethyl 3-hydroxy-4,4,4-trifluorobutyrate, ethyl 2-methyl-4,4,4-trifluoroacetoacetate, ethyl pentafluorobenzoate, ethyl pentafluoropropionate, ethyl pentafluoropropynylacetate, ethyl perfluorooctanoate, ethyl 4,4,4-trifluoroacetoacetate, ethyl 4,4,4-trifluorobutyrate, ethyl 4,4,4-trifluorocrotonate, ethyl trifluorosulfonate, ethyl 3-(trifluoromethyl)butyrate, ethyl trifluoropyruvate, S-ethyl trifluoroacetate, fluorocyclohexane, 2,2,3,3,4,4,4-heptafluoro-1-butanol, 1,1,1,2,2,3,3-heptafluoro-7,7-dimethyl-4,6-octanedione, 1,1,1,3,5,5,5-heptafluoropentane-2,4-dione, 3,3,4,4,5,5,5-heptafluoro-2-pentanol, 3,3,4,4,5,5,5-heptafluoro-2-pentanone, isopropyl 4,4,4-trifluoroacetoacetate, methyl perfluorodecanoate, methyl perfluoro(2-methyl-3-oxahexanoate), methyl perfluorononanoate, methyl perfluorooctanoate, methyl 2,3,3,3-tetrafluoropropionate, methyl trifluoroacetoacetate, 1,1,1,2,2,6,6,6-octafluoro-2,4-hexanedione, 2,2,3,3,4,4,5,5-octafluoro-1-pentanol, 1H,1H,2H,2H-perfluoro-1-decanol, perfluoro(2,5-dimethyl-3,6-dioxane anionic) acid methyl ester, 2H-perfluoro-5-methyl-3,6-dioxanonane, 1H,1H,2H,3H,3H-perfluorononane-1,2-diol, 1H,1H,9H-perfluoro-1-nonanol, 1H,1H-perfluorooctanol, 1H,1H,2H,2H-perfluorooctanol, 2H-perfluoro-5,8,11,14-tetramethyl-3,6,9,12,15-pentaoxaoctadecane, perfluorotributylamine, perfluorotrihexylamine, methylester perfluoro-2,5,8-trimethyl-3,6,9-trioxadodecanoate, perfluorotripentylamine, perfluorotripropylamine, 1H,1H,2H,3H,3H-perfluoroundecane-1,2-diol, trifluorobutanol, 1,1,1-trifluoro-5-methyl-2,4-hexanedione, 1,1,1-trifluoro-2-propanol, 3,3,3-trifluoro-1-propanol, 1,1,1-trifluoro-2-propyl acetate, perfluoro-butyl-tetrahydrofuran, perfluorodecalin, perfluoro(1,2-dimethylcyclohexane), perfluoro(1,3-dimethylcyclohexane), propylene glycol trifluoromethyl ether acetate, propylene glycol methyl ether trifluoromethyl acetate, butyl trifluoromethylacetate, methyl 3-trifluoromethoxypropionate, perfluorocyclohexanone, propylene glycol trifluoromethyl ether, butyl trifluoroacetate, 1,1,1-trifluoro-5,5-dimethyl-2,4-hexanedione, 1,1,1,3,3,3-hexafluoro-2-propanol, 1,1,1,3,3,3-hexafluoro-2-methyl-2-propanol, 2,2,3,4,4,4-hexafluoro-1-butanol, 2-trifluoromethyl-2-propanol, 2,2,3,3-tetrafluoro-1-propanol, 3,3,3-trifluoro-1-propanol, and 4,4,4-trifluoro-1-butanol; and these can be used solely in one kind, or mixedly in two or more kinds.

There will be now explained a patterning process adopting the resist top coat (upperlying film) of the present invention, which is water-insoluble and alkali-soluble. The patterning process in the present invention preferably comprises, at least, the steps of: forming a photoresist film on a substrate; forming, on the photoresist film, a resist top coat by using the above-described resist top coat composition; exposing the substrate; and developing the substrate with a developer.

In the patterning process of the present invention, there is firstly formed a resist top coat (upperlying film), which is water-insoluble and alkali-soluble, on a photoresist layer, such as by spin coating. The coating thickness is preferably within the range of 10 to 500 nm.

Although the exposing step is preferably conducted by liquid immersion lithography in which a gap between the resist top coat and a projection lens is filled with a liquid, without limited thereto, exposure may be dry exposure in an atmosphere of air or nitrogen or exposure in vacuum such as by EB and EUV. In case of liquid immersion exposure, it is preferable to use a light source having an exposing wavelength in the range of 180 to 250 nm, and to use water as the liquid to be interposed between the top coat and the lens.

In liquid immersion exposure, importance is given to conduction or omission of cleaning of an edge or reverse surface of a wafer and to a cleaning technique, so as to prevent water from getting through to the reverse surface and to avoid the leaching from the substrate. For example, it is sometimes conducted to bake the resist top coat at a temperature in the range of 40 to 130° C. for 10 to 300 seconds after spin coating, to volatilize the solvent. Further, edge cleaning to be conducted upon formation of a resist film by dry exposure, is sometimes undesirable in liquid immersion exposure, because water may be then left at an edge portion of the hydrophilic substrate surface. As such, edge cleaning is sometimes omitted, upon spin coating of a resist top coat.

To decrease a dispensing amount of resist material in spin coating, there has been proposed a method to coat a resist material onto a substrate in a state that the substrate is wetted with a resist solvent or a solution mixable with a resist solvent (JP9-246173A). This method is also applicable to spin coating of a resist top coat, in such a manner to previously wet a resist film surface with a solvent, followed by application of a resist top coat thereon, to allow for decrease of a dispensing amount of a top coat composition. Examples of methods for wetting a resist surface include spin coating method and vapor prime method, and the spin coating method is typically used. Solvents to be used then can be selected from among the above-described higher alcohols, ether-based and fluorinated solvents, which do not dissolve a resist.

After forming the resist top coat on the resist layer, exposure is conducted by KrF light or ArF light within water. Further, after conduction of exposure, post-exposure bake (PEB) is conducted. Upon conduction of PEB, possible residual water on the resist top coat will pass through the top coat during PEB. As a result, acids in the resist are sometimes sucked up, to fail to form a pattern. To avoid such a situation, it is required to completely remove water on the top coat before PEB. Examples of methods therefor include a spin-drying method, a method for purging a top coat surface by dry air or nitrogen, and a method for optimizing a water recovering nozzle shape on a stage or optimizing a water recovery process. For water separation, it is also effective to design and utilize a material excellent in water repellency and water sliding property, such as the polymers of the present invention.

After conducting PEB, development is conducted by an alkaline developer for 10 to 300 seconds. Typically and widely used as the alkaline developer is an aqueous solution of 2.38 mass % tetramethylammonium hydroxide. Since the resist top coat composition of the present invention exhibits solubility in alkali, it is possible to conduct separation of the resist top coat simultaneously with conduction of development. In this way, it is desirable in the present invention to strip a resist top coat on a photoresist film, simultaneously with conduction of development by an alkaline developer to form a resist pattern on the photoresist film.

In the patterning process adopting the resist top coat composition of the present invention, underlying resist materials are not particularly limited. Types of resists may be either positive or negative. Also usable are a typical single-layered resist material based on hydrocarbon, and a double-layered (multi-layered) resist material containing silicon atoms or the like.

Desirably usable as a resist material in KrF exposure is a polymer, which is obtained by substituting part or whole of hydrogen atoms of hydroxyl groups or carboxyl groups in polyhydroxystyrene or polyhydroxystyrene-(meth)acrylate copolymer as a base resin, with acid labile groups, respectively.

Resist materials in ArF exposure are desirably those structures including no aromatics as base resins, and desirably usable concrete examples include one kind or two or more kinds of polymers selected from: copolymers of (meth) acrylic acid derivatives; alternating copolymers of norbornene derivatives and maleic anhydride; copolymers of norbornene derivatives, maleic anhydride, and (meth)acrylic acid derivatives; alternating copolymers of tetracyclododecene derivatives and maleic anhydride; copolymers of tetracyclododecene derivatives, maleic anhydride, and (meth)acrylic acid derivatives; alternating copolymers of norbornene derivatives and maleimide derivatives; copolymers of norbornene derivatives, maleimide derivatives, and (meth) acrylic acid derivatives; alternating copolymers of tetracyclododecene derivatives and maleimide derivatives; copolymers of tetracyclododecene derivatives, maleimide derivatives, and (meth)acrylic acid derivatives; polynorbornene derivatives; and ring-opening metathesis polymers. Although it has been previously impossible to use, as an ArF resist, repeating unit including aromatic rings having absorption at 193 nm wavelength, influence of absorption has been mitigated by virtue of decreased film thickness of resist. It is rather conceivable to positively utilize aromatic rings having absorption, so as to restrict increased reflection from a substrate by oblique incident light due to NAs' of projection lens exceeding 1, and it is possible to copolymerize: hydroxylvinyl naphthalene, vinyl naphthalene, and acenaphthylene, having a naphthalene ring; methacrylate having a pendant naphthol; hydroxystyrene; methacrylate having a pendant naphthol; fluorinated hydroxystyrene; fluoroalkyl hydroxystyrene; fluorinated styrene; fluoroalkyl styrene; hexafluoro-isopropanol styrene; hexafluoro-isopropanol indene, and the like.

Further, the present invention can also provide a patterning process by lithography, comprising the steps of:

forming a top coat by using the resist top coat composition of the present invention as an upperlying resist film composition, on a photoresist layer formed on a mask blanks;

exposing the mask blanks in vacuum, with electron beam; and subsequently developing the mask blanks.

Mainly used as fundamental resins of resist materials for mask blanks are novolak, hydroxystyrene, or the like. These resins are used as positive types and negative types, by substituting alkali-soluble hydroxyl groups of the resins with acid labile groups, and by adding crosslinking agents to the resins, respectively. Concretely and desirably used are polymers obtained by copolymerizing hydroxystyrene, with (meth)acryl derivatives, styrene, vinyl naphthalene, vinyl anthracene, vinyl pyrene, hydroxyvinyl naphthalene, hydroxyvinyl anthracene, indene, hydroxyindene, acenaphthylene, norbornadienes, coumarone, chromone, or the like.

When the polymer of the present invention is used as a resist top coat for mask blanks, the resist top coat is desirably formed after application of a photoresist onto a mask blanks substrate such as made of $SiO_2$, Cr, CrO, CrN, or MoSi. It is also possible to form a three-layer structure, by forming an SOG film and an underlying organic film between a photoresist and a blank substrate. After forming a resist top coat, the photoresist is desirably exposed to electron beam in vacuum by using an electron beam writing unit, and after exposure, post-exposure bake (PEB) is conducted, followed by development by alkaline developer for 10 to 300 seconds.

EXAMPLES

The present invention will be concretely explained by describing Examples and Comparative Examples, without limited to the Examples. Note that the abbreviation "GPC" in Examples means gel permeation chromatography, and mass-average molecular weights (Mw) and number-average molecular weights (Mn) of obtained polymers are measured as values determined relative to polystyrene standards.

Shown below are structural formulae of monomers (Monomer 1 to Monomer 23) used in polymer synthesis examples:

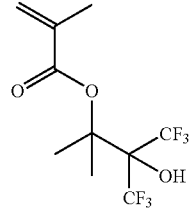

Monomer 1

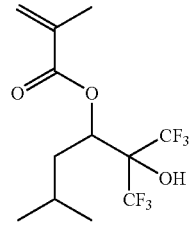

Monomer 2

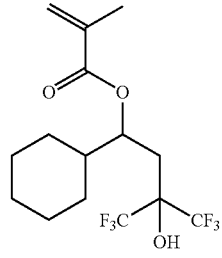

Monomer 3

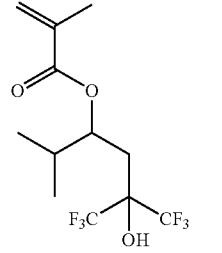

Monomer 4

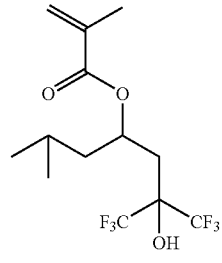

Monomer 5

-continued
Monomer 6
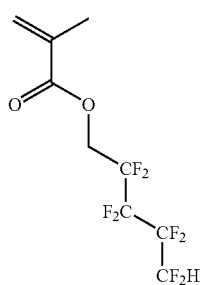
Monomer 7
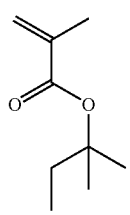
Monomer 8
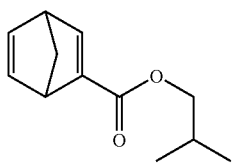
Monomer 9
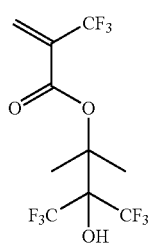
Monomer 10
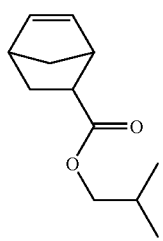
Monomer 11
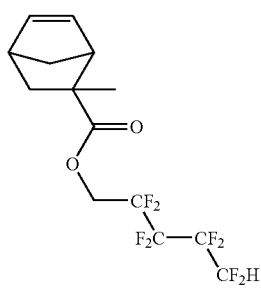
-continued
Monomer 12
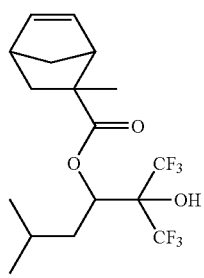
Monomer 13
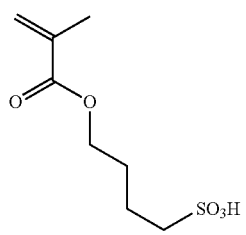
Monomer 14
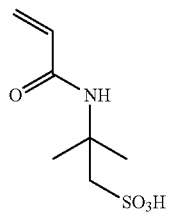
Monomer 15
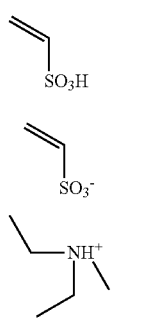
Monomer 16
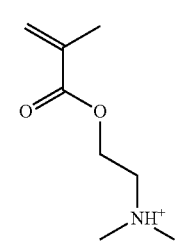
Monomer 17
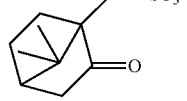
Monomer 18
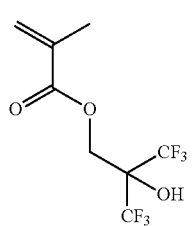

-continued

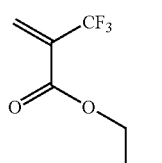
Monomer 19

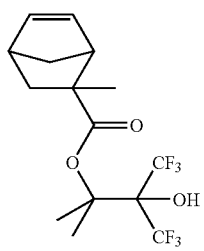
Monomer 20

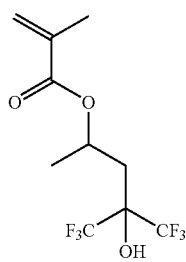
Monomer 21

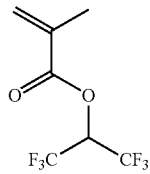
Monomer 22

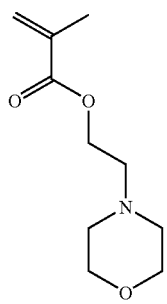
Monomer 23

Polymer Synthesis Example 1

Copolymerization of Monomer 1 and Monomer 2 (0.2/0.8)

Delivered into a flask in nitrogen ambient were 19.6 g of Monomer 1, 85.8 g of Monomer 2, 3.74 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 1). As a result of $^1$H-NMR analysis of a composition of the resin, the composition ratio of Monomer 1 and Monomer 2 in the copolymer was 20/80 in mol %. Further, as a result of conduction of GPC measurement of the obtained copolymer, its mass-average molecular weight (Mw) determined relative to polystyrene standards was 9,400, and the dispersity (Mw/Mn) was 1.72.

Polymer Synthesis Example 2

Copolymerization of Monomer 1 and Monomer 3 (0.8/0.2)

Delivered into a flask in nitrogen ambient were 78.4 g of Monomer 1, 24.1 g of Monomer 3, 3.82 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 2). As a result of $^1$H-NMR analysis of a composition of the resin, the composition ratio of Monomer 1 and Monomer 3 in the copolymer was 80/20 in mol %. Further, as a result of conduction of GPC measurement of the obtained copolymer, its mass-average molecular weight (Mw) determined relative to polystyrene standards was 9,200, and the dispersity (Mw/Mn) was 1.87.

Polymer Synthesis Example 3

Copolymerization of Monomer 1 and Monomer 4 (0.6/0.4)

Delivered into a flask in nitrogen ambient were 58.8 g of Monomer 1, 42.9 g of Monomer 4, 3.84 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 3). As a result of $^1$H-NMR analysis of a composition of the resin, the composition ratio of Monomer 1 and Monomer 4 in the copolymer was 59/41 in mol %. Further, as a result of conduction of GPC measurement of the obtained copolymer, its mass-average molecular weight (Mw) determined relative to polystyrene standards was 9,500, and the dispersity (Mw/Mn) was 1.77.

Polymer Synthesis Example 4

Polymerization of Monomer 2 (1.0)

Delivered into a flask in nitrogen ambient were 107.3 g of Monomer 2, 3.87 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 4). As a result of $^1$H-NMR analysis of a composition of the resin, the composition ratio of Monomer 2 in the polymer was 100 in mol %. Further, as a result of conduction of GPC measurement of the obtained polymer, its mass-average molecular weight (Mw) determined relative to polystyrene standards was 9,300, and the dispersity (Mw/Mn) was 1.6.

Polymer Synthesis Example 5

Copolymerization of Monomer 1 and Monomer 5 (0.7/0.3)

Delivered into a flask in nitrogen ambient were 68.6 g of Monomer 1, 33.6 g of Monomer 5, 3.80 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 5). As a result of $^1$H-NMR analysis of a composition of the resin, the composition ratio of Monomer 1 and Monomer 5 in the copolymer was 70/30 in mol %. Further, as a result of conduction of GPC measurement of the obtained copolymer, its mass-average molecular weight (Mw) determined relative to polystyrene standards was 8,700, and the dispersity (Mw/Mn) was 1.76.

Polymer Synthesis Example 6

Copolymerization of Monomer 1 and Monomer 6 (0.8/0.2)

Delivered into a flask in nitrogen ambient were 78.4 g of Monomer 1, 20.0 g of Monomer 6, 3.85 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 6). As a result of $^1$H-NMR analysis of a composition of the resin, the composition ratio of Monomer 1 and Monomer 6 in the copolymer was 79/21 in mol %. Further, as a result of conduction of GPC measurement of the obtained copolymer, its mass-average molecular weight (Mw) determined relative to polystyrene standards was 9,100, and the dispersity (Mw/Mn) was 1.65.

Polymer Synthesis Example 7

Copolymerization of Monomer 1 and Monomer 7 (0.7/0.3)

Delivered into a flask in nitrogen ambient were 68.6 g of Monomer 1, 15.6 g of Monomer 7, 3.85 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 7). As a result of $^1$H-NMR analysis of a composition of the resin, the composition ratio of Monomer 1 and Monomer 7 in the copolymer was 71/29 in mol %. Further, as a result of conduction of GPC measurement of the obtained copolymer, its mass-average molecular weight (Mw) determined relative to polystyrene standards was 8,700, and the dispersity (Mw/Mn) was 1.69.

Polymer Synthesis Example 8

Copolymerization of Monomer 1 and Monomer 8 (0.7/0.3)

Delivered into a flask in nitrogen ambient were 68.6 g of Monomer 1, 22.4 g of Monomer 8, 3.85 g of dimethyl 2,2'-azobis(isobutyrate), and 60.0 g of isopropyl alcohol, to prepare a monomer solution, and the solution temperature was kept at 20 to 25° C. Delivered into another flask in nitrogen ambient was 20.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 8). As a result of $^1$H-NMR analysis of a composition of the resin, the composition ratio of Monomer 1 and Monomer 8 in the copolymer was 73/27 in mol %. Further, as a result of conduction of GPC measurement of the obtained copolymer, its mass-average molecular weight (Mw) determined relative to polystyrene standards was 5,700, and the dispersity (Mw/Mn) was 1.69.

Polymer Synthesis Example 9

Copolymerization of Monomer 9 and Monomer 10 (0.67/0.33)

Delivered into a flask in nitrogen ambient were 87.0 g of Monomer 9, 19.4 g of Monomer 10, 3.85 g of dimethyl 2,2'-azobis(isobutyrate), and 20.0 g of isopropyl alcohol, to prepare a monomer solution, and the solution temperature was kept at 20 to 25° C. Delivered into another flask in nitrogen ambient was 20.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 9). As a result of $^1$H-NMR analysis of a composition of the resin, the composition ratio of Monomer 9 and Monomer 10 in the copolymer was 67/33 in mol %. Further, as a result of conduction of GPC measurement of the obtained copolymer, its mass-average molecular weight (Mw) determined relative to polystyrene standards was 5,100, and the dispersity (Mw/Mn) was 1.65.

Polymer Synthesis Example 10

Copolymerization of Monomer 9 and Monomer 11 (0.67/0.33)

Delivered into a flask in nitrogen ambient were 87.0 g of Monomer 9, 40.2 g of Monomer 11, 3.85 g of dimethyl 2,2'-azobis(isobutyrate), and 20.0 g of isopropyl alcohol, to prepare a monomer solution, and the solution temperature was kept at 20 to 25° C. Delivered into another flask in nitrogen ambient was 20.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 10). As a result of $^1$H-NMR analysis of a composition of the resin, the composition ratio of Monomer 9 and Monomer 11 in the copolymer was 67/33 in mol %. Further, as a result of conduction of GPC measurement of the obtained copolymer, its mass-average molecular weight (Mw) determined relative to polystyrene standards was 4,700, and the dispersity (Mw/Mn) was 1.57.

Polymer Synthesis Example 11

Copolymerization of Monomer 9 and Monomer 12 (0.67/0.33)

Delivered into a flask in nitrogen ambient were 87.0 g of Monomer 9, 42.7 g of Monomer 12, 3.85 g of dimethyl 2,2'-azobis(isobutyrate), and 20.0 g of isopropyl alcohol, to prepare a monomer solution, and the solution temperature was kept at 20 to 25° C. Delivered into another flask in nitrogen ambient was 20.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 11). As a result of $^1$H-NMR analysis of a composition of the resin, the composition ratio of Monomer 9 and Monomer 12 in the copolymer was 67/33 in mol %. Further, as a result of conduction of GPC measurement of the obtained copolymer, its mass-average molecular weight (Mw) determined relative to polystyrene standards was 5,300, and the dispersity (Mw/Mn) was 1.68.

Polymer Synthesis Example 12

Copolymerization of Monomer 1 and Monomer 13 (0.95/0.05)

Delivered into a flask in nitrogen ambient were 93.1 g of Monomer 1, 3.7 g of Monomer 13, 3.74 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 12). As a result of $^1$H-NMR analysis of a composition of the resin, the composition ratio of Monomer 1 and Monomer 13 in the copolymer was 95/5 in mol %. Further, as a result of conduction of GPC measurement of the obtained copolymer, its mass-average molecular weight (Mw) determined relative to polystyrene standards was 9,600, and the dispersity (Mw/Mn) was 1.83.

Polymer Synthesis Example 13

Copolymerization of Monomer 1 and Monomer 14 (0.95/0.05)

Delivered into a flask in nitrogen ambient were 93.1 g of Monomer 1, 3.5 g of Monomer 14, 3.74 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 13). As a result of $^1$H-NMR analysis of a composition of the resin, the composition ratio of Monomer 1 and Monomer 14 in the copolymer was 95/5 in mol %. Further, as a result of conduction of GPC measurement of the obtained copolymer, its mass-average molecular weight (Mw) determined relative to polystyrene standards was 6,800, and the dispersity (Mw/Mn) was 1.75.

Polymer Synthesis Example 14

Copolymerization of Monomer 1 and Monomer 15 (0.9/0.1)

Delivered into a flask in nitrogen ambient were 88.2 g of Monomer 1, 3.6 g of Monomer 15, 3.74 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 14). As a result of $^1$H-NMR analysis of a composition of the resin, the composition ratio of Monomer 1 and Monomer 15 in the copolymer was 95/5 in mol %. Further, as a result of conduction of GPC measurement of the obtained copolymer, its mass-average molecular weight (Mw) determined relative to polystyrene standards was 6,900, and the dispersity (Mw/Mn) was 1.72.

Polymer Synthesis Example 15

Copolymerization of Monomer 1 and Monomer 16 (0.95/0.05)

Delivered into a flask in nitrogen ambient were 93.1 g of Monomer 1, 3.5 g of Monomer 16, 3.74 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 15). As a result of $^1$H-NMR analysis of a composition of the resin, the composition ratio of Monomer 1 and Monomer 16 in the copolymer was 95/5 in mol %. Further, as a result of conduction of GPC measurement of the obtained copolymer, its mass-average molecular weight (Mw) determined relative to polystyrene standards was 6,600, and the dispersity (Mw/Mn) was 1.70.

Polymer Synthesis Example 16

Copolymerization of Monomer 18 and Monomer 17 (0.9/0.1)

Delivered into a flask in nitrogen ambient were 79.8 g of Monomer 18, 13.0 g of Monomer 17, 3.74 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 16). As a result of $^1$H-NMR analysis of a composition of the resin, the composition ratio of Monomer 18 and Monomer 17 in the copolymer was 90/10 in mol %. Further, as a result of conduction of GPC measurement of the obtained copolymer, its mass-average molecular weight (Mw) determined relative to polystyrene standards was 8,600, and the dispersity (Mw/Mn) was 1.78.

Polymer Synthesis Example 17

Copolymerization of Monomer 1, Methacrylic acid and Monomer 15 (0.7/0.25/0.05)

Delivered into a flask in nitrogen ambient were 68.6 g of Monomer 1, 7.2 g of methacrylic acid, 1.8 g of Monomer 15, 3.84 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 17). As a result of $^1$H-NMR analysis of a composition of the resin, the composition ratio of Monomer 1, methacrylic acid, and Monomer 15 in the copolymer was 70/25/5 in mol %. Further, as a result of conduction of GPC measurement of the obtained copolymer, its mass-average molecular weight (Mw) determined relative to polystyrene standards was 9,300, and the dispersity (Mw/Mn) was 1.82.

Polymer Synthesis Example 18

Copolymerization of Monomer 9, Monomer 19, and Monomer 20 (0.4/0.3/0.3)

Delivered into a flask in nitrogen ambient were 46.0 g of Monomer 9, 19.6 g of Monomer 19, 40 g of Monomer 20, 3.74 g of dimethyl 2,2'-azobis(isobutyrate), and 20.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 18). As a result of $^1$H-NMR analysis of a composition of the resin, the composition ratio of Monomer 9, Monomer 19 and Monomer 20 in the copolymer was 40/30/30 in mol %. Further, as a result of conduction of GPC measurement of the obtained copolymer, its mass-average molecular weight (Mw) determined relative to polystyrene standards was 6,900, and the dispersity (Mw/Mn) was 1.42.

Polymer Synthesis Example 19

Copolymerization of Monomer 1 and Monomer 5 (0.5/0.5)

Delivered into a flask in nitrogen ambient were 48.5 g of Monomer 1, 55.9 g of Monomer 5, 3.80 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 19). As a result of $^1$H-NMR analysis of a composition of the resin, the composition ratio of Monomer 1 and Monomer 5 in the copolymer was 50/50 in mol %. Further, as a result of conduction of GPC measurement of the obtained copolymer, its mass-average molecular weight (Mw) determined relative to polystyrene standards was 8,300, and the dispersity (Mw/Mn) was 1.73.

Polymer Synthesis Example 20

Copolymerization of Monomer 21 and Monomer 15 (0.9/0.1)

Delivered into a flask in nitrogen ambient were 88.1 g of Monomer 21, 3.6 g of Monomer 15, 3.80 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 20). As a result of $^1$H-NMR analysis of a composition of the resin, the composition ratio of Monomer 21 and Monomer 15 in the copolymer was 90/10 in mol %. Further, as a result of conduction of GPC measurement of the obtained copolymer, its mass-average molecular weight (Mw) determined relative to polystyrene standards was 7,800, and the dispersity (Mw/Mn) was 1.83.

Polymer Synthesis Example 21

Copolymerization of Monomer 21 and Monomer 14 (0.9/0.1)

Delivered into a flask in nitrogen ambient were 88.1 g of Monomer 21, 3.6 g of Monomer 15, 3.80 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 21). As a result of $^1$H-NMR analysis of a composition of the resin, the composition ratio of Monomer 21 and Monomer 14 in the copolymer was 90/10 in mol %. Further, as a result of conduction of GPC measurement of the obtained copolymer, its mass-average molecular weight (Mw) determined relative to polystyrene standards was 9,500, and the dispersity (Mw/Mn) was 1.89.

Polymer Synthesis Example 22

Copolymerization of Monomer 21 and Monomer 22 (0.9/0.1)

Delivered into a flask in nitrogen ambient were 88.1 g of Monomer 21, 7.9 g of Monomer 22, 3.80 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 22). As a result of $^1$H-NMR analysis of a composition of the resin, the composition ratio of Monomer 21 and Monomer 22 in the copolymer was 90/10 in mol %. Further, as a result of conduction of GPC measurement of the obtained copolymer, its mass-average molecular weight (Mw) determined relative to polystyrene standards was 9,500, and the dispersity (Mw/Mn) was 1.89.

Polymer Synthesis Example 23

Copolymerization of Monomer 1, Monomer 15, and Monomer 23 (0.9/0.07/0.03)

Delivered into a flask in nitrogen ambient were 88.1 g of Monomer 1, 2.5 g of Monomer 15, 2.0 g of Monomer 23, 3.80 g of dimethyl 2,2'-azobis(isobutyrate), and 100.0 g of isopropyl alcohol, to prepare a monomer solution, and the solution temperature was kept at 20 to 25° C. Delivered into another flask in nitrogen ambient was 50.0 g of isopropyl alcohol, and heated to 80° C. while stirring, followed by exhaustive dropping of the monomer solution over for 4 hours. After dropping, the polymerization solution was continuously stirred for 3 hours while keeping the temperature thereof at 80° C., and cooled to a room temperature after aging. The thus obtained polymerization solution was dropped into 4,000 g of water/methanol mixed solvent (mixing ratio: 7/1), and a separated copolymer was filtered out. The obtained copolymer was washed four times by 600 g of isopropyl ether/hexane mixed solvent (mixing ratio: 9/1), to separate out a white solid. The white solid was vacuum dried at 50° C. for 20 hours, to obtain a targeted polymer (Polymer 23). As a result of $^1$H-NMR analysis of a composition of the resin, the composition ratio of Monomer 1, Monomer 15, and Monomer 23 in the copolymer was 90/7/3 in mol %. Further, as a result of conduction of GPC measurement of the obtained copolymer, its mass-average molecular weight (Mw) determined relative to polystyrene standards was 8,100, and the dispersity (Mw/Mn) was 1.74.

Polymer 1

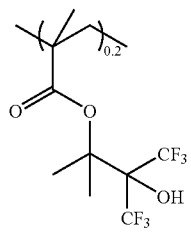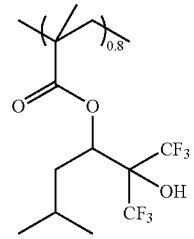

Polymer 2

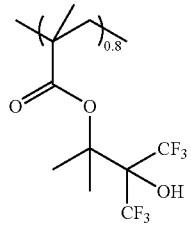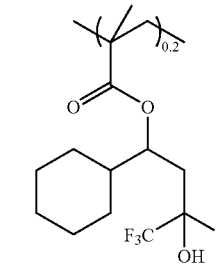

Polymer 3

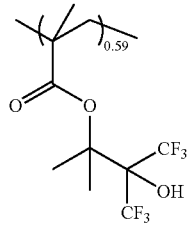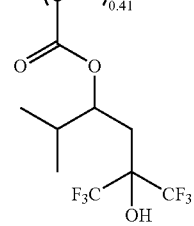

Polymer 4

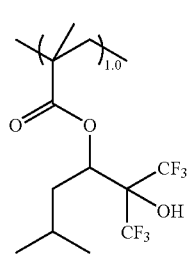

Polymer 5

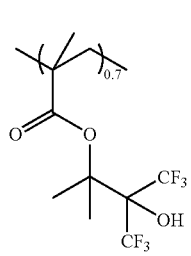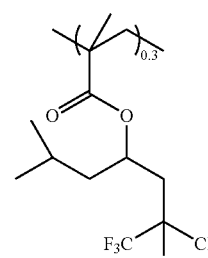

Polymer 6

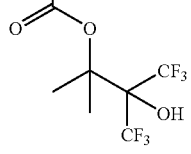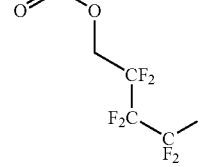

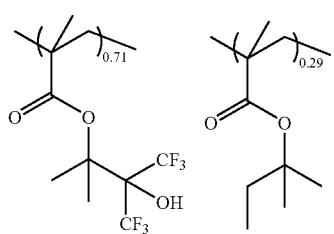
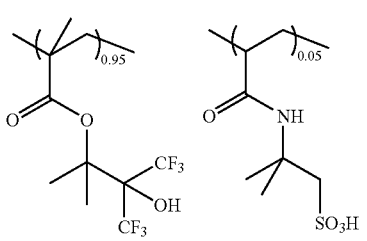
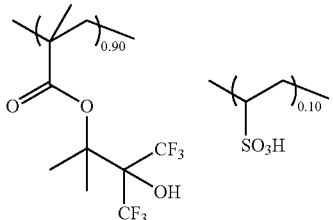
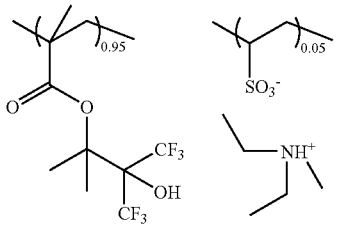
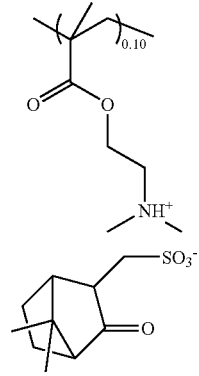
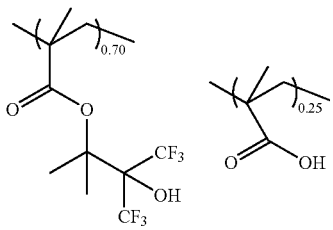
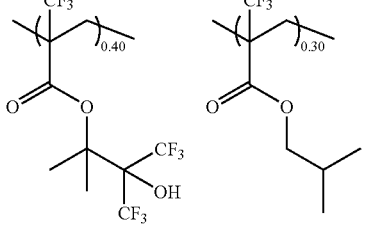

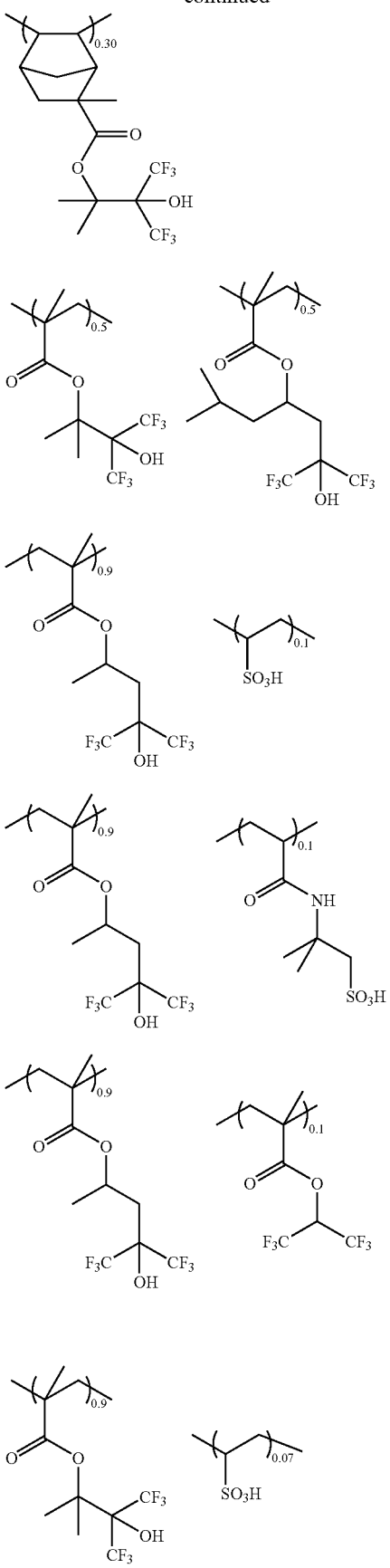

Polymer 20

Polymer 21

Polymer 22

Polymer 23

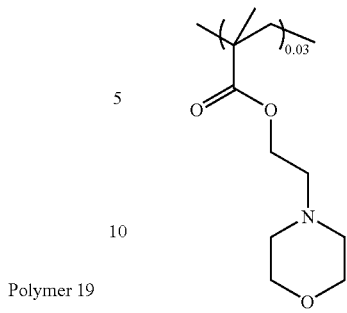

Polymer 19

Examples and Comparative Examples

Polymer 1 to Polymer 23 described in the above polymer synthesis examples were used. Polymers 1 to 11, 18, and 19 were highly water-repellent polymers I, respectively, and Polymers 12 to 17, and 23 were polymers having sulfonic acids or amine salts of sulfonic acids, respectively. Polymers 20 to 22 were polymers for Comparative Examples. The polymers having sulfo groups can be brought into polymers II of amine salts of sulfonic acids, respectively, by addition of amine compounds (Amines 1 to 3) to be described later. Resin components having a weight of 1 g based on a single kind or blend of two or more kinds selected from Polymer 1 to Polymer 23 were each dissolved in a mixed solvent of 23 g of diisopentyl ether and 2 g of 2-methyl-1-butanol, and filtered out by a polypropylene filter of 0.2 micron size, to prepare resist top coat solutions, respectively. Listed in Table 1 and Table 2 are blending ratios in resin components, and mass parts of addition amounts of amine compounds relative to 100 mass parts of resins, respectively.

Firstly, resist top coat solutions were spin coated onto silicon substrates, and baked at 100° C. for 60 seconds to fabricate resist top coats (TC-1 to 25, comparative TC-1 to 7) having 50 nm coating thicknesses, respectively, and refractive indexes of the top coat at wavelength 193 nm were obtained by a spectroscopic ellipsometer (manufactured by J. A. Woollam Co., Inc.). The results are listed in Table 1 and Table 2.

Next, the wafers formed with the resist top coats by the above-described method were rinsed by pure water for 5 minutes, and variances of coating thicknesses were observed, respectively. The results are listed in Table 1 and Table 2.

Further, the wafers formed with the resist top coats by the above-described method were subjected to development by an aqueous solution of 2.38 mass % tetramethylammonium hydroxide (TMAH), and variances of coating thicknesses after development were measured, respectively. The results are listed in Table 1 and Table 2.

Furthermore, the wafers formed with the resist top coats by the above-described method were each kept horizontally, and 50 μL of pure water was dropped thereonto to form a waterdrop, followed by gradual inclination of each wafer by an inclination contact angle meter prop Master 500 (manufactured by Kyowa Interface Science Co., Ltd.), to obtain an angle (sliding angle) of each wafer at which the waterdrop started to slide thereon, and a receding contact angle then. The results are listed in Table 1 and Table 2.

It is seen from Table 1 and Table 2 that each polymer II (comparative TC-2 to 4) exhibits a larger sliding angle and a smaller receding contact angle by itself, and the polymer I (comparative TC-1) exhibits a smaller sliding angle and a larger receding contact angle by itself. Smaller sliding angles desirably lead to promoted flowage of water on top coat, and larger receding contact angles desirably and rarely lead to residual droplets even by high-speed scan exposure. It is seen from Table 1 and Table 2 that the resist top coats TC-1 to 25 of the present invention are relatively less in performance deterioration of sliding angle, receding contact angle, and the like even due to blending of polymer I with polymer II, and are superior to comparative TC-6 and 7. In case of TC-1 to 25 of Examples, water sliding property of polymer I (comparative TC-1) is substantially exhibited during coating formation process after spin coating, and no influences of polymers II (comparative TC-2 to 4) are not observed in this respect. This proves a fact that layered separation of polymers I and II was effectively attained.

Water sliding property was deteriorated in the top coat (comparative TC-6) based on a combination of Polymer 22 and Polymer 20, and the top coat (comparative TC-7) based on a combination of Polymer 22 and Polymer 21. This is considered to be due to lower efficiencies of layered separation between polymers.

TABLE 1

| Resist top coat | Polymers for top coat (mixing ratio) | Amine Compound (add. amount) | Refractive index at 193 nm | Coating thickness Variance (nm) Between before and After rinsing | Coating Thickness (nm) After development | Sliding angle (°) | Receding contact angle (°) |
|---|---|---|---|---|---|---|---|
| TC-1 | Polymer 1 (70) Polymer 12 (30) | tributyl amine (0.5) | 1.54 | 0 | 0 | 16 | 78 |
| TC-2 | Polymer 1 (70) Polymer 13 (30) | Amine 1 (0.4) | 1.54 | 0 | 0 | 18 | 76 |
| TC-3 | Polymer 1 (75) Polymer 14 (25) | Amine 1 (0.4) | 1.54 | 0 | 0 | 16 | 78 |
| TC-4 | Polymer 1 (60) Polymer 15 (20) Polymer 14 (20) | — | 1.54 | 0 | 0 | 16 | 77 |
| TC-5 | Polymer 1 (75) Polymer 14 (10) Polymer 16 (15) | — | 1.54 | 0 | 0 | 16 | 77 |
| TC-6 | Polymer 2 (70) Polymer 14 (30) | Amine 2 (0.4) | 1.54 | 0 | 0 | 13 | 74 |
| TC-7 | Polymer 3 (70) Polymer 14 (30) | Amine 2 (0.4) | 1.54 | 0 | 0 | 13 | 75 |
| TC-8 | Polymer 4 (70) Polymer 14 (30) | Amine 2 (0.4) | 1.54 | 0 | 0 | 17 | 80 |
| TC-9 | Polymer 5 (70) Polymer 14 (30) | Amine 2 (0.4) | 1.54 | 0 | 0 | 13 | 76 |
| TC-10 | Polymer 6 (70) Polymer 14 (30) | Amine 2 (0.4) | 1.54 | 0 | 0 | 12 | 72 |
| TC-11 | Polymer 7 (70) Polymer 14 (30) | Amine 2 (0.4) | 1.54 | 0 | 0 | 13 | 72 |
| TC-12 | Polymer 8 (70) Polymer 14 (30) | Amine 2 (0.4) | 1.54 | 0 | 0 | 14 | 72 |
| TC-13 | Polymer 9 (70) Polymer 14 (30) | Amine 2 (0.4) | 1.54 | 0 | 0 | 8 | 82 |
| TC-14 | Polymer 10 (70) Polymer 14 (30) | Amine 2 (0.4) | 1.54 | 0 | 0 | 10 | 78 |
| TC-15 | Polymer 11 (70) Polymer 14 (30) | Amine 3 (0.4) | 1.54 | 0 | 0 | 10 | 79 |
| TC-16 | Polymer 6 (80) Polymer 17 (20) | Amine 2 (0.3) | 1.54 | 0 | 0 | 16 | 78 |
| TC-17 | Polymer 18 (80) Polymer 14 (20) | Amine 2 (0.4) | 1.54 | 0 | 0 | 8 | 82 |
| Comparative. TC-1 | Polymer 1 (100) | | 1.53 | 0 | 0 | 16 | 78 |
| Comparative. TC-2 | Polymer 14 (100) | Amine 2 (0.4) | 1.53 | 0 | 0 | 40 | 49 |
| Comparative. TC-3 | Polymer 14 (100) | — | 1.53 | 0 | 0 | 38 | 46 |

TABLE 2

| Resist top coat | Polymers for top coat (mixing ratio) | Amine Compound (add. amount) | Refractive Index at 193 nm | Coating thickness variance (nm) between before and after rinsing | Coating thickness (nm) after development | Sliding angle (°) | Receding contact angle (°) |
|---|---|---|---|---|---|---|---|
| TC-18 | Polymer 19 (80) Polymer 14 (20) | N,N-dimethyl alanine ethylester (1.5) | 1.54 | 0 | 0 | 13 | 77 |

TABLE 2-continued

| Resist top coat | Polymers for top coat (mixing ratio) | Amine Compound (add. amount) | Refractive Index at 193 nm | Coating thickness variance (nm) between before and after rinsing | Coating thickness (nm) after development | Sliding angle (°) | Receding contact angle (°) |
|---|---|---|---|---|---|---|---|
| TC-19 | Polymer 19 (80) Polymer 14 (20) | N,N-dimethyl glycine methyl ester (1.5) | 1.54 | 0 | 0 | 13 | 77 |
| TC-20 | Polymer 19 (80) Polymer 14 (20) | N-N-dimethyl formamide diethyl acetal (1.5) | 1.54 | 0 | 0 | 13 | 77 |
| TC-21 | Polymer 19 (80) Polymer 14 (20) | N-N-dimethyl-t-butyl carbonate (1.5) | 1.54 | 0 | 0 | 13 | 77 |
| TC-22 | Polymer 19 (80) Polymer 14 (20) | — | 1.54 | 0 | 0 | 15 | 74 |
| TC-23 | Polymer 19 (80) Polymer 23 (20) | — | 1.54 | 0 | 0 | 14 | 76 |
| TC-24 | Polymer 19 (80) Polymer 12 (20) | — | 1.54 | 0 | 0 | 16 | 74 |
| TC-25 | Polymer 9 (80) Polymer 14 (20) | N,N-dimethyl alanine ethylester (1.5) | 1.54 | 0 | 0 | 9 | 81 |
| Comparative. TC-4 | Polymer 12 (80) | | 1.54 | 0 | 0 | 29 | 54 |
| Comparative. TC-5 | Polymer 22 (100) | | 1.54 | 0 | 0 | 17 | 75 |
| Comparative. TC-6 | Polymer 22 (80) Polymer 20 (20) | | 1.54 | 0 | 0 | 19 | 70 |
| Comparative. TC-7 | Polymer 22 (80) Polymer 21 (20) | | 1.54 | 0 | 0 | 19 | 69 |

Note that Amines 1 to 3, which are added in the above are shown below:

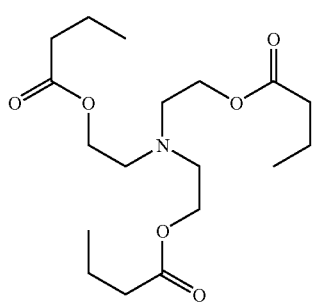

Amine 1

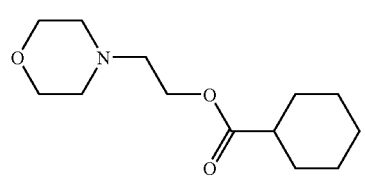

Amine 2

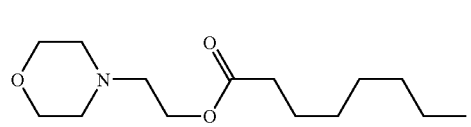

Amine 3

Next, 5 g of Resist Polymer, 0.5 g of PAG1, and 0.1 g of Quencher 1 shown below were used and dissolved in 100 g of propylene glycol monoethyl ether acetate (PGMEA), followed by filtration by a polypropylene filter of 0.2 μm size, to prepare a resist solution. After formation of an anti-reflection film ARC-29A (manufactured by Nissan Chemical Industries, Ltd.) (film thickness: 87 nm) on a silicon substrate, the resist solution was coated thereon, followed by baking at 105°

C. for 60 seconds, to fabricate a resist film having a thickness of 120 nm. The resist top coats (TC-1 to 25, comparative TC-1 to 7) were applied thereon, followed by baking at 100° C. for 60 seconds. To conduct simulated liquid immersion exposure, the coatings after exposure were rinsed by pure water for 5 minutes. Namely, exposure was conducted by an ArF scanner S307E (manufactured by Nikon Corp., NA=0.85, σ0.93/0.62, 20 degree dipole illumination, and 6% halftone phase shift mask), and rinsing was conducted for 5 minutes while pouring pure water onto each coating, followed by post-exposure bake (PEB) at 100° C. for 60 seconds and by development with a 2.38 mass % TMAH developer for 60 seconds.

Further, there was also conducted a process in a sequence of exposure-pure water rinse-PEB-development, without top coat. Then, obtained wafers were each cut and divided, and compared to one another in terms of 65 nm line-and-space pattern profile, and sensitivity. Results thereof are listed in Table 3 and Table 4.

Next, 5 μl of water droplet was dropped onto each resist film after development, to measure a contact angle between a resist boundary face and a water droplet boundary face. Measurement results are listed in Table 3 and Table 4.

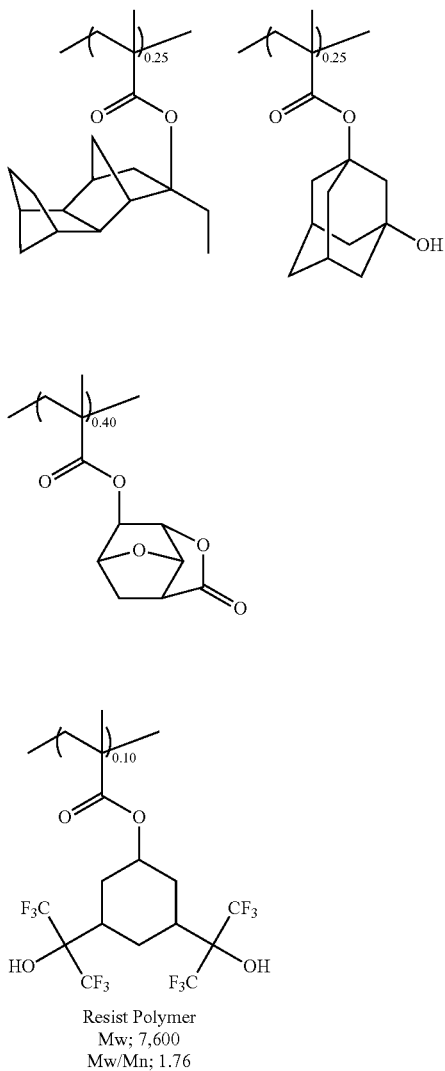

Resist Polymer
Mw; 7,600
Mw/Mn; 1.76

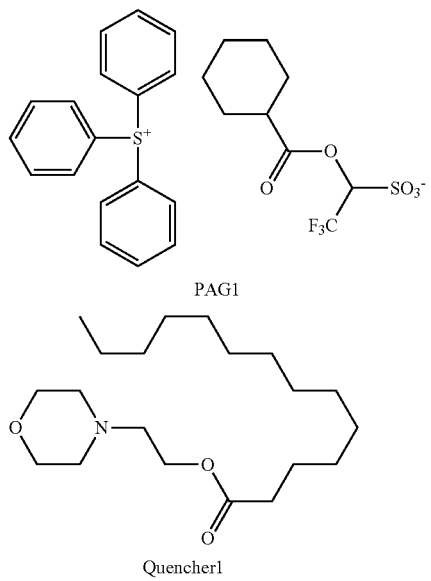

PAG1

Quencher1

TABLE 3

| Resist top coat | Sensitivity (mJ/cm²) | 65 nm Pattern Profile | Contact angle with water after development (°) |
|---|---|---|---|
| TC-1 | 26 | Rectangular profile | 48 |
| TC-2 | 26 | Rectangular profile | 47 |
| TC-3 | 26 | Rectangular profile | 49 |
| TC-4 | 26 | Rectangular profile | 46 |
| TC-5 | 26 | Rectangular profile | 48 |
| TC-6 | 26 | Rectangular profile | 46 |
| TC-7 | 26 | Rectangular profile | 48 |
| TC-8 | 26 | Rectangular profile | 48 |
| TC-9 | 26 | Rectangular profile | 48 |
| TC-10 | 26 | Rectangular profile | 48 |
| TC-11 | 26 | Rectangular profile | 48 |
| TC-12 | 26 | Rectangular profile | 47 |
| TC-13 | 26 | Rectangular profile | 48 |
| TC-14 | 26 | Rectangular profile | 48 |
| TC-15 | 26 | Rectangular profile | 48 |
| TC-16 | 26 | Rectangular profile | 48 |
| TC-17 | 26 | Rectangular profile | 51 |
| Comparative. TC-1 | 26 | Rectangular profile | 70 |
| Comparative. TC-2 | 26 | Rectangular profile | 52 |
| Comparative. TC-3 | 26 | Film-loss profile | 51 |
| Comparative. TC-4 | 24 | Film-loss profile | 51 |
| Without top coat | 27 | Head-bulged T-top profile | 68 |

TABLE 4

| Resist top coat | Sensitivity (mJ/cm²) | 65 nm Pattern Profile | Contact angle with water after development (°) |
|---|---|---|---|
| TC-18 | 26 | Rectangular profile | 46 |
| TC-19 | 26 | Rectangular profile | 46 |
| TC-20 | 26 | Rectangular profile | 46 |
| TC-21 | 26 | Rectangular profile | 45 |
| TC-22 | 24 | Slightly blunted vertical profile | 41 |

TABLE 4-continued

| Resist top coat | Sensitivity (mJ/cm$^2$) | 65 nm Pattern Profile | Contact angle with water after development (°) |
|---|---|---|---|
| TC-23 | 26 | Rectangular profile | 45 |
| TC-24 | 24 | Slightly blunted vertical profile | 42 |
| TC-25 | 26 | Rectangular profile | 49 |
| Comparative. TC-5 | 27 | Rectangular profile | 79 |
| Comparative. TC-6 | 26 | Slightly blunted vertical profile | 70 |
| Comparative. TC-7 | 26 | Slightly blunted vertical profile | 68 |

Conduction of pure water rinse after exposure without top coats, caused a pattern profile to be a T-top profile. This is considered to be caused by dissolution of generated acids in water. In turn, the top coats of the present invention have larger receding contact angles, while bringing about not only decreased contact angles of resists after development, but also less pattern profile changes after development. Although the top coat composition using only the highly water-repellent polymer I exhibited a larger receding contact angle, the contact angle at the resist surface after development was made large (comparative TC-1).

In case of the top coat composition using only the polymer II having an amine salt of a sulfonic acid, although resist patterns after development each exhibited a rectangular profile and the contact angle of the resist after development was allowed to be decreased, the receding contact angle was small to exhibit a drawback of deteriorated water sliding property (comparative TC-2). Further, in case of adoption of top coat compositions including only polymers II having sulfo groups (comparative TC-3 and comparative TC-4), respectively, although contact angles at resist surfaces after development can be decreased, resist patterns exhibited film-loss profiles, respectively. Further, the comparative TC-5 exhibited an increased contact angle at a resist surface after development.

The resists TC-1, TC-18, TC-22, and comparative TC-1, comparative TC-6 were subjected to precise filtration by a high-density polyethylene filter of 0.02 µm size. Then, after formation of an anti-reflection film ARC-29A (manufactured by Nissan Chemical Industries, Ltd.) (film thickness: 87 nm) on a silicon substrate of 8-inch, the resist solution was coated thereon, followed by baking at 105° C. for 60 seconds, to fabricate a resist film having a thickness of 120 nm. The resist top coats were each applied thereon, followed by baking at 100° C. for 60 seconds. Further, the whole surfaces of the wafers were each subjected to exposure in a checker-flag pattern including alternating open-frame exposure regions and unexposing regions, each region being a 20 mm square area, by an ArF scanner S307E (manufactured by Nikon Corp., NA=0.85, σ=0.93, and Cr mask), followed by conduction of post-exposure bake (PEB) and by development with a 2.38 mass % TMAH developer for 60 seconds. There was counted the number of defects in an applicable unexposed region of each checker-flag pattern at a pixel size of 0.125 micron, by a flaw detector Win-Win-50-1200 (manufactured by Tokyo Seimitsu Co., Ltd.). Defects caused on the resist surfaces in the unexposed regions were stain-like defects, respectively, and classified into blob defects. The results are listed in Table 5.

TABLE 5

| Resist top coat | Number of defects |
|---|---|
| TC-1 | 3 |
| TC-18 | 2 |
| TC-22 | 0 |
| Comparative TC-1 | 8,000 or more |
| Comparative TC-6 | 250 |

For evaluation of electron beam writing, the EB Polymer shown below synthesized by radical polymerization was dissolved in propylene glycol monoethyl ether acetate (PGMEA) and ethyl lactate (EL) at compositions listed in Table 6, followed by filtration by a filter of 0.2 µm size, to prepare a positive-type resist material.

The obtained positive-type resist material was spin coated onto an Si substrate having a diameter of 6 inches (150 mm) by Clean Track Mark5 (manufactured by Tokyo Electron Limited), followed by prebaking on a hot plate at 110° C. for 60 seconds, to fabricate a resist film of 200 nm. Conducted thereto was writing within a vacuum chamber at an HV voltage of 50 keV by HL-800D (manufactured by Hitachi, Ltd.). The resist film was thereafter left to stand within the vacuum chamber for 20 hours, and then additional writing was conducted by changing a writing area.

Immediately after writing, post-exposure bake (PEB) was conducted on a hot plate at 90° C. for 60 seconds by Clean Track Mark5 (manufactured by Tokyo Electron Limited), followed by paddle development for 30 seconds with a 2.38 mass % TMAH aqueous solution, to obtain a positive-type pattern.

Next, dimension variances during standing in vacuum were obtained by a length measuring SEM (S-7280 manufactured by Hitachi, Ltd.). Namely, there was obtained a line dimension difference in a line-and-space pattern of 0.12 µm between just before development and 20 hours after development, based on an exposure value for causing the line-and-space pattern of 0.12 µm to be resolved at 1:1. In terms of dimension variances, a plus value indicates an increasedly varied resist sensitivity, and a minus value indicates a decreasedly varied sensitivity, during standing in vacuum. The results are listed in Table 6.

TABLE 6

| Polymer (mass part) | Acid generator (mass part) | Basic compound (mass part) | Organic solvent (mass part) | Top coat | Dimension variance (nm) |
|---|---|---|---|---|---|
| EB Polymer (100) | PAG2 (10) | Quencher2 (0.4) | PGMEA (700) EL (300) | TC-1 | −1 nm |
| EB Polymer (100) | PAG2 (10) | Quencher2 (0.4) | PGMEA (700) EL (300) | TC-2 | 0 nm |
| EB Polymer (100) | PAG2 (10) | Quencher2 (0.4) | PGMEA (700) EL (300) | TC-3 | −1 nm |
| EB Polymer (100) | PAG2 (10) | Quencher2 (0.4) | PGMEA (700) EL (300) | TC-4 | −1 nm |
| EB Polymer (100) | PAG2 (10) | Quencher2 (0.4) | PGMEA (700) EL (300) | TC-5 | 0 nm |
| EB Polymer (100) | PAG2 (10) | Quencher2 (0.4) | PGMEA (700) EL (300) | TC-6 | 0 nm |

TABLE 6-continued

| EB Polymer (100) | PAG2 (10) | Quencher2 (0.4) | PGMEA (700) EL (300) | — | −7 nm |
|---|---|---|---|---|---|

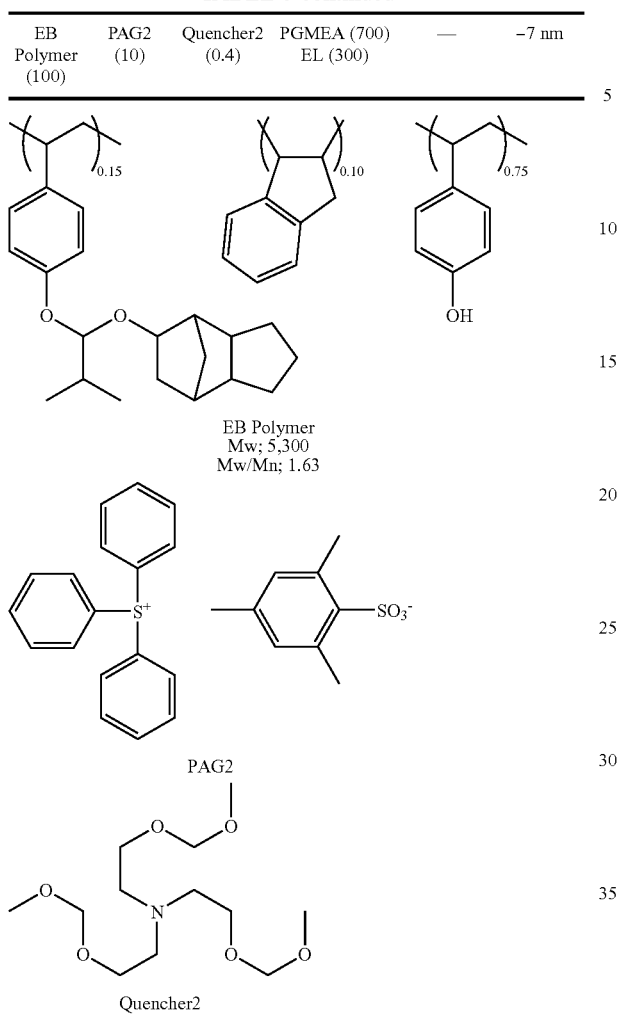

EB Polymer
Mw; 5,300
Mw/Mn; 1.63

PAG2

Quencher2

In case of ArF exposure, and upon conduction of rinsing by pure water after exposure without top coats, T-top profiles were brought about. This is considered to be caused by dissolution of generated acids in water. In turn, when the top coats of the prevent invention (TC-1 to 25) were used, profile changes of resist patterns after development were less. Contrary, the top coats (comparative TC-3 and 4) comprising only polymers including sulfo groups resulted in film-loss resist profiles after development. Meanwhile, in case of electron beam exposure, application of the resist top coats (TC-1 to 6) of the present invention resulted in an improved stability of resist during standing in vacuum after exposure.

The present invention is not limited to the above embodiments. The above embodiments are merely illustrative, and whatever having the substantially same configurations as the technical concept recited in the claims of the present application and exhibiting the same functions and effects are embraced within the technical scope of the present invention.

What is claimed is:

1. A resist top coat composition for forming a top coat on a photoresist film, comprising, at least: a polymer I including a repeating unit a represented by the following general formula (1); and a polymer II including a repeating unit having a sulfonic acid or an amine salt of a sulfonic acid:

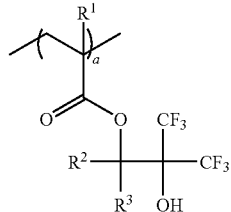

(in the formula,

R$^1$ represents any one of a hydrogen atom, a fluorine atom, a methyl group, and a trifluoromethyl group; and R$^2$ and R$^3$ independently represent a hydrogen atom, or a linear, branched, or cyclic alkyl group having 1 to 20 carbon atoms;

wherein R$^2$ and R$^3$ may be linked to form a ring, and then R$^2$ and R$^3$ independently represent a linear, branched, or cyclic alkylene group having 2 to 20 carbon atoms, and 0<a≦1.0).

2. The resist top coat composition according to claim 1, wherein the polymer I includes a repeating unit a and a repeating unit b each represented by the following general formula (2):

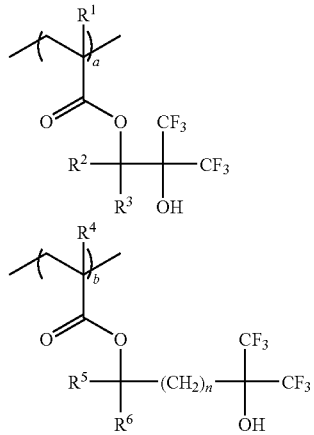

(in the formula,

R$^1$, R$^2$, and R$^3$ are the same as the above;

R$^4$ represents a hydrogen atom or a methyl group;

R$^5$ and R$^6$ independently represent a hydrogen atom, or a linear, branched, or cyclic alkyl group having 1 to 20 carbon atoms;

wherein R$^5$ and R$^6$ may be linked to form a ring, and then R$^5$ and R$^6$ independently represent a linear, branched, or cyclic alkylene group having 2 to 20 carbon atoms; 0<a≦1, 0≦b<1, 0<a+b≦1; and n is an integer of 1 to 4).

3. The resist top coat composition according to claim 1, wherein the repeating unit having a sulfonic acid or an amine salt of a sulfonic acid included in the polymer II are represented by one or more repeating units selected from repeating units c-1, c-2, d-1, and d-2 in the following general formula (3):

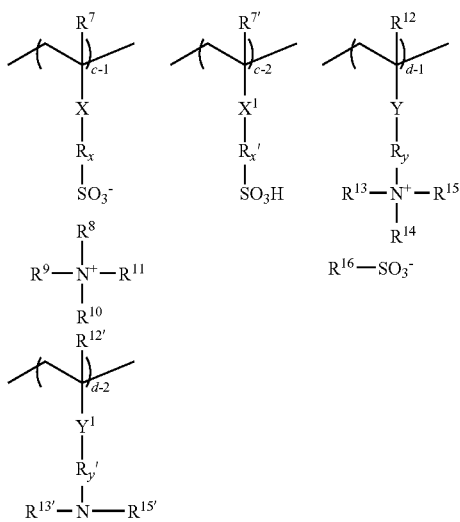
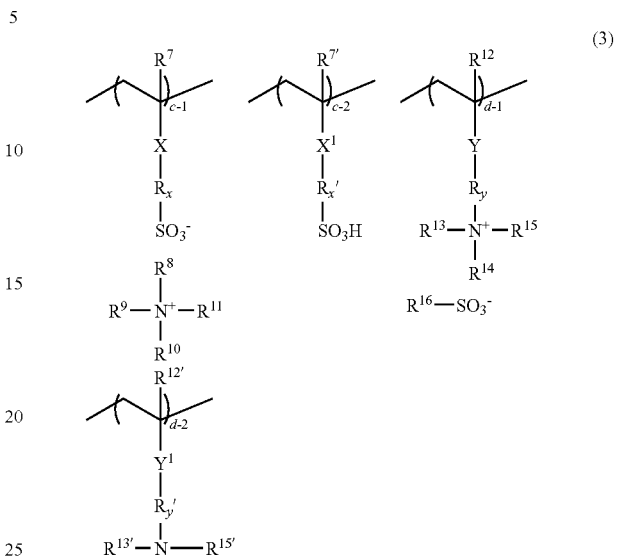

(in the formula,

R[7], R[12], R[7'], and R[12'] independently represent a hydrogen atom or a methyl group;

R[8], R[9], R[10], R[11], R[13], R[14], R[15], R[13'], and R[15'] independently represent a hydrogen atom, a linear, branched, or cyclic alkyl group, an alkenyl group, an oxoalkyl group, or an oxoalkenyl group having 1 to 12 carbon atoms, an aryl group having 6 to 20 carbon atoms, or an aralkyl group or an aryl oxoalkyl group having 7 to 12 carbon atoms;

wherein hydrogen atoms of these groups may be partially or totally substituted with an alkoxy group;

wherein a nitrogen atom, an ether group, an ester group, a hydroxy group, or a carboxyl group may be included in R[8], R[9], R[10], R[11], R[13], R[14], R[15], R[13'], and R[15']; and wherein R[8] and R[9], R[8] and R[9] and R[10], and R[13] and R[14] may be linked to form a ring, and when a ring is formed, R[8] and R[9], R[8] and R[9] and R[10], and R[13] and R[14] independently represent an alkylene group having 3 to 10 carbon atoms, or represent an aromatic heterocycle having the nitrogen atom in the formula in its ring;

X and X[1] are each any one of a single bond, an alkylene group having 1 to 4 carbon atoms, —C(=O)—O—, and —C(=O)—NH—;

Y and Y[1] each represent —C(=O)—O—;

$R_x$, and $R_x'$ are each any one of a single bond, a linear, branched, or cyclic alkylene group having 1 to 8 carbon atoms;

$R_y$ and $R_y'$ each represent a linear, branched, or cyclic alkylene group having 1 to 8 carbon atoms; and R[16] represents: a linear, branched, or cyclic alkyl group having 1 to 20 carbon atoms, which group may have a carbonyl group, an ester group, an ether group, or a halogen atom; or an aryl group having 6 to 10 carbon atoms, which group may have a carbonyl group, an ester group, an ether group, a halogen atom, an alkyl group having 1 to 10 carbon atoms, or a fluorinated alkyl group;

wherein $0 \leq (c\text{-}1) < 1$, $0 \leq (c\text{-}2) < 1$, $0 \leq (d\text{-}1) < 1$, $0 \leq (d\text{-}2) < 1$, and $0 < (c\text{-}1)+(c\text{-}2)+(d\text{-}1)+(d\text{-}2) < 1$, and when $0 < (d\text{-}2)$, $0 < (c\text{-}2)$).

4. The resist top coat composition according to claim 2, wherein the repeating unit having a sulfonic acid or an amine salt of a sulfonic acid included in the polymer II are represented by one or more repeating units selected from repeating units c-1, c-2, d-1, and d-2 in the following general formula (3):

(in the formula,

R[7], R[12], R[7'], and R[12'] independently represent a hydrogen atom or a methyl group;

R[8], R[9], R[10], R[11], R[13], R[14], R[15], R[13'] and R[15'], independently represent a hydrogen atom, a linear, branched, or cyclic alkyl group, an alkenyl group, an oxoalkyl group, or an oxoalkenyl group having 1 to 12 carbon atoms, an aryl group having 6 to 20 carbon atoms, or an aralkyl group or an aryl oxoalkyl group having 7 to 12 carbon atoms;

wherein hydrogen atoms of these groups may be partially or totally substituted with an alkoxy group;

wherein a nitrogen atom, an ether group, an ester group, a hydroxy group, or a carboxyl group may be included in R[8], R[9], R[10], R[11], R[13], R[14], R[15], R[13'], and R[15']; and wherein R[8] and R[9], R[8] and R[9] and R[10], and R[13] and R[14] may be linked to form a ring, and when a ring is formed, R[8] and R[9], R[8] and R[9] and R[10], and R[13] and R[14] independently represent an alkylene group having 3 to 10 carbon atoms, or represent an aromatic heterocycle having the nitrogen atom in the formula in its ring;

X and X[1] are each any one of a single bond, an alkylene group having 1 to 4 carbon atoms, —C(=O)—O—, and —C(=O)—NH—;

Y and Y[1] each represent —C(=O)—O—;

$R_x$, and $R_x'$ are each any one of a single bond, a linear, branched, or cyclic alkylene group having 1 to 8 carbon atoms;

$R_y$ and $R_y'$ each represent a linear, branched, or cyclic alkylene group having 1 to 8 carbon atoms; and R[16] represents: a linear, branched, or cyclic alkyl group having 1 to 20 carbon atoms, which group may have a carbonyl group, an ester group, an ether group, or a halogen atom; or an aryl group having 6 to 10 carbon atoms, which group may have a carbonyl group, an ester group, an ether group, a halogen atom, an alkyl group having 1 to 10 carbon atoms, or a fluorinated alkyl group;

wherein $0 \leq (c\text{-}1) < 1$, $0 \leq (c\text{-}2) < 1$, $0 \leq (d\text{-}1) < 1$, $0 \leq (d\text{-}2) < 1$, and $0 < (c\text{-}1)+(c\text{-}2)+(d\text{-}1)+(d\text{-}2) < 1$, and when $0 < (d\text{-}2)$, $0 < (c\text{-}2)$).

5. The resist top coat composition according to claim 1, wherein the polymer II is (A) a copolymer including the repeating units a and one or more repeating unit selected from repeating units c-1, c-2, and d-1, or (B) a copolymer including the repeating unit a and repeating units c-2 and d-2, in the following general formula (4):

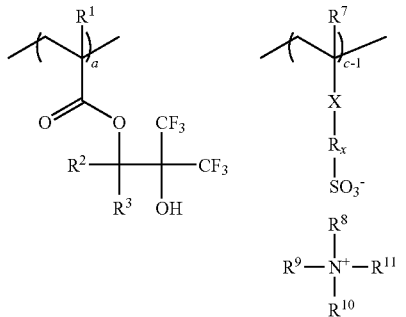

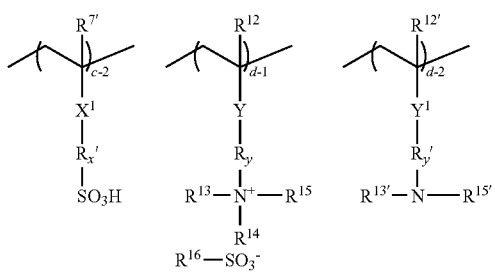

(in the formula,

R$^1$ to R$^{16}$, R$^{7'}$, R$^{12'}$, R$^{13'}$, R$^{15'}$, X, Y, X$^1$, Y$^1$, R$_x$, R$_y$, R$_x$', and R$_y$' are the same as the above;

wherein 0<a<1, 0≦(c-1)<1, 0≦(c-2)<1, 0≦(d-1)<1, 0≦(d-2)<1, 0<(c-1)+(c-2)+(d-1)+(d-2)<1, and when 0<(d-2), 0<(c-2)).

6. The resist top coat composition according to claim 2, wherein the polymer II is (A) a copolymer including the repeating units a and one or more repeating unit selected from repeating units c-1, c-2, and d-1, or (B) a copolymer including the repeating unit a and repeating units c-2 and d-2, in the following general formula (4):

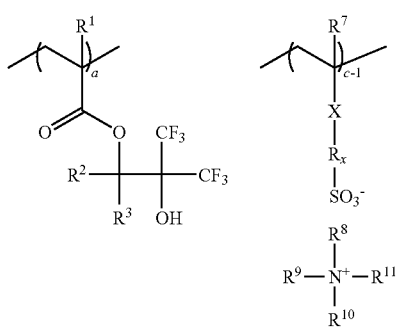

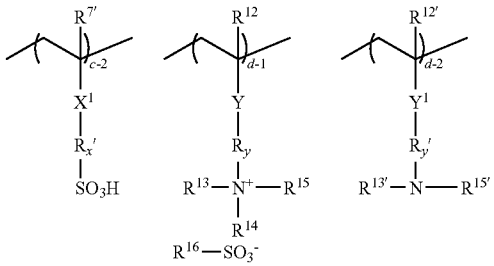

(in the formula,

R$^1$ to R$^{16}$, R$^{7'}$, R$^{12'}$, R$^{13'}$, R$^{15'}$, X, Y, X$^1$, Y$^1$, R$_x$, R$_y$, R$_x$', and R$_y$' are the same as the above;

wherein 0<a<1, 0≦(c-1)<1, 0≦(c-2)<1, 0≦(d-1)<1, 0≦(d-2)<1, 0<(c-1)+(c-2)+(d-1)+(d-2)<1, and when 0<(d-2), 0<(c-2)).

7. The resist top coat composition according to claim 3, wherein the polymer II is (A) a copolymer including the repeating units a and one or more repeating unit selected from repeating units c-1, c-2, and d-1, or (B) a copolymer including the repeating unit a and repeating units c-2 and d-2, in the following general formula (4):

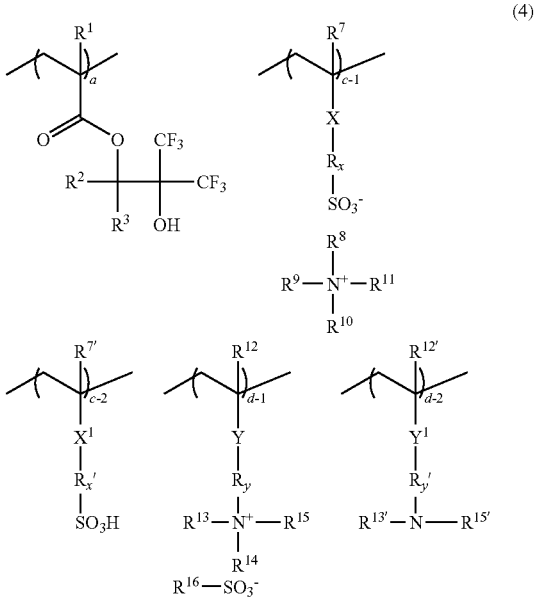

(in the formula,

R$^1$ to R$^{16}$, R$^{7'}$, R$^{12'}$, R$^{13'}$, R$^{15'}$, X, Y, X$^1$, Y$^1$, R$_x$, R$^y$, R$_x$' and R$_y$' are the same as the above;

wherein 0<a<1, 0≦(c-1)<1, 0≦(c-2)<1, 0≦(d-1)<1, 0≦(d-2)<1, 0<(c-1)+(c-2)+(d-1)+(d-2)<1, and when 0<(d-2), 0<(c-2)).

8. The resist top coat composition according to claim 4, wherein the polymer II is (A) a copolymer including the repeating units a and one or more repeating unit selected from repeating units c-1, c-2, and d-1, or (B) a copolymer including the repeating unit a and repeating units c-2 and d-2, in the following general formula (4):

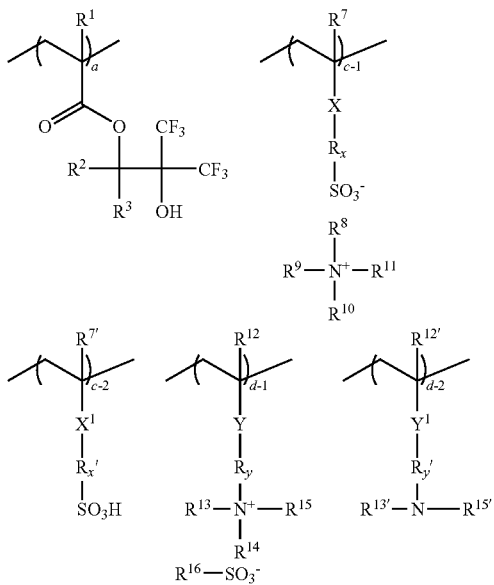

(in the formula,
R¹ to R¹⁶, R⁷', R¹²', R¹³', R¹⁵', X, Y, X¹, Y¹, $R_x$, $R_y$, $R_x'$, and $R_y'$ are the same as the above;
wherein 0<a<1, 0≦(c-1)<1, 0≦(c-2)<1, 0≦(d-1)<1, 0≦(d-2)<1, 0<(c-1)+(c-2)+(d-1)+(d-2)<1, and when 0<(d-2), 0<(c-2)).

9. The resist top coat composition according to claim 1, wherein the resist top coat composition further comprises a solvent.

10. The resist top coat composition according to claim 8, wherein the resist top coat composition further comprises a solvent.

11. The resist top coat composition according to claim 9, wherein the solvent is one or more ether-based solvents selected from di-n-butyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether.

12. The resist top coat composition according to claim 10, wherein the solvent is one or more ether-based solvents selected from di-n-butyl ether, diisobutyl ether, diisopentyl ether, di-n-pentyl ether, methylcyclopentyl ether, methylcyclohexyl ether, di-n-butyl ether, di-sec-butyl ether, diisopentyl ether, di-sec-pentyl ether, di-t-amyl ether, and di-n-hexyl ether.

13. The resist top coat composition according to claim 11, wherein the solvent is a mixture of the ether-based solvent with one or more alcohol-based solvents selected from 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

14. The resist top coat composition according to claim 12, wherein the solvent is a mixture of the ether-based solvent with one or more alcohol-based solvents selected from 1-butyl alcohol, 2-butyl alcohol, isobutyl alcohol, tert-butyl alcohol, 1-pentanol, 2-pentanol, 3-pentanol, tert-amyl alcohol, neopentyl alcohol, 2-methyl-1-butanol, 3-methyl-1-butanol, 3-methyl-3-pentanol, cyclopentanol, 1-hexanol, 2-hexanol, 3-hexanol, 2,3-dimethyl-2-butanol, 3,3-dimethyl-1-butanol, 3,3-dimethyl-2-butanol, 2-diethyl-1-butanol, 2-methyl-1-pentanol, 2-methyl-2-pentanol, 2-methyl-3-pentanol, 3-methyl-1-pentanol, 3-methyl-2-pentanol, 3-methyl-3-pentanol, 4-methyl-1-pentanol, 4-methyl-2-pentanol, 4-methyl-3-pentanol, and cyclohexanol.

15. A patterning process comprising, at least, the steps of:
forming a photoresist film on a substrate;
forming, on the photoresist film, a resist top coat by using the resist top coat composition according to claims 1;
exposing the substrate; and
developing the substrate with a developer.

16. A patterning process comprising, at least, the steps of:
forming a photoresist film on a substrate;
forming, on the photoresist film, a resist top coat by using the resist top coat composition according to claims 14;
exposing the substrate; and
developing the substrate with a developer.

17. The patterning process according to claim 15, wherein the exposing step is conducted by liquid immersion lithography in which a gap between a projection lens and the substrate is filled with a liquid.

18. The patterning process according to claim 16, wherein the exposing step is conducted by liquid immersion lithography in which a gap between a projection lens and the substrate is filled with a liquid.

19. The patterning process according to claim 17, wherein the exposing step is conducted by using a light source having an exposing wavelength in the range of 180 to 250 nm, and by using water as the liquid with which the gap between the projection lens and the substrate is filled with.

20. The patterning process according to claim 18, wherein the exposing step is conducted by using a light source having an exposing wavelength in the range of 180 to 250 nm, and by using water as the liquid with which the gap between the projection lens and the substrate is filled with.

21. The patterning process according to claim 15, wherein the developing step comprises the step of:
developing the substrate with an alkaline developer, to form a resist pattern on the photoresist film, and simultaneously therewith, to strip off the resist top coat on the photoresist film.

22. The patterning process according to claim 20, wherein the developing step comprises the step of:
developing the substrate with an alkaline developer, to form a resist pattern on the photoresist film, and simultaneously therewith, to strip off the resist top coat on the photoresist film.

23. A patterning process by lithography, comprising the steps of:
forming a top coat made of an upperlying resist film composition on a photoresist layer formed on a mask blanks;
exposing the photoresist layer in vacuum, with electron beam; and
subsequently developing the photoresist layer;
wherein the resist top coat composition according to claim 1 is used as the upperlying resist film composition.

24. A patterning process by lithography, comprising the steps of:
forming a top coat made of an upperlying resist film composition on a photoresist layer formed on a mask blanks;
exposing the mask blanks in vacuum, with electron beam; and
subsequently developing the mask blanks;
wherein the resist top coat composition according to claim 14 is used as the upperlying resist film composition.

* * * * *